(12) United States Patent
Hsiung et al.

(10) Patent No.: US 12,349,395 B2
(45) Date of Patent: Jul. 1, 2025

(54) INTER BLOCK FOR RECESSED CONTACTS AND METHODS FORMING SAME

(71) Applicant: Taiwan Semiconductor Manufacturing Co., Ltd., Hsinchu (TW)

(72) Inventors: Te-Chih Hsiung, Taipei (TW); Jyun-De Wu, Hsinchu (TW); Yi-Chen Wang, Hsinchu (TW); Yi-Chun Chang, Hsinchu (TW); Yuan-Tien Tu, Puzih (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/612,228

(22) Filed: Mar. 21, 2024

(65) Prior Publication Data

US 2024/0234527 A1  Jul. 11, 2024

Related U.S. Application Data

(62) Division of application No. 17/466,205, filed on Sep. 3, 2021, now Pat. No. 11,967,622.

(Continued)

(51) Int. Cl.
*H01L 23/522* (2006.01)
*H01L 21/768* (2006.01)
(Continued)

(52) U.S. Cl.
CPC ... *H10D 30/6219* (2025.01); *H01L 21/76804* (2013.01); *H01L 21/76816* (2013.01);
(Continued)

(58) Field of Classification Search
CPC ...... H10D 30/01; H10D 30/62; H10D 30/024; H10D 30/6219; H10D 64/01; H10D 64/27; H10D 64/513; H10D 84/01; H10D 84/03; H10D 84/83; H10D 84/013; H10D 84/0149; H10D 84/0158; H10D 84/038; H01L 21/768; H01L 21/76804; H01L 21/76816; H01L 21/76831; H01L 21/76834; H01L 21/76883; H01L 21/76895; H01L 21/76805; H01L 21/76888;
(Continued)

(56) References Cited

U.S. PATENT DOCUMENTS 8,030,204 B2  10/2011  Park et al.
9,105,490 B2   8/2015  Wang et al.
(Continued)

FOREIGN PATENT DOCUMENTS

CN   113270473 A   8/2021
KR   20050063068 A  6/2005
(Continued)

*Primary Examiner* — Chuong A Luu
(74) *Attorney, Agent, or Firm* — Slater Matsil, LLP

(57) ABSTRACT

Embodiments provide a dielectric inter block disposed in a metallic region of a conductive line or source/drain contact. A first and second conductive structure over the metallic region may extend into the metallic region on either side of the inter block. The inter block can prevent etchant or cleaning solution from contacting an interface between the first conductive structure and the metallic region.

20 Claims, 81 Drawing Sheets

Related U.S. Application Data

(60) Provisional application No. 63/184,550, filed on May 5, 2021.

(51) Int. Cl.
| | | |
|---|---|---|
| *H01L 23/528* | (2006.01) | |
| *H01L 23/532* | (2006.01) | |
| *H10D 30/01* | (2025.01) | |
| *H10D 30/62* | (2025.01) | |
| *H10D 64/01* | (2025.01) | |
| *H10D 64/27* | (2025.01) | |
| *H10D 84/01* | (2025.01) | |
| *H10D 84/03* | (2025.01) | |
| *H10D 84/83* | (2025.01) | |

(52) U.S. Cl.
CPC .... *H01L 21/76831* (2013.01); *H01L 23/5226* (2013.01); *H01L 23/5283* (2013.01); *H01L 23/53266* (2013.01); *H10D 30/024* (2025.01); *H10D 30/6211* (2025.01); *H10D 64/01* (2025.01); *H10D 64/513* (2025.01); *H10D 84/013* (2025.01); *H10D 84/0149* (2025.01); *H10D 84/0158* (2025.01); *H10D 84/038* (2025.01); *H10D 84/834* (2025.01)

(58) Field of Classification Search
CPC ............. H01L 21/76892; H01L 23/522; H01L 23/528; H01L 23/532; H01L 23/485; H01L 23/5226; H01L 23/5283; H01L 23/53266; H01L 23/53209
USPC ........................................................ 257/690
See application file for complete search history.

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2007/0048930 | A1* | 3/2007 | Figura ................. H10D 84/038 257/E21.651 |
| 2011/0183507 | A1 | 7/2011 | Figura et al. |
| 2012/0218700 | A1* | 8/2012 | Hance ............... H01L 21/76802 174/258 |
| 2016/0027845 | A1 | 1/2016 | Seong et al. |
| 2020/0091055 | A1* | 3/2020 | Yang ................. H01L 23/49827 |
| 2020/0135553 | A1 | 4/2020 | Chen et al. |
| 2020/0388713 | A1 | 12/2020 | Tsai |
| 2021/0035861 | A1 | 2/2021 | Chen et al. |
| 2021/0313181 | A1 | 10/2021 | Chen et al. |
| 2021/0375677 | A1 | 12/2021 | Wang et al. |
| 2022/0319922 | A1* | 10/2022 | Wu ..................... H01L 23/5226 |
| 2024/0145596 | A1 | 5/2024 | Liu et al. |

FOREIGN PATENT DOCUMENTS

| | | |
|---|---|---|
| KR | 20200050420 A | 5/2020 |
| KR | 20210016252 A | 2/2021 |
| KR | 20210028094 A | 3/2021 |
| TW | 202213467 A | 4/2022 |

\* cited by examiner

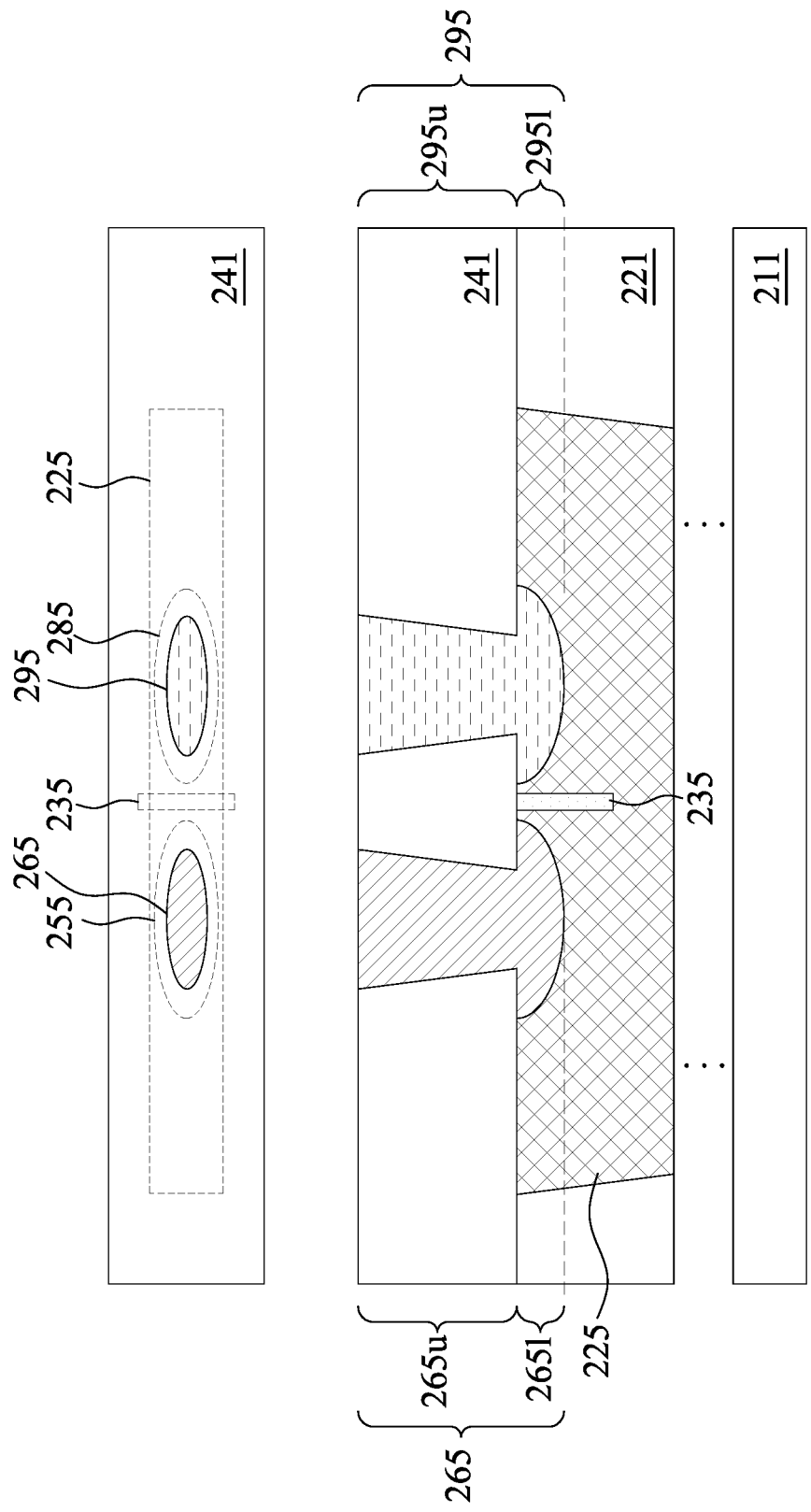

INTER BLOCK FOR RECESSED CONTACTS AND METHODS FORMING SAME

PRIORITY CLAIM AND CROSS-REFERENCE

This application is a divisional of U.S. application Ser. No. 17/466,205, filed on Sep. 3, 2021, which claims the benefit of the following provisionally filed U.S. Application No. 63/184,550, filed May 5, 2021.

BACKGROUND

In the manufacturing of integrated circuits, contact plugs are used for electrically coupling to the source and drain regions and the gates of transistors. The source/drain contact plugs were typically connected to source/drain silicide regions, whose formation processes include forming contact openings to expose source/drain regions, depositing a metal layer, depositing a barrier layer over the metal layer, performing an anneal process to react the metal layer with the source/drain regions, filling a metal into the remaining contact opening, and performing a Chemical Mechanical Polish (CMP) process to remove excess metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 28A, 28B, 28C, 28D, 28E, 28F, 28G, 28H, 28I, 28J, and 28K are top down and cross-sectional views of intermediate stages in the formation of a conductive structures and an inter block, in accordance with some embodiments.

DETAILED DESCRIPTION

Figure 1:
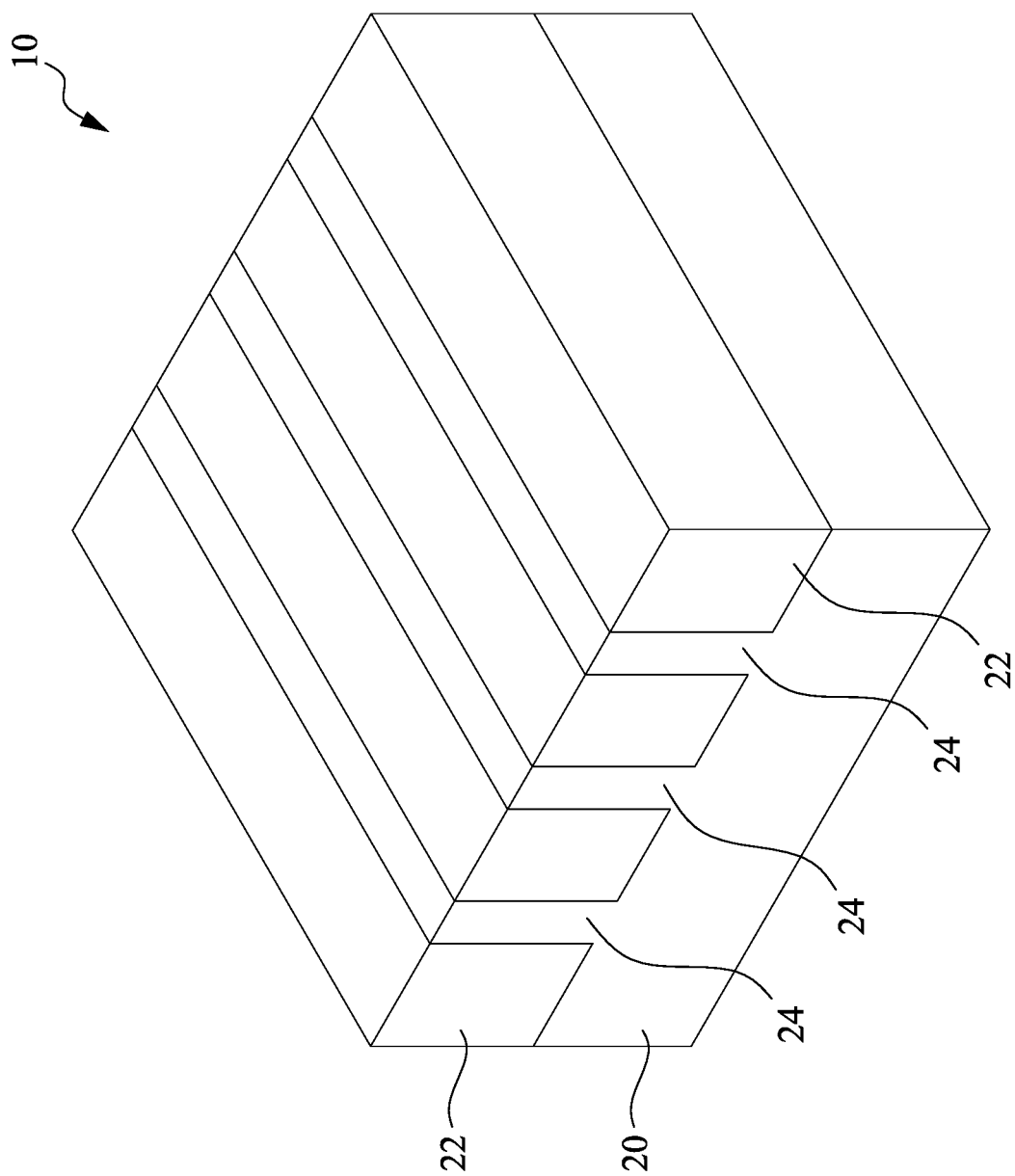
FIGS. 1-7, 8A, 8B, 8C, 9A, 9B, 9C, 10A, 10B, 10C, 10D, 11A, 11B, 11C, 12A, 12B, 12C, 13A, 13B, 13C, 14A, 14B, 14C, 14D, 15A, 15B, 15C, 16A, 16B, 16C, 17A, 17B, 17C, 18A, 18B, 19A, 19B, 22A, 22B, 22C, 23A, 23B, 23C, 24A, 24B, 24C, 25A, 25B, 25C, 26A, 26B, 26C, 27A, and 27B illustrate perspective views and cross-sectional views of intermediate stages in the formation of a Fin Field-Effect Transistor (FinFET) and the corresponding contact plugs in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An inter block is provided for separating a first recessed conductive structure from a second recessed conductive structure. Each of the recessed conductive structures extends into an underlying metal feature and up through an overlying insulating layer, such as an inter-layer dielectric. The inter block is formed in the underlying metal feature to prevent galvanic effects between each of the recessed conductive structures and/or between the underlying metal feature and the first recessed conductive structures when the second recessed conductive structure is made. The inter block prevents the etching which is performed in forming the second recessed conductive structure to cause a galvanic reaction between the underlying metal feature and the first recessed conductive structure. Also, because the inter block prevents the recessed conductive structures from coming into contact with each other, galvanic effects, such as galvanic corrosion may be reduced or eliminated between the recessed conductive structures, allowing different metals to be used for each recessed contact.

In accordance with some embodiments, a source/drain contact plug is formed in a first inter-layer dielectric, and an inter block is formed in the source/drain contact plug. A second inter-layer dielectric is formed over the first inter-layer dielectric, and one or more conductive structures are formed as recessed conductive structures in the second inter-layer dielectric. For example, in etching the second inter-layer dielectric for forming a second opening for one recessed conductive structure, the second opening is intentionally disposed on opposite sides of the inter block from the first opening, thereby exposing the lower source/drain contact plug. The exposed upper surface of the lower source/drain contact plug is etched through the first opening and the second opening to provide an enlarged opening or depression in the upper surface of the lower/source drain contact plug which is wider than the lateral extents of the bottom of the first and second openings. Because the inter block is formed in the lower source/drain contact plug, the enlarged opening or depression is blocked from extending laterally beyond the inter block. The conductive structure is then grown in a bottom-up process, having a shape resembling an upside down mushroom.

It is appreciated that although a Fin Field-Effect Transistor (FinFET) is used as an example, other types of transistors such as planar transistors, Gate-All-Around (GAA) transistors, or the like, may also adopt the embodiments of the present disclosure. Furthermore, although source/drain contact plugs are used as examples, other conductive features including, and not limited to, conductive lines, conductive plugs, conductive vias, and the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 29:
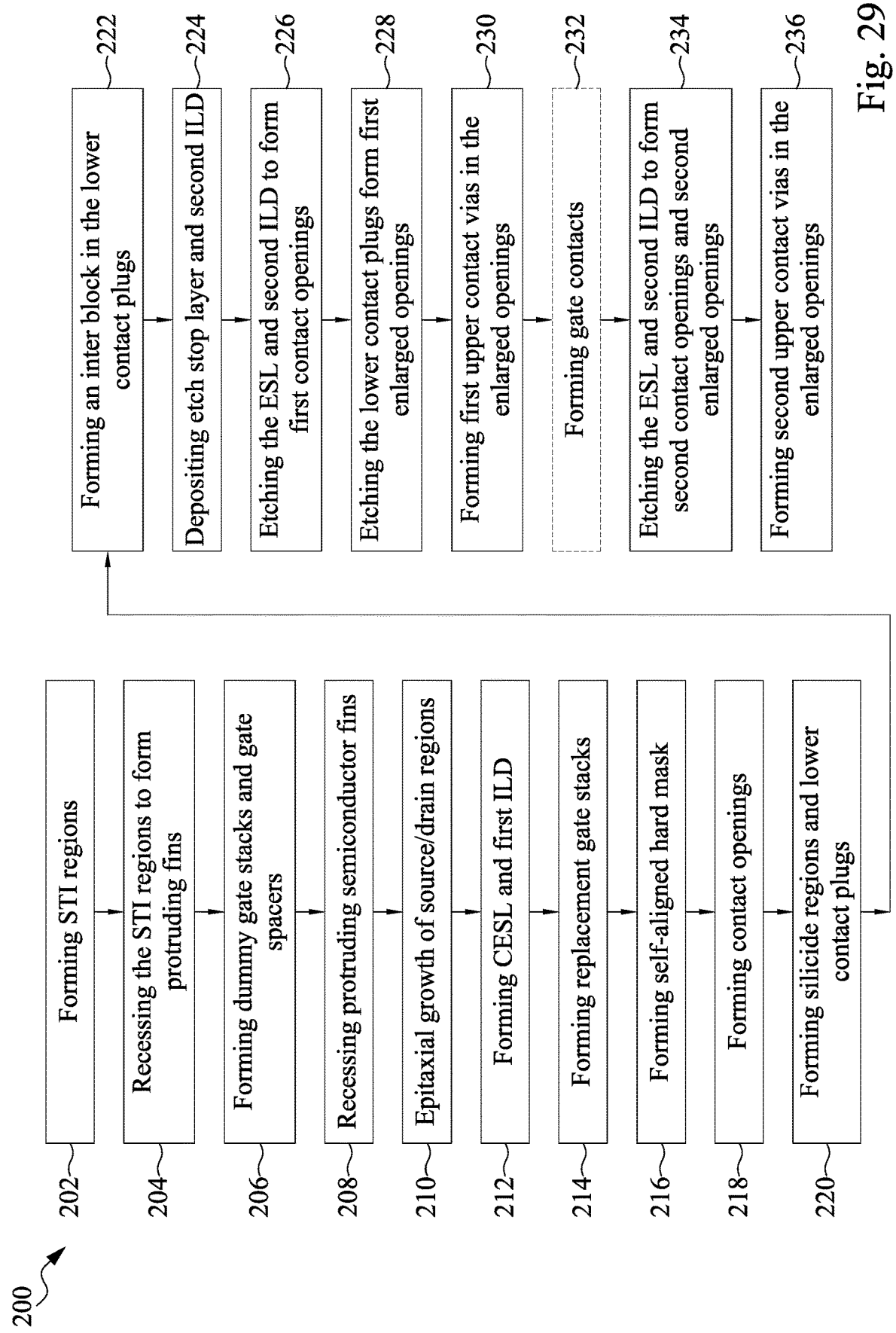
FIG. 29 illustrates a process flow for forming a transistor and conductive structures, in accordance with some embodiments.
Figure 30:
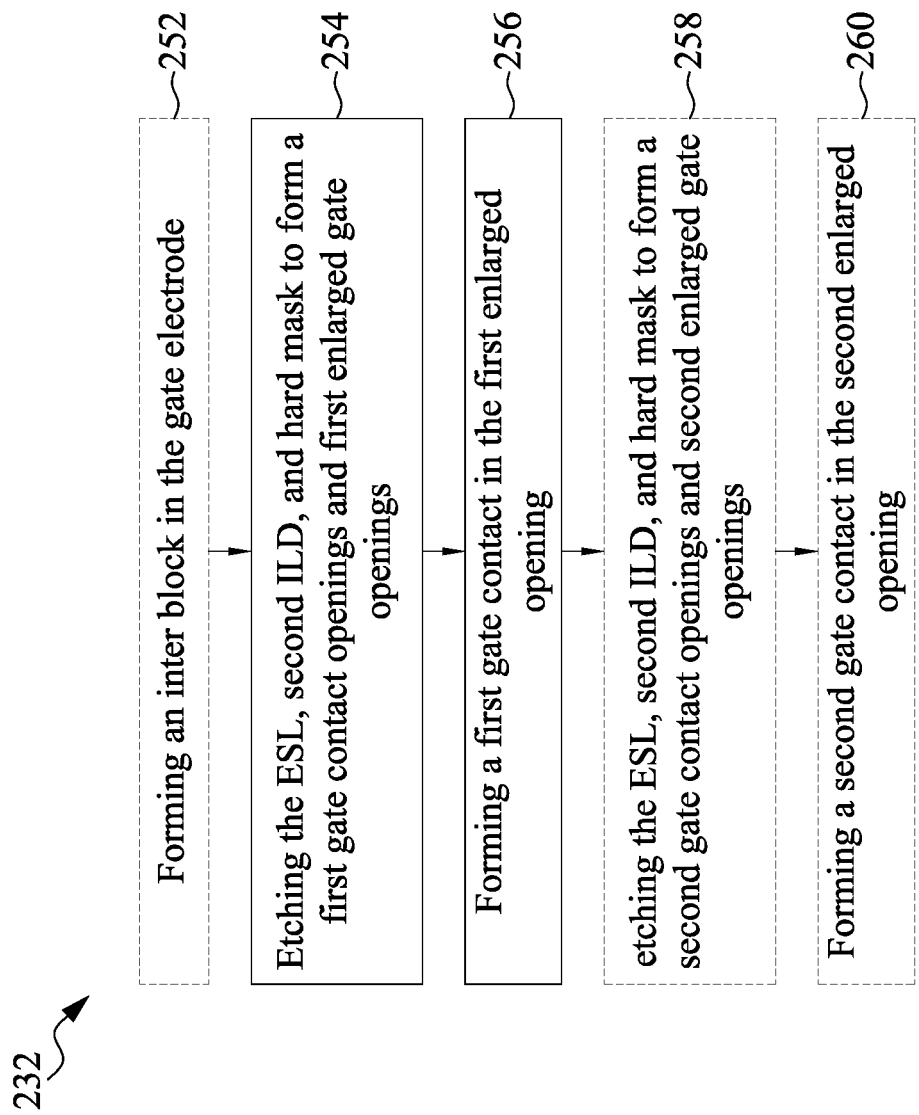
FIG. 30 illustrates a process flow for forming gate contacts in accordance with some embodiments.

FIGS. 1-7, 8A, 8B, 8C, 9A, 9B, 9C, 10A, 10B, 10C, 10D, 11A, 11B, 11C, 12A, 12B, 12C, 13A, 13B, 13C, 14A, 14B, 14C, 14D, 15A, 15B, 15C, 16A, 16B, 16C, 17A, 17B, 17C, 18A, 18B, 19A, 19B, 22A, 22B, 22C, 23A, 23B, 23C, 24A, 24B, 24C, 25A, 25B, 25C, 26A, 26B, 27A, and 27B illustrate the perspective views and cross-sectional views of intermediate stages in the formation of a Fin Field-Effect Transistor (FinFET) and the corresponding contact plugs in accordance with some embodiments of the present disclosure. The corresponding processes are also reflected schematically in the process flow 200 as shown in FIG. 29 and the process flow 232 in FIG. 30.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 29. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to grow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

In some embodiments a liner, such as an oxide liner, may be interposed between the STI regions 22 and the semiconductor strips 24 (not shown), which may be a thermal oxide layer formed through the thermal oxidation of a surface layer of substrate 20. The oxide layer may also be a deposited silicon oxide layer formed using, for example, Atomic Layer Deposition (ALD), High-Density Plasma Chemical Vapor Deposition (HDPCVD), Chemical Vapor Deposition (CVD), or the like. The STI regions 22 include a dielectric material over the liner (if used), wherein the dielectric material may be formed using Flowable Chemical Vapor Deposition (FCVD), spin-on coating, or the like.

Figure 2:
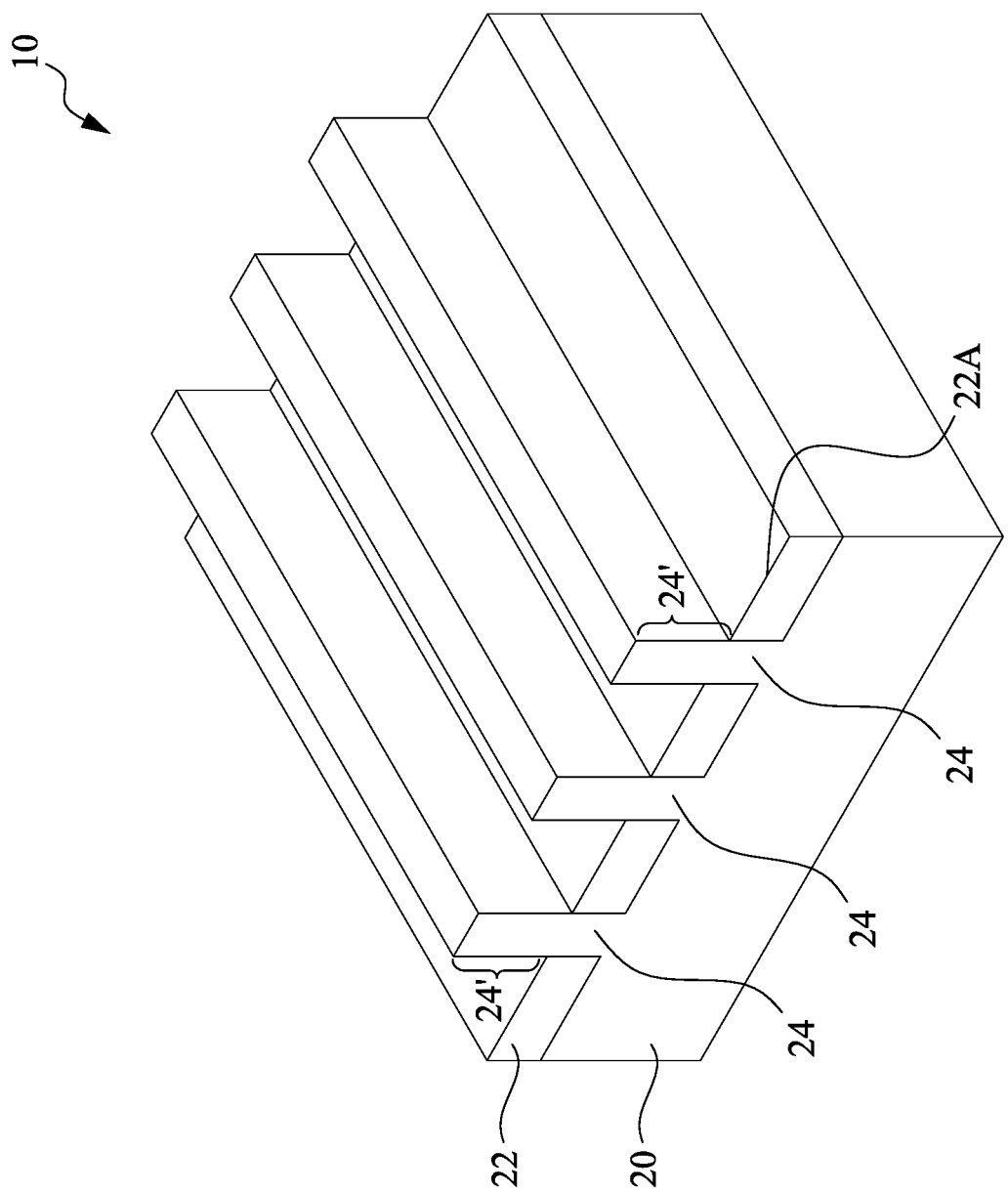

Referring to FIG. 2, STI regions 22 (and the liner if used) are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 29. The etching may be performed using a dry etching process, for example, using $NF_3$ and $NH_3$ as the etching gases. In accordance with alternative embodiments of the present disclosure, the recessing of STI regions 22 is performed using a wet etching process. The etching chemical may include diluted HF solution, for example.

In above-illustrated embodiments, the semiconductor strips may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
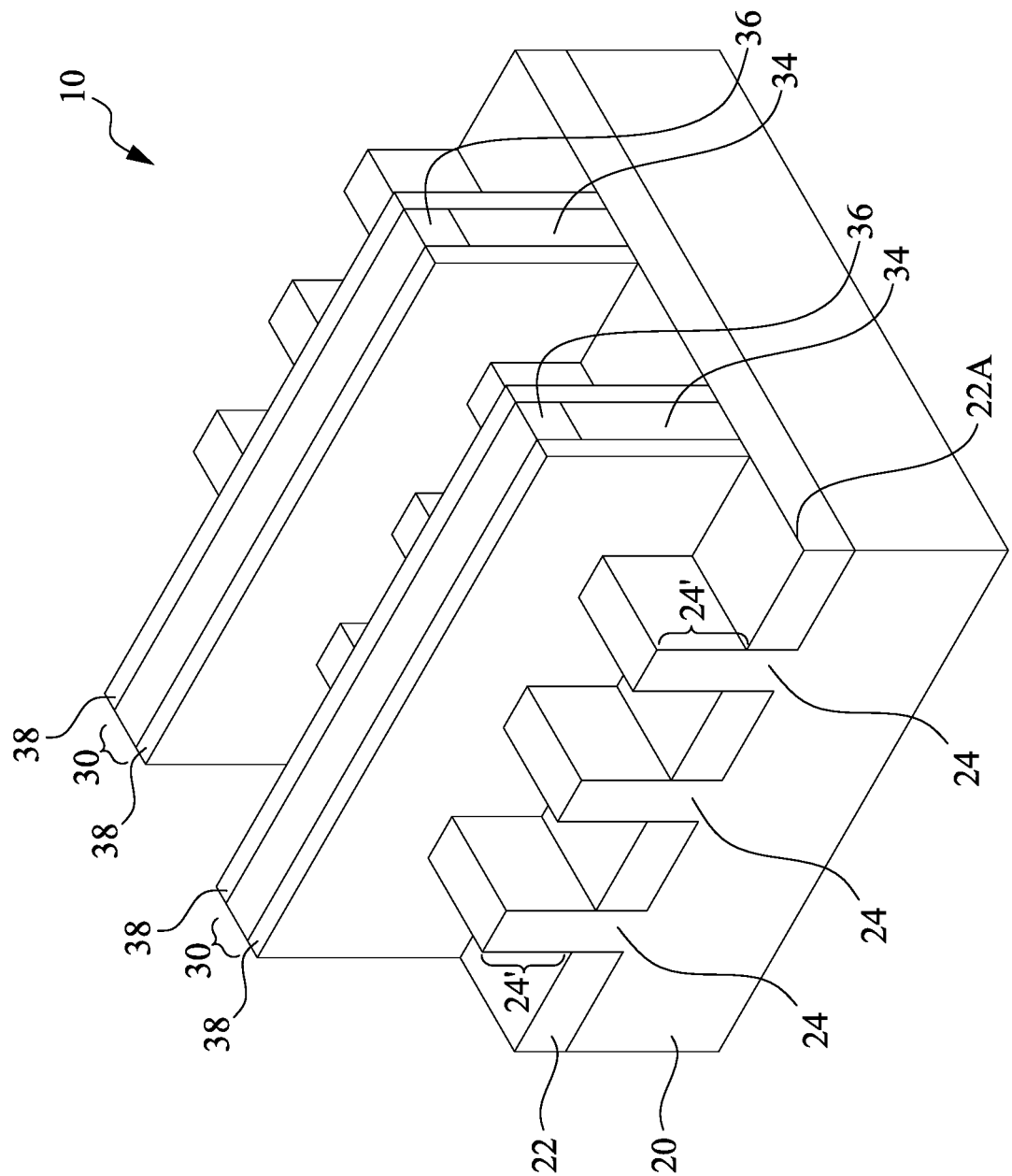

Referring to FIG. 3, dummy gate stacks 30 are formed to extend on the top surfaces and the sidewalls of (protruding) fins 24'. The respective process is illustrated as process 206 in the process flow 200 shown in FIG. 29. Dummy gate stacks 30 may include dummy gate dielectrics (not shown) in sidewalls of protruding fins 24', and dummy gate electrodes 34 over the respective dummy gate dielectrics. The dummy gate dielectrics may comprise silicon oxide. Dummy gate electrodes 34 may be formed, for example, using polysilicon, and other materials may also be used. Each of dummy gate stacks 30 may also include one (or a plurality of) hard mask layer 36 over the corresponding dummy gate electrodes 34. Hard mask layers 36 may be formed of silicon nitride, silicon oxide, silicon oxy-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 shown in FIG. 29. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
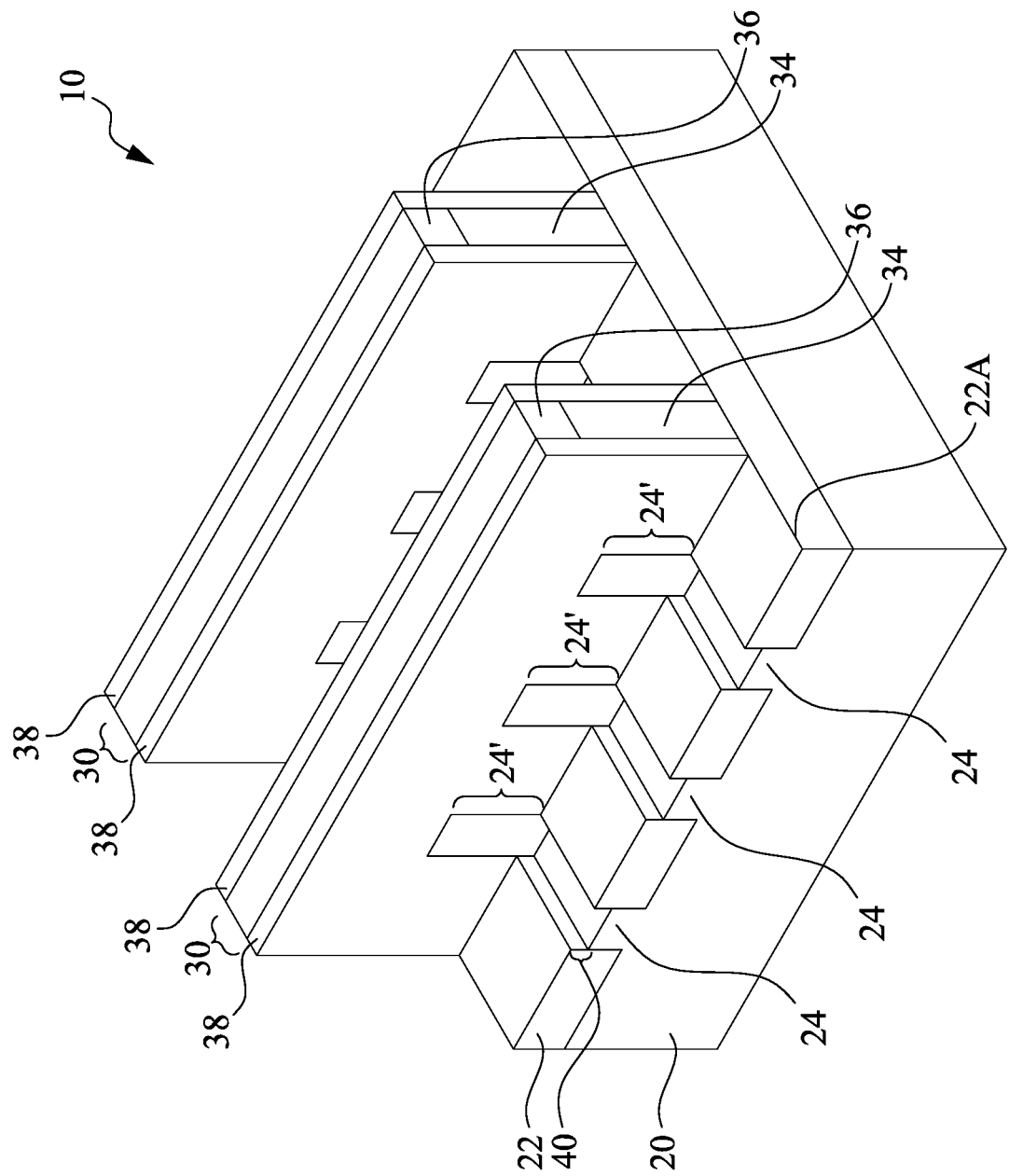

An etching process is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 29. The recessing may be anisotropic, and hence the portions of protruding fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
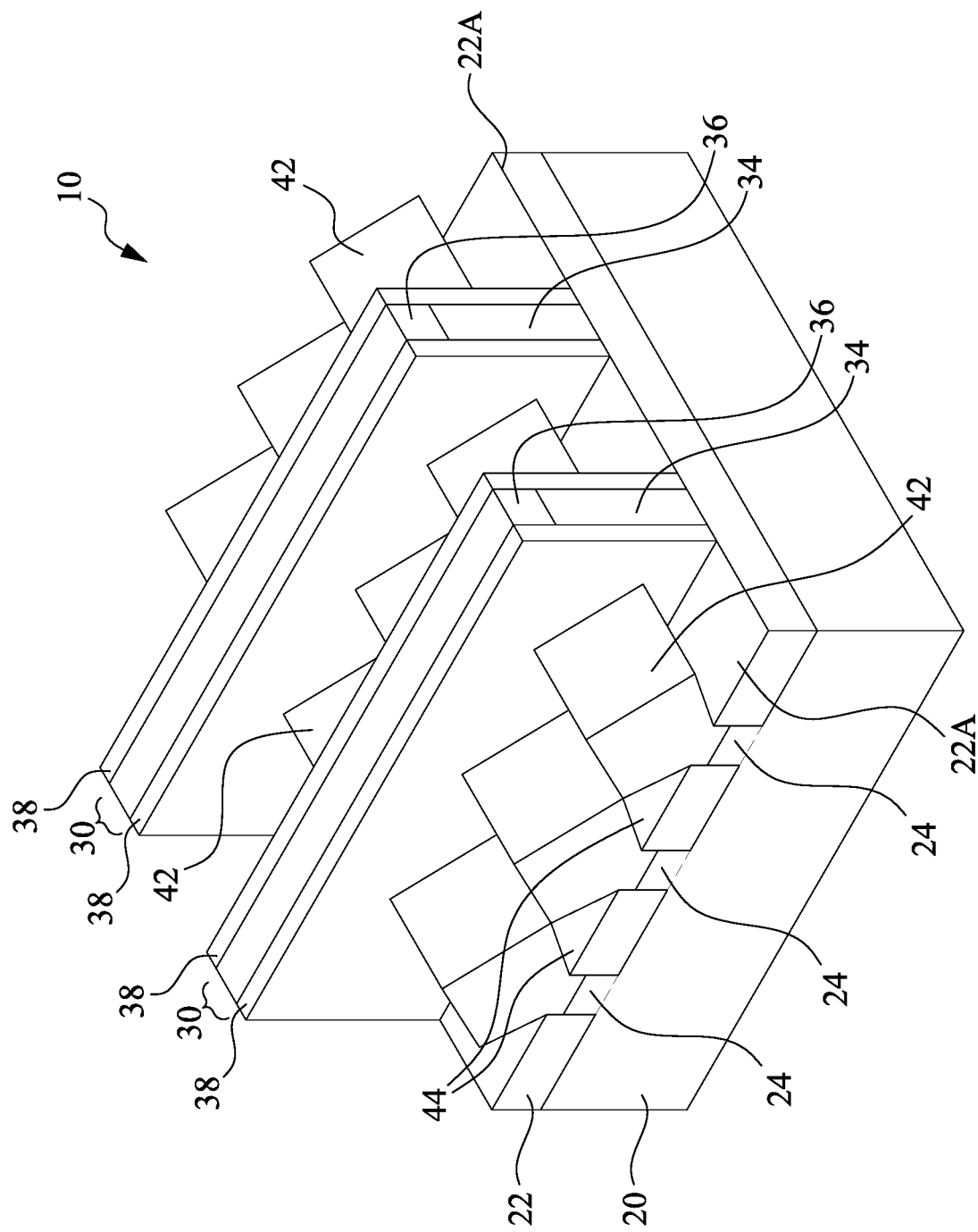
Figure 6:
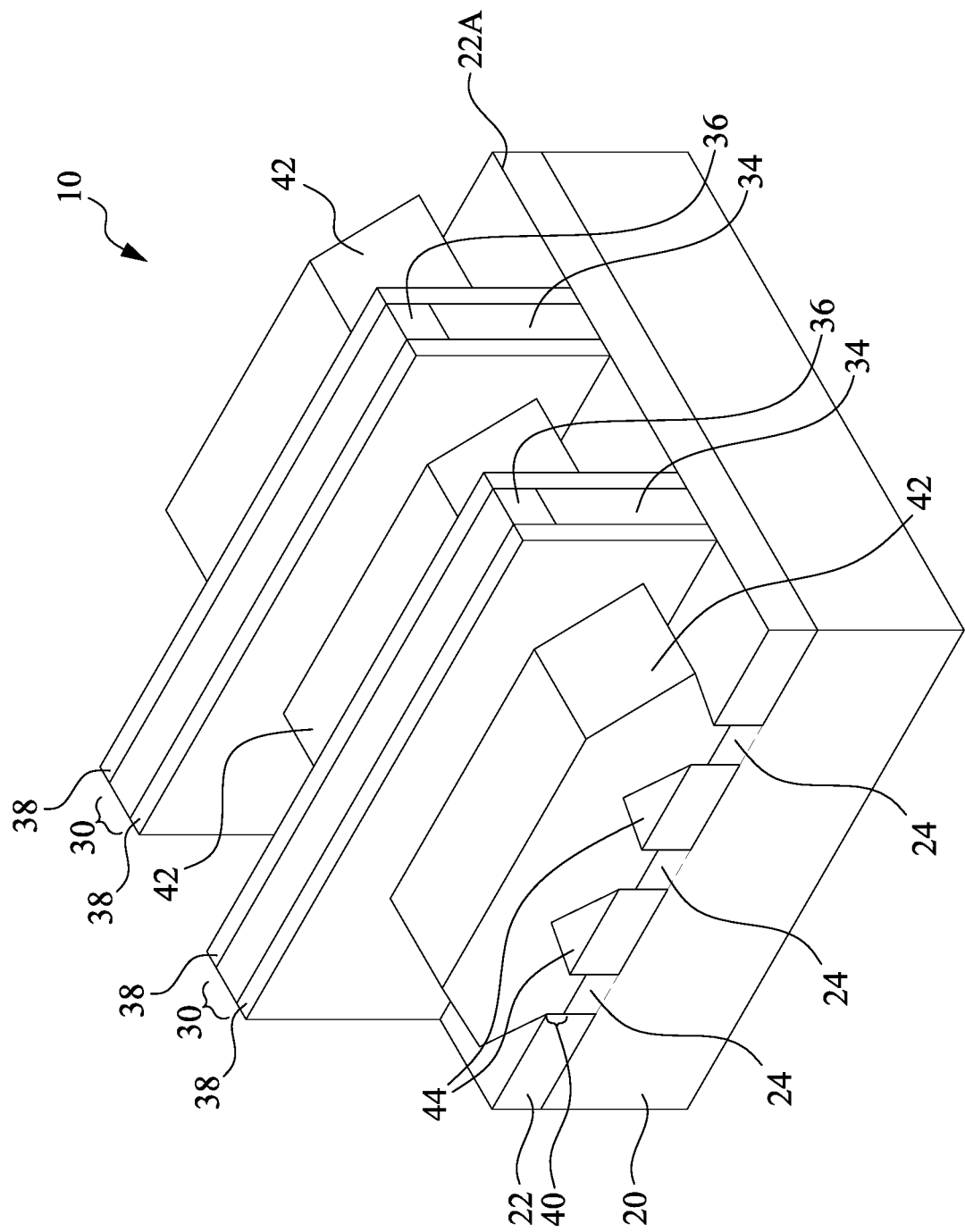

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 29. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy process, epitaxy regions 42 may be further implanted with a p-type or an n-type impurity to form source and drain regions, which are also denoted using reference numeral 42. In accordance with alternative embodiments of the present disclosure, the implantation process is skipped when epitaxy regions 42 are in-situ doped with the p-type or n-type impurity during the epitaxy.

Figure 7:
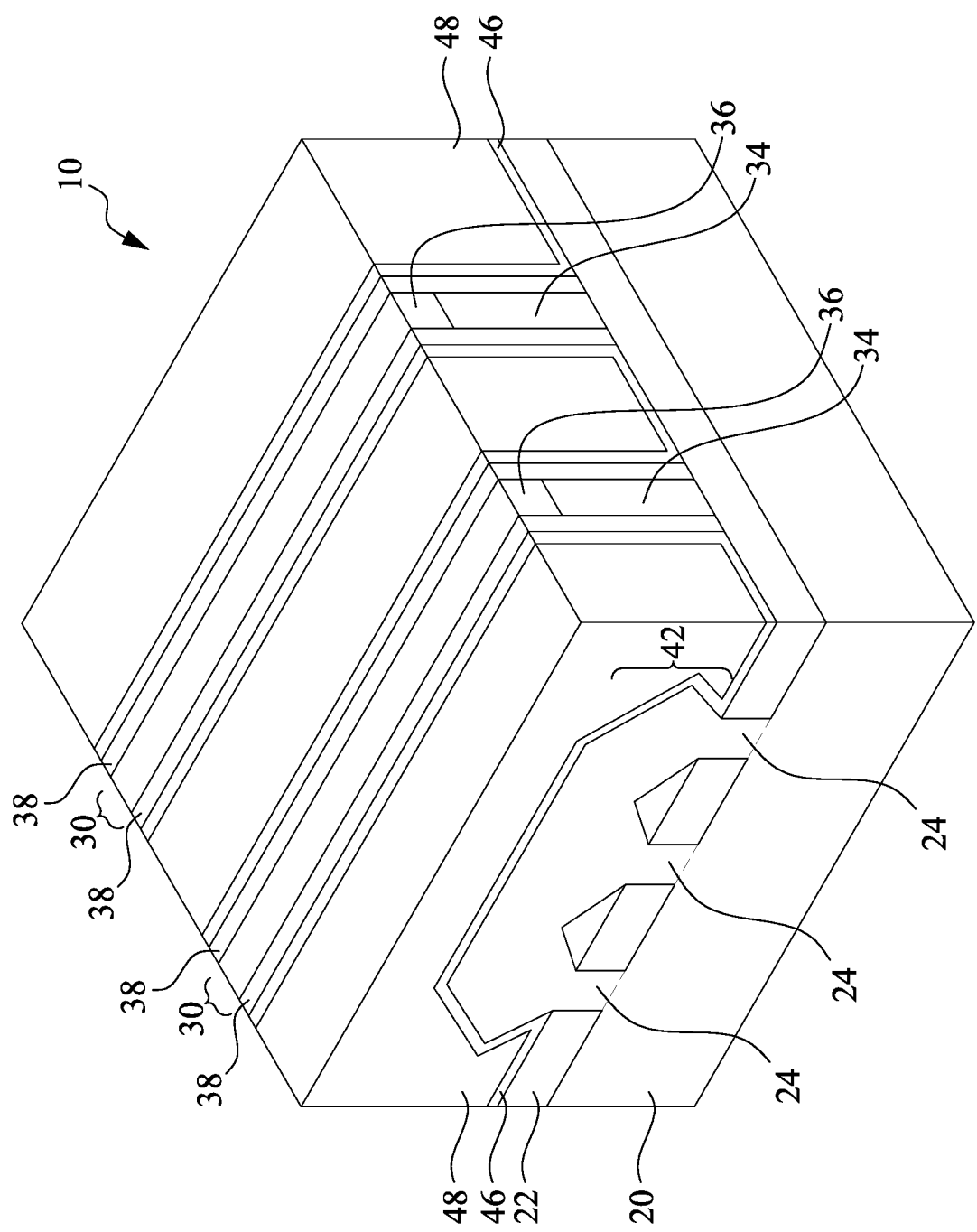

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 29. CESL 46 may be formed of silicon oxide (SiO), silicon nitride (SiN), silicon carbo-nitride (SiCN), silicon carbide (SiC), silicon oxy-carbide (SiOC), silicon oxy-carbo-nitride (SiOCN), or the like, and may be formed using CVD, ALD, or the like. ILD 48 may include a dielectric material formed using, for example, FCVD, spin-on coating, CVD, or another deposition process. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8A:
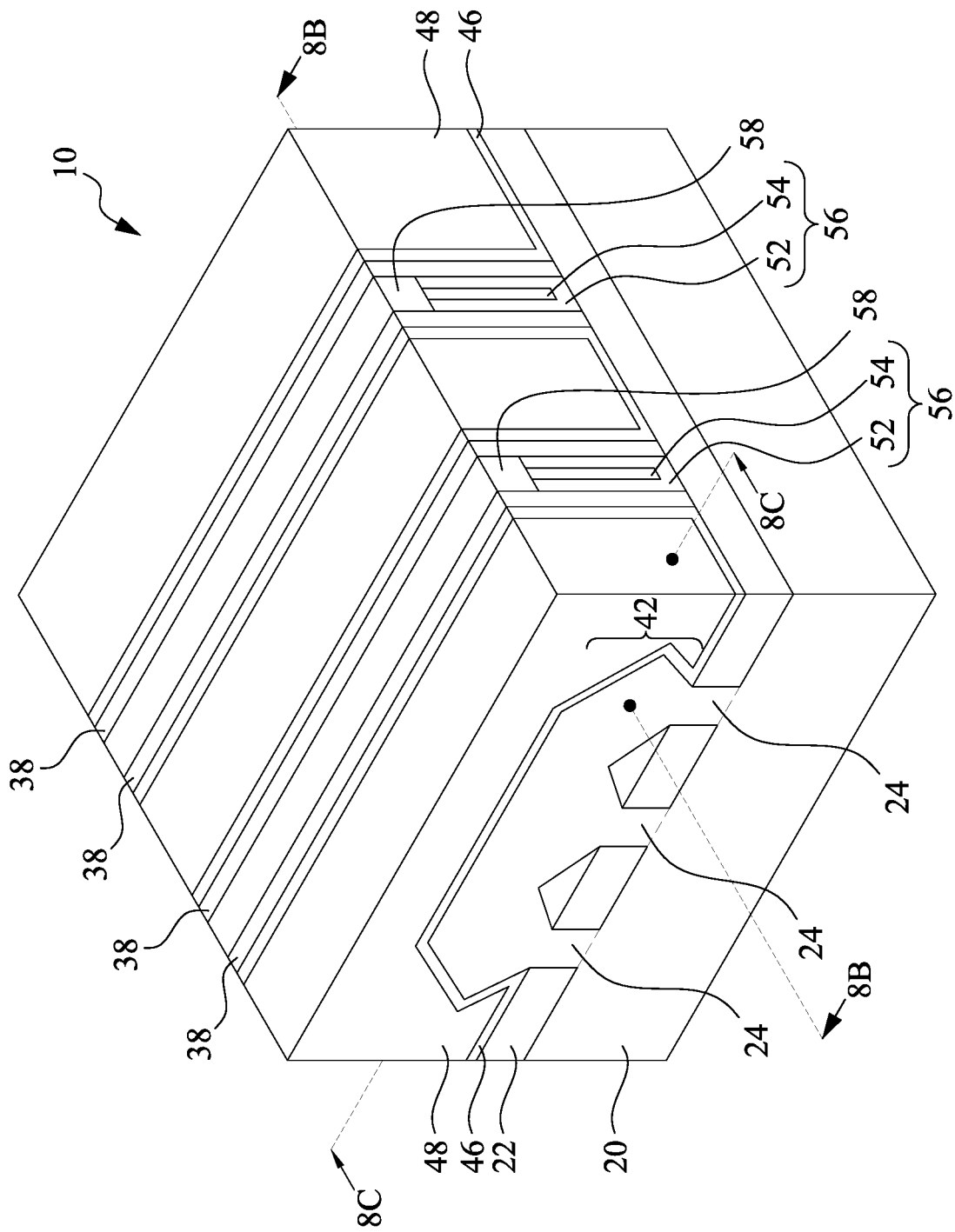
Figure 8B:
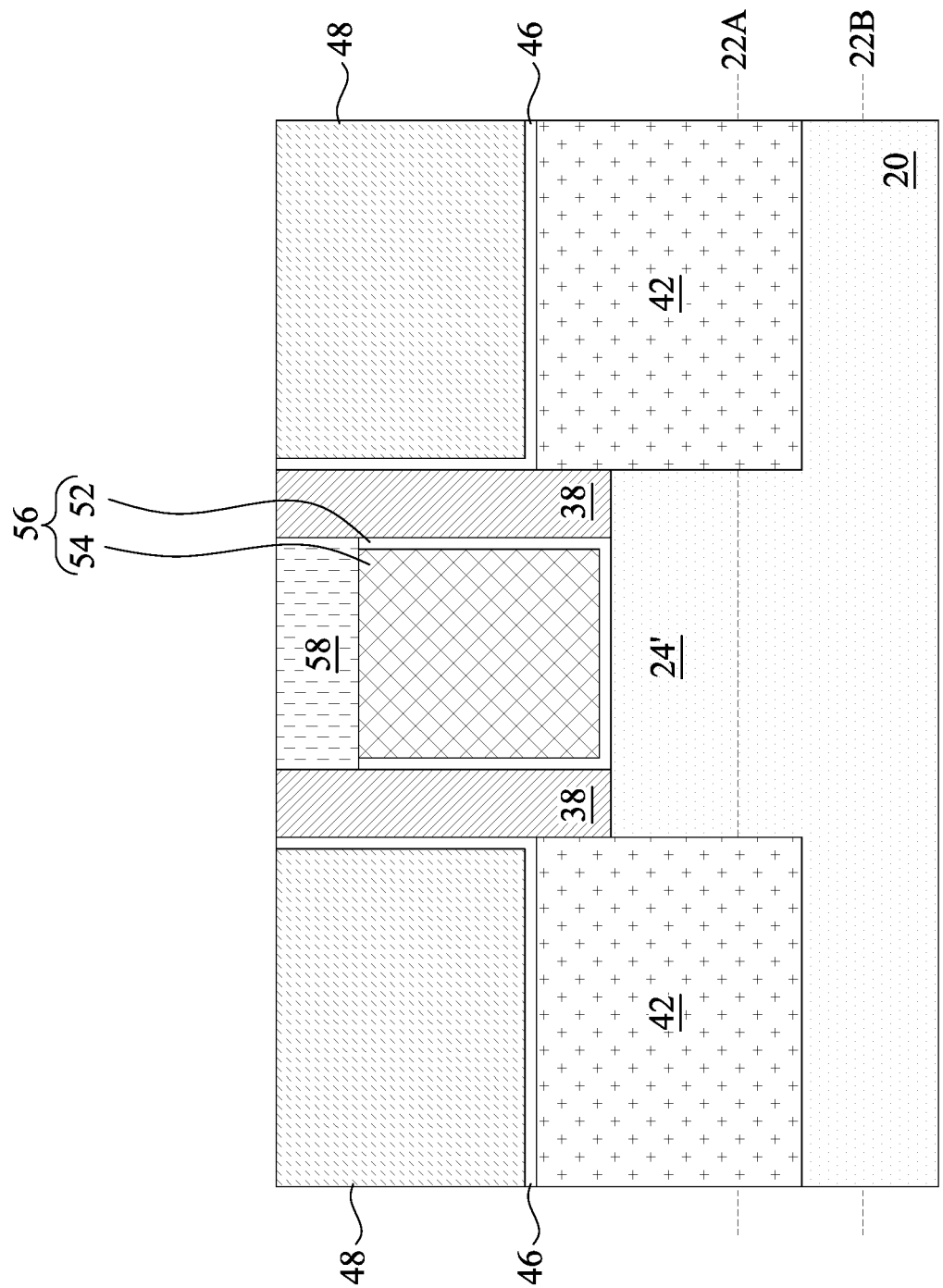
Figure 8C:
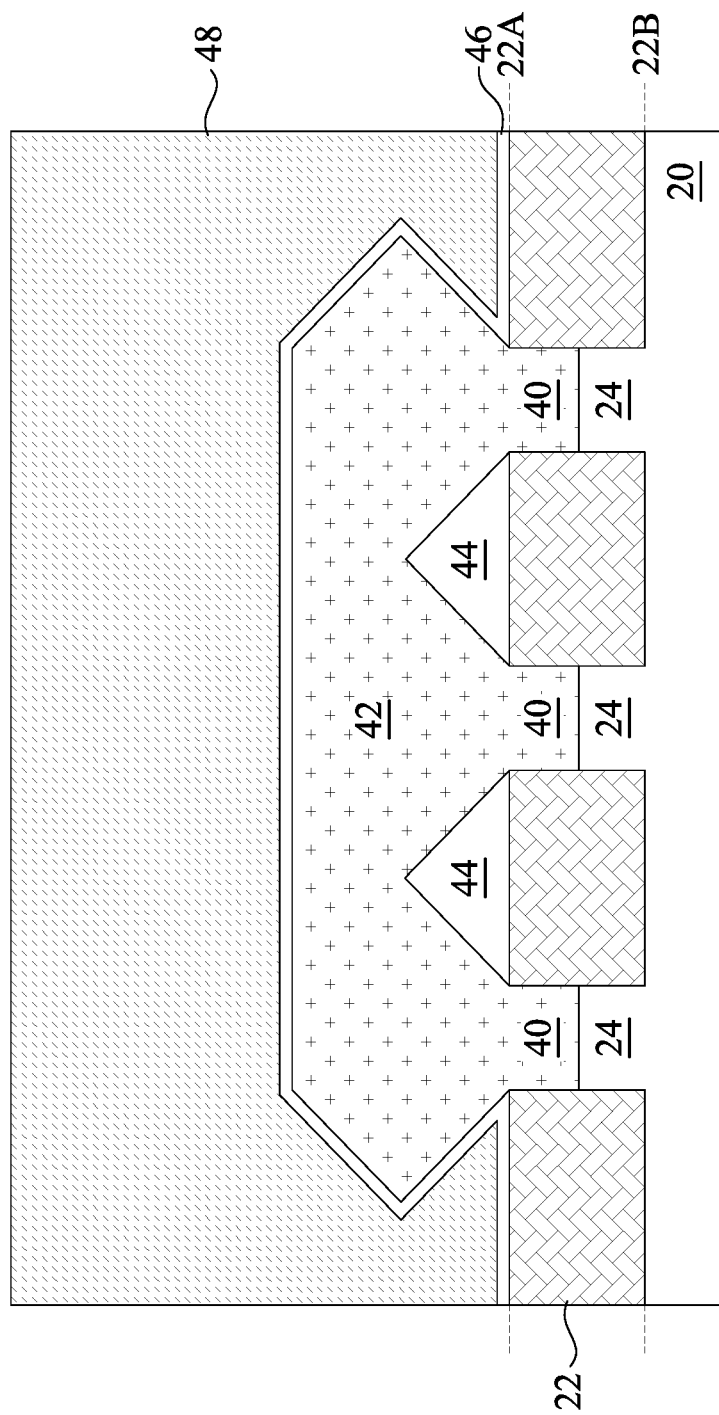

Next, in FIGS. 8A, 8B, and 8C, dummy gate stacks 30 (including hard mask layers 36, dummy gate electrodes 34, and the dummy gate dielectrics) are replaced with replacement gate stacks 56. The respective process is illustrated as process 214 in the process flow 200 shown in FIG. 29. FIG. 8B illustrates a cross-sectional view along the reference line 8B-8B in FIG. 8A and FIG. 8C illustrates a cross-sectional view along the reference line 8C-8C in FIG. 8A, in accordance with some embodiments.

When forming replacement gate stacks 56, hard mask layers 36, dummy gate electrodes 34 (as shown in FIG. 7), and the dummy gate dielectrics are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIGS. 8A, 8B, and 8C, replacement gate dielectrics 52 are formed, which extend into the trenches between gate spacers 38. In accordance with some embodiments of the present disclosure, each of gate dielectrics 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectrics 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIGS. 8A, 8B, and 8C, gate electrodes 54 are formed over gate dielectrics 52. Gate electrodes 54 include stacked conductive layers. The stacked conductive layers are not shown separately, while the stacked conductive layers may be distinguishable from each other. The deposition of the stacked conductive layers may be performed using a conformal deposition method(s) such as ALD or CVD. The stacked conductive layers may include a diffusion barrier layer (also sometimes referred to as a glue layer) and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a glue layer, which may be another TiN layer, is formed. The glue layer may or may not fully fill the trenches left by the removed dummy gate stacks.

The deposited gate dielectric layers and conductive layers are formed as conformal layers extending into the trenches, and include some portions over ILD 48. Next, if the glue layer does not fully fill the trenches, a metallic material is deposited to fill the remaining trenches. The metallic material may be formed of tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

FIGS. 8A, 8B, and 8C also illustrate the formation of (self-aligned) hard masks 58 in accordance with some embodiments. The respective process is illustrated as process 216 in the process flow 200 shown in FIG. 29. The formation of hard masks 58 may include performing an etching process to recess replacement gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxy-nitride, silicon oxy-carbo-nitride, or the like.

FIG. 8C further illustrates a cross-sectional view through the epitaxy regions 42 and illustrates the CESL 46 and ILD 48 disposed over the epitaxy regions 42, in accordance with some embodiments.

Figure 9A:
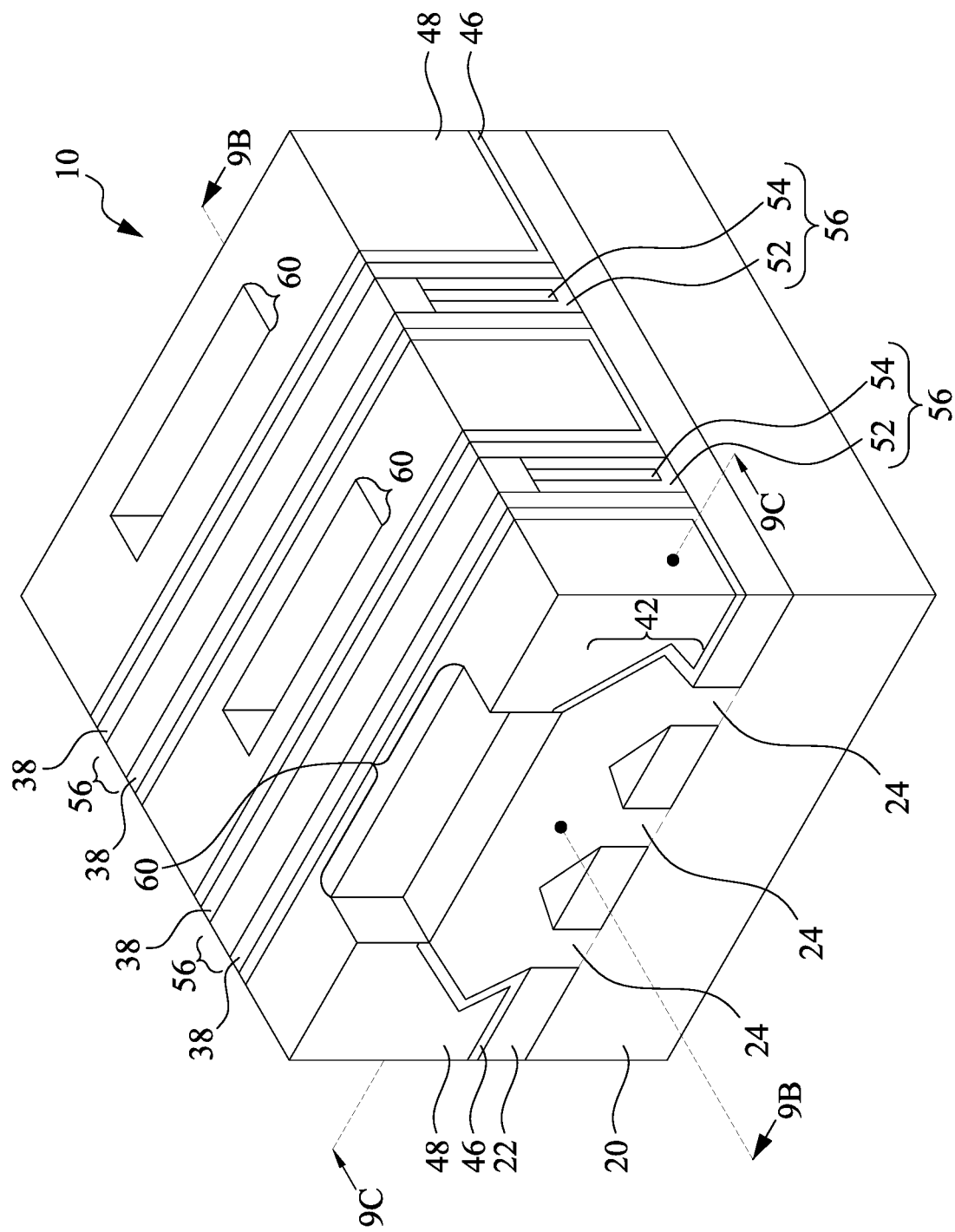
Figure 9B:
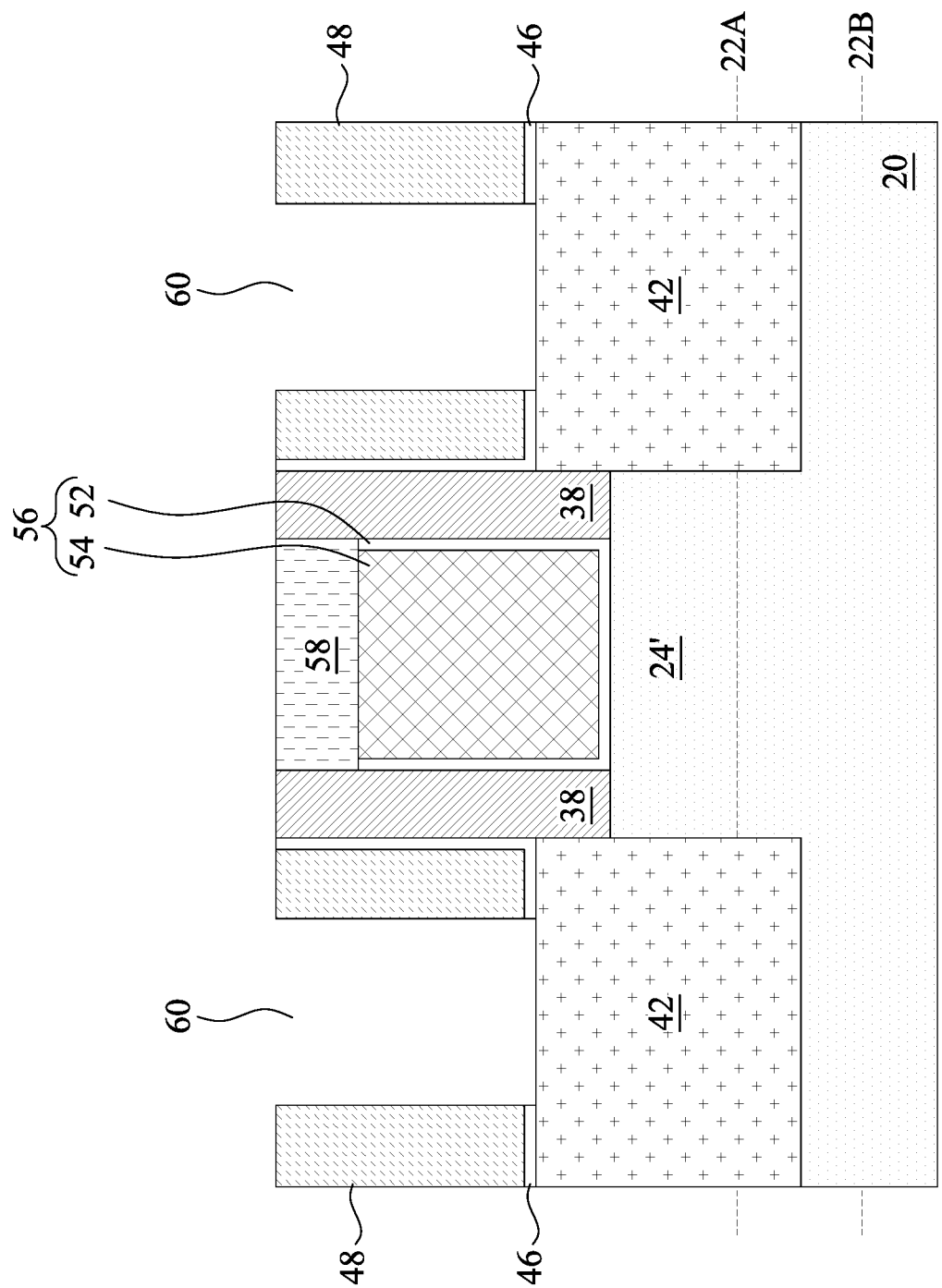
Figure 9C:
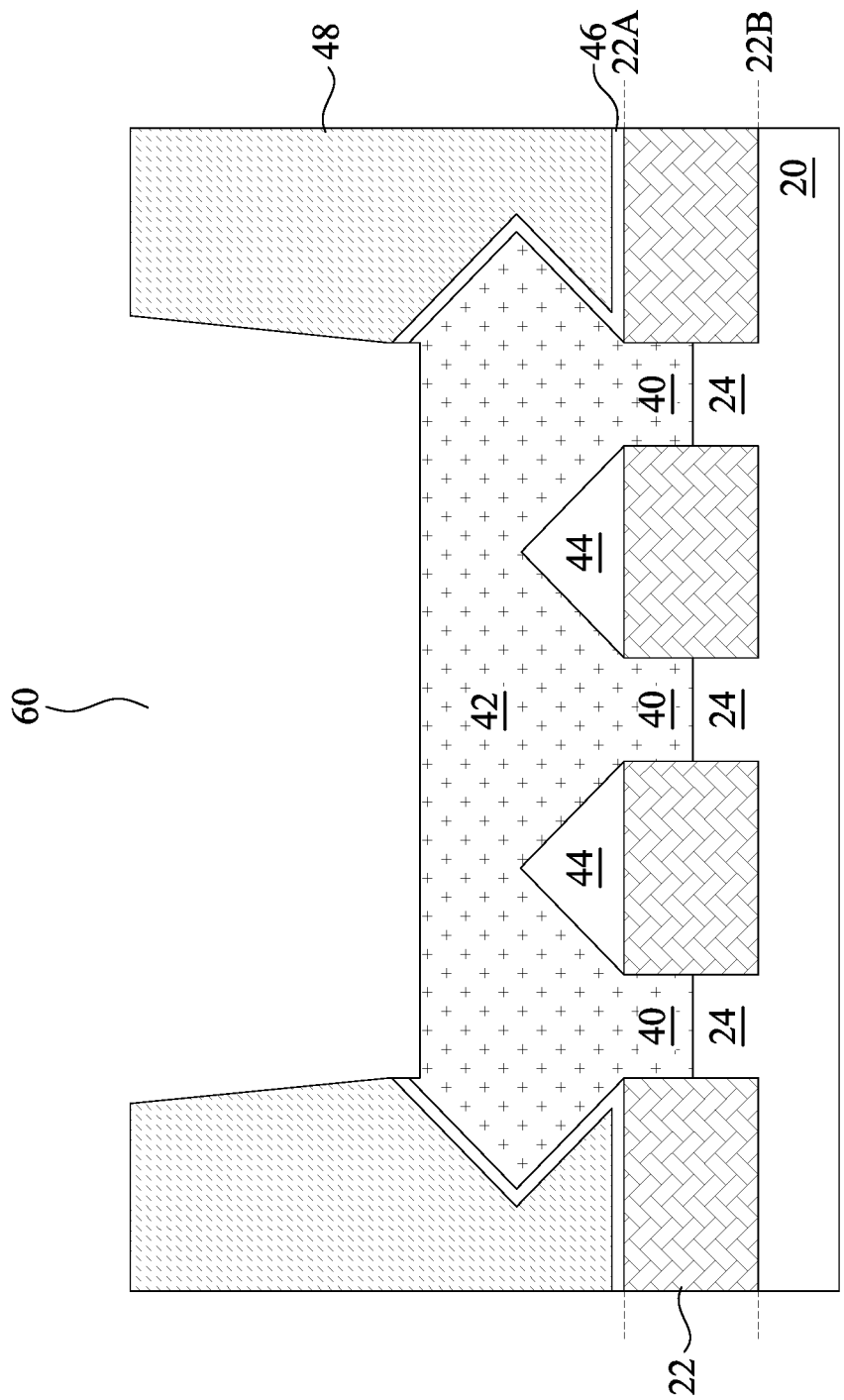

FIGS. 9A, 9B, and 9C a perspective view and cross-sectional views in the formation of contact openings 60 for the epitaxy regions 42. The respective process is illustrated as process 218 in the process flow 200 shown in FIG. 29. FIG. 9B illustrates the reference cross-section 9B-9B in FIG. 9A. FIG. 9C illustrates the reference cross-section 9C-9C in FIG. 9A. The formation of contact openings 60 includes etching ILD 48 to expose the underlying portions of CESL 46, and then etching the exposed portions of CESL 46 to reveal epitaxy regions 42. In accordance with some embodiments of the present disclosure, as illustrated in FIG. 9A, gate spacers 38 are spaced apart from the nearest contact openings 60 by some portions of ILD 48 and CESL 46.

Figure 10A:
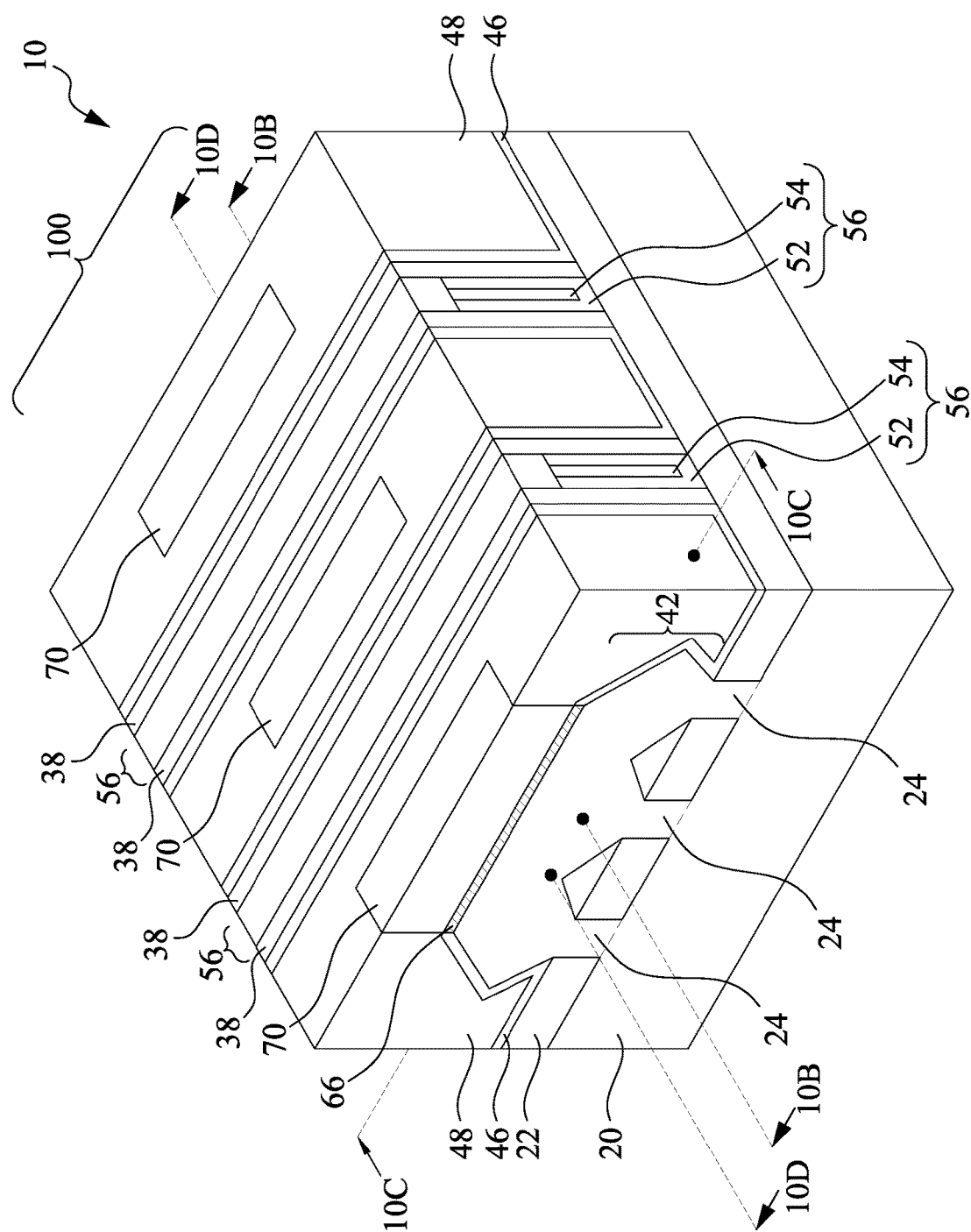
Figure 10B:
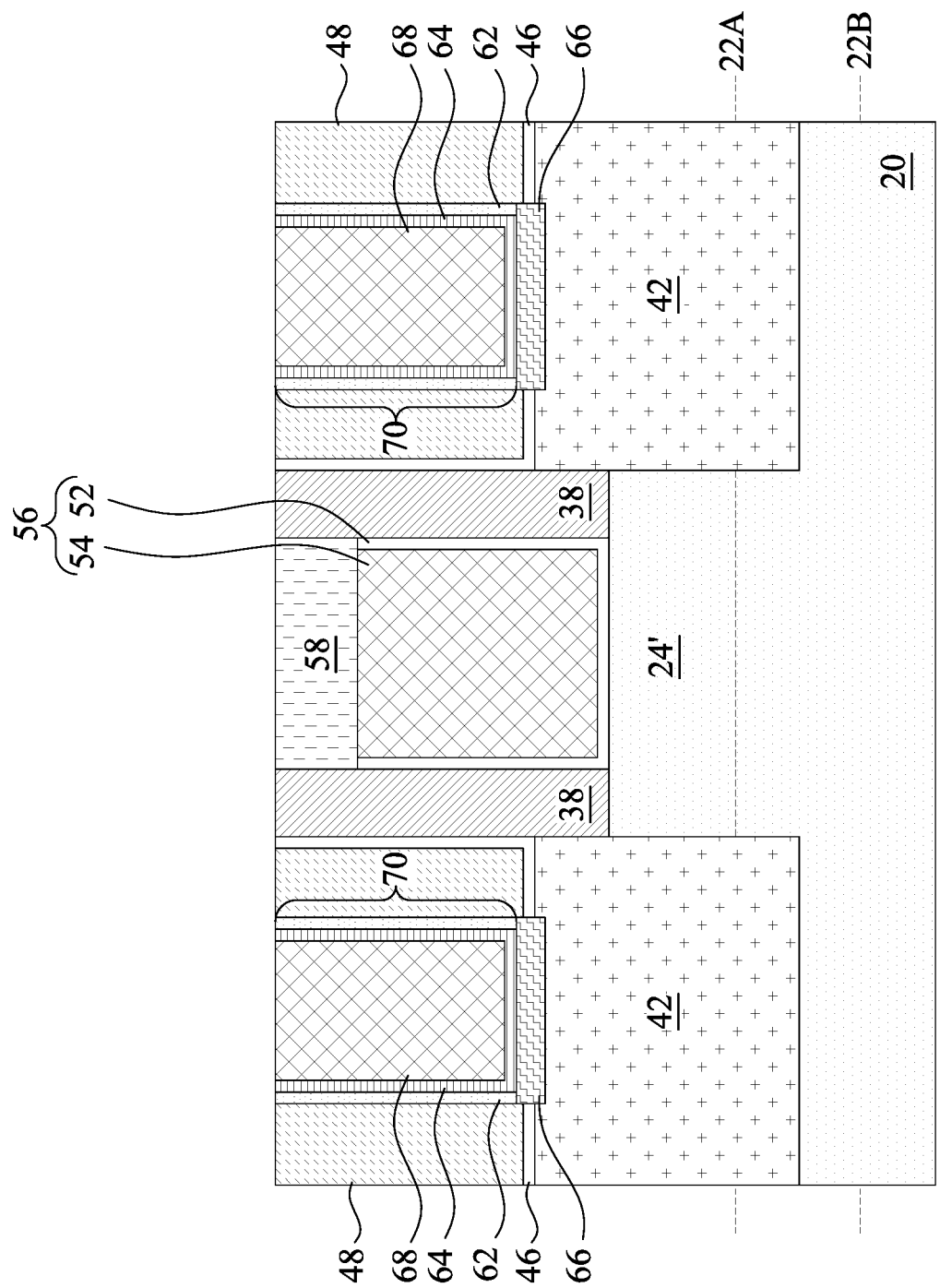
Figure 10C:
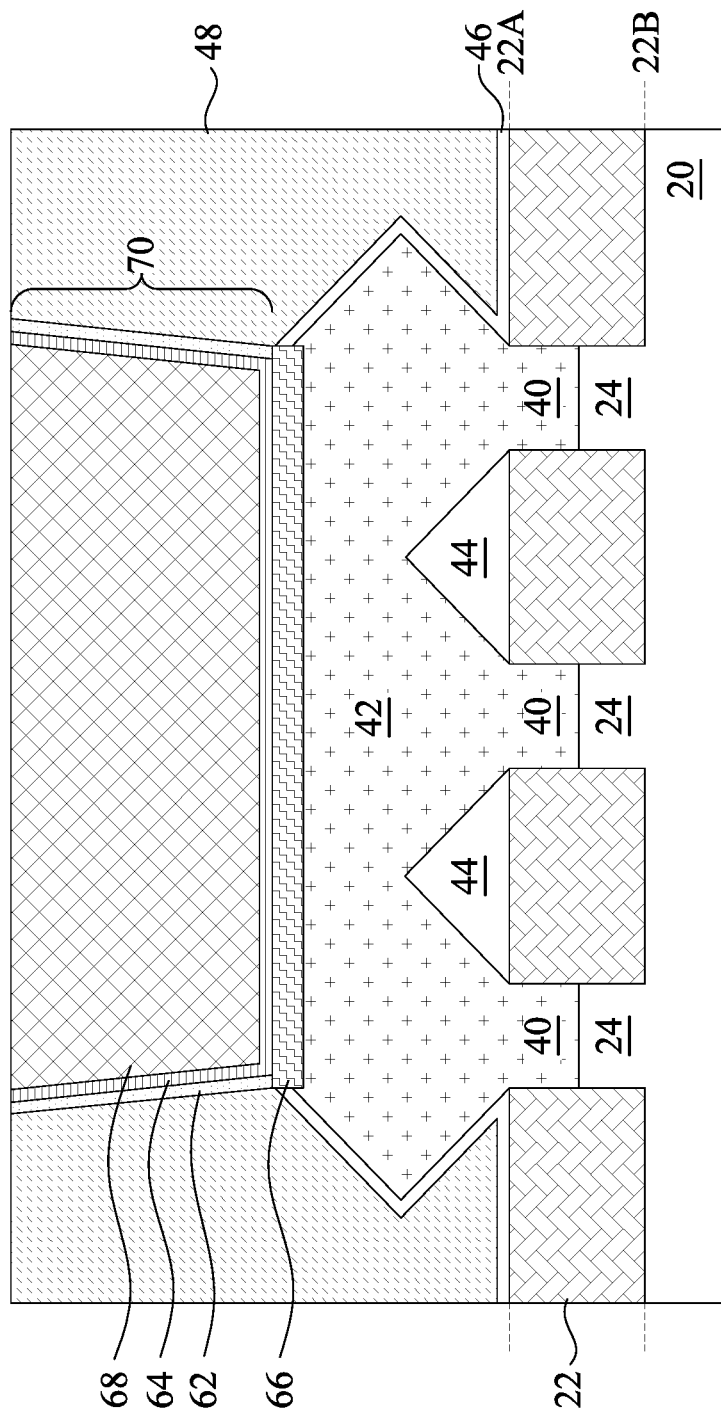
Figure 10D:
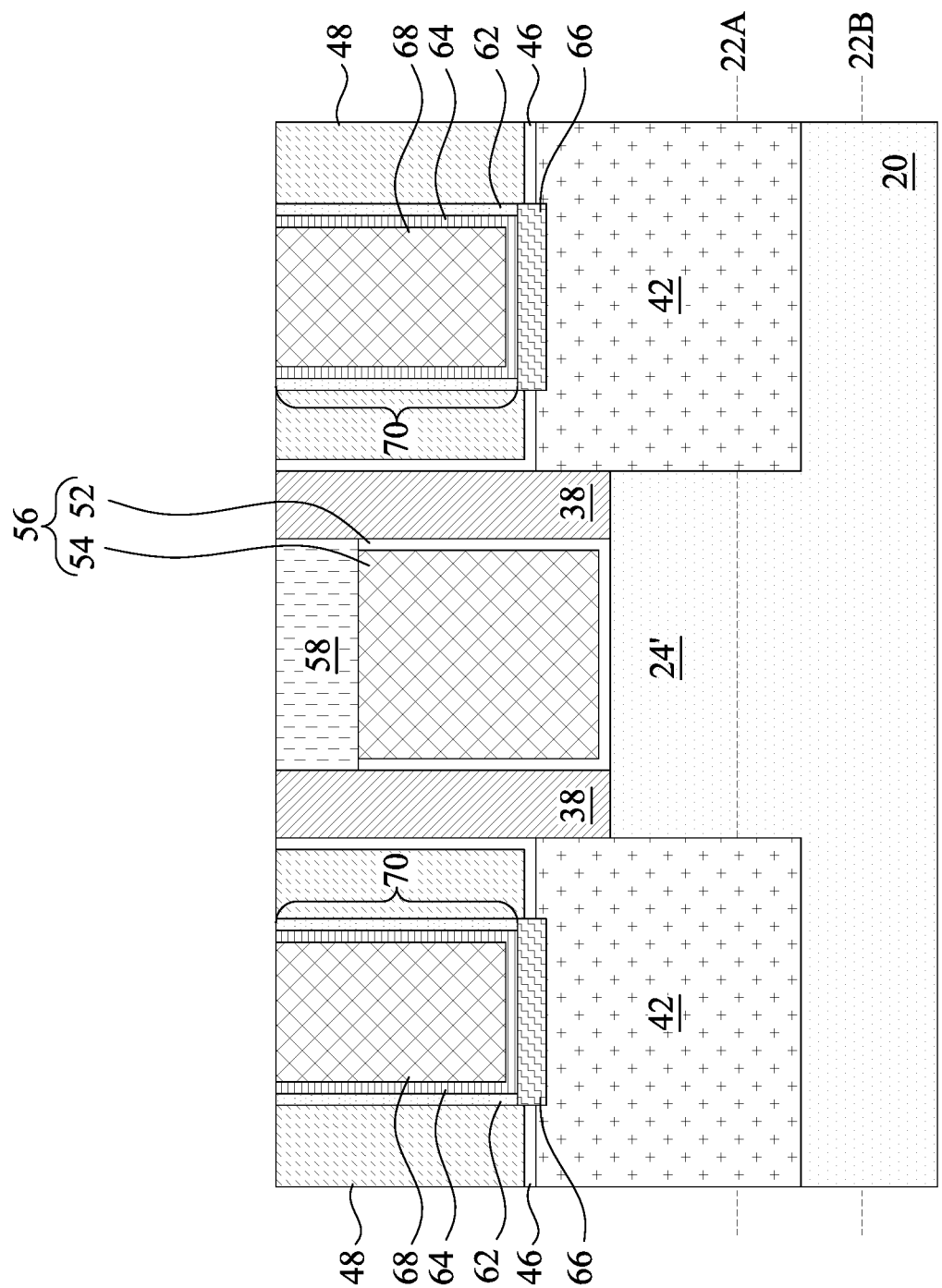

Referring to FIGS. 10A, 10B, 10C, and 10D, silicide regions 66 and source/drain contact plugs 70 are formed. FIG. 10A illustrates a perspective view, FIG. 10B illustrates the reference cross-section 10B-10B in FIG. 10A, FIG. 10C illustrates the reference cross-section 10C-10C in FIG. 10A, and FIG. 10D illustrates the reference cross-section 10D-10D in FIG. 10A. In accordance with some embodiments, metal layer 62 (such as a titanium layer, titanium nitride layer, or a cobalt layer, FIG. 10C) is deposited, for example, using Physical Vapor Deposition (PVD) or a like method. Metal layer 62 is a conformal layer, and extends onto the top surface of epitaxy regions 42 and the sidewalls of ILD 48. A capping layer 64, for example, utilizing a metal nitride layer (such as a titanium nitride layer) is deposited. An annealing process is then performed to form source/drain silicide regions 66, as shown in FIGS. 10A, 10B, 10C, and 10D. The respective process is illustrated as process 220 in the process flow 200 shown in FIG. 29. Next, a metallic region 68 formed of a metallic material, which may comprise Ru, Co, Ni, Cu, Al, Pt, Mo, W, Al, Ir, Os, or combinations thereof, or the like, is filled into the remaining portions of the contact openings. A planarization process such as a CMP process or a mechanical grinding process is then performed to remove excess portions of the metal layer 62, the capping layer 64, and the metallic material of the metallic region 68, leaving source/drain contact plugs 70. The respective process is also illustrated as process 220 in the process flow 200 shown in FIG. 29. FinFET 100 is thus formed.

FIGS. 11A, 11B, and 11C through 19A and 19B illustrate additional intermediate steps in forming conductive structures over the source/drain contact plugs 70.

Figure 11A:
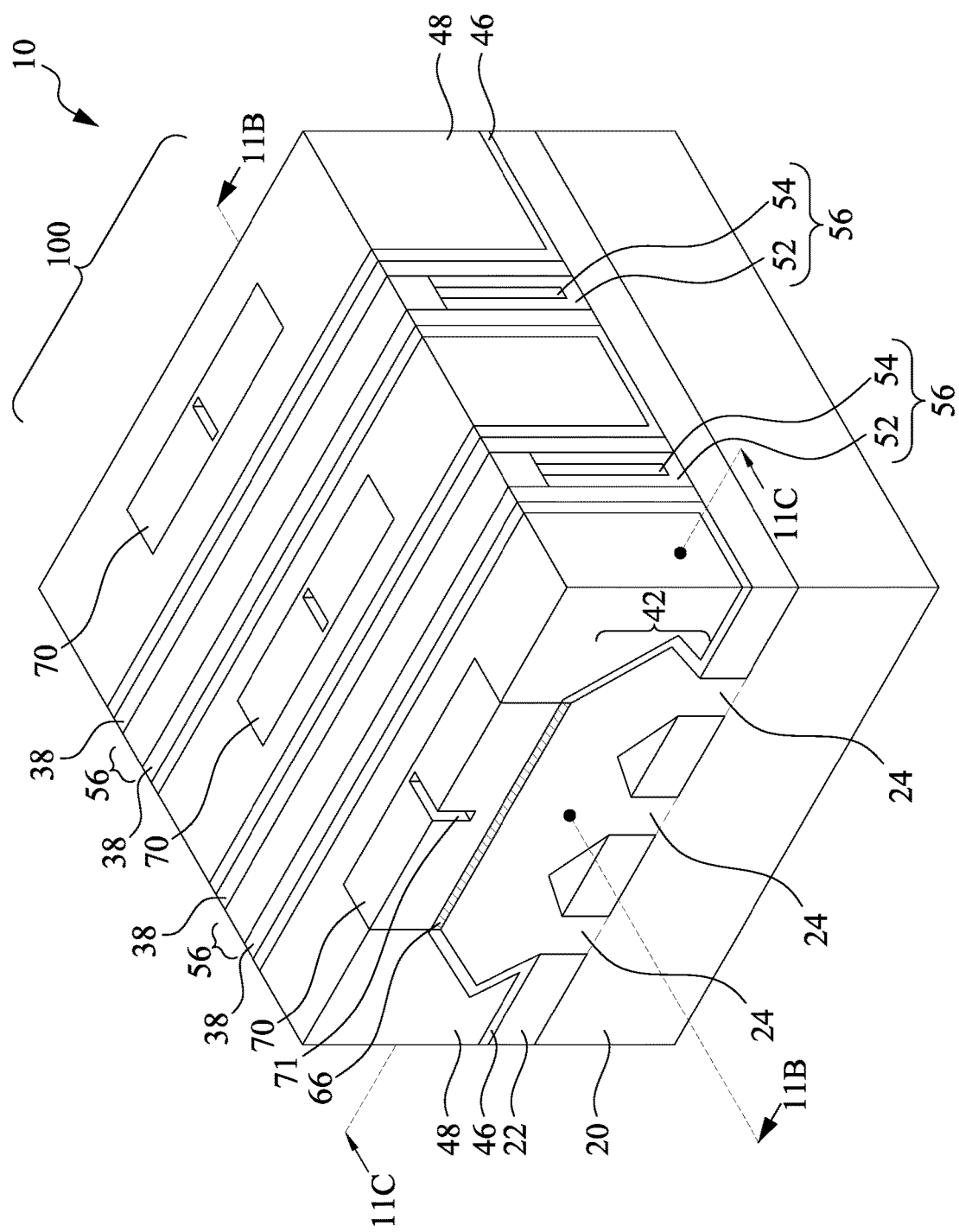
Figure 11B:
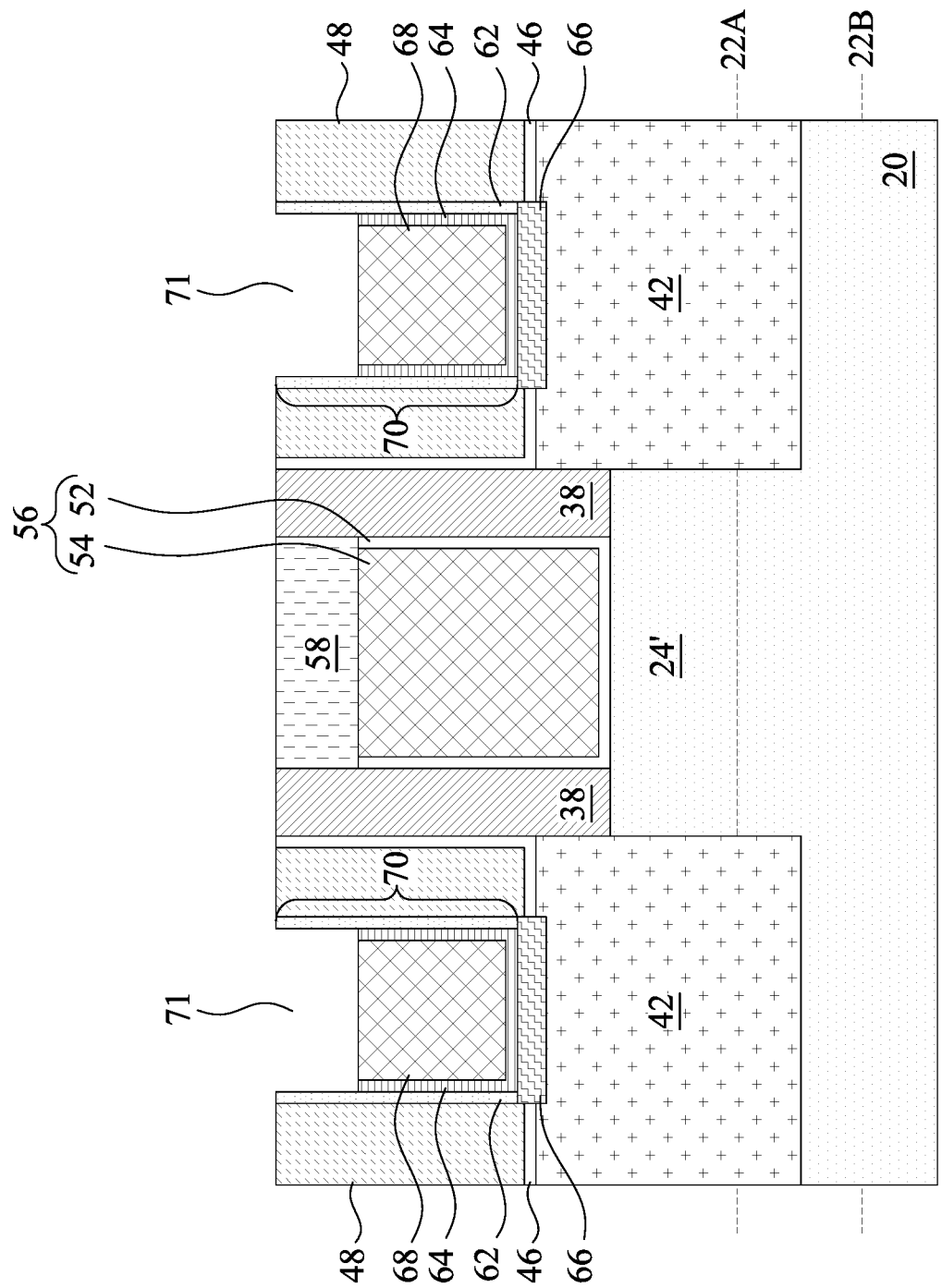
Figure 11C:
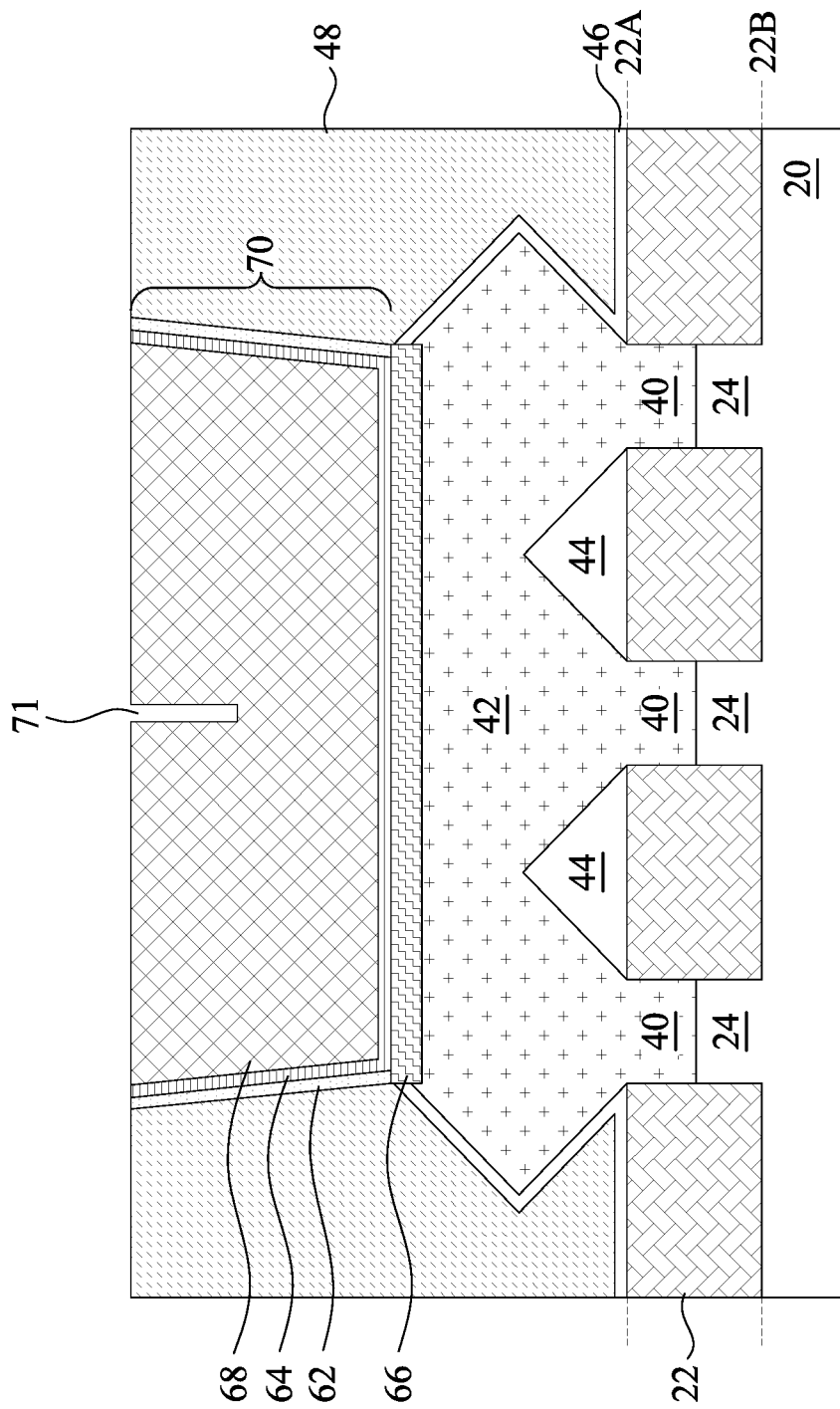

Referring to FIGS. 11A, 11B, and 11C, openings 71 are formed in the source/drain contact plugs 70. FIG. 11A illustrates a perspective view, FIG. 11B illustrates the reference cross-section 11B-11B in FIG. 11A, and FIG. 11C illustrates the reference cross-section 11C-11C in FIG. 11A. The respective process is illustrated as process 222 in the process flow 200 shown in FIG. 29. The openings 71 may be formed by any suitable process, such as, by an acceptable photolithography process where a one-, two-, or three-layer photomask may be formed over the source/drain contact plugs 70 and developed and/or patterned to form an opening therein, which is then transferred to the source/drain contact plugs 70 by an etching process to form the openings 71. The etching process may be a dry etch or wet etch and the openings 71 may result in several different shapes, which are discussed in further detail below with respect to FIGS. 21A through 21J. As shown in FIG. 11B, the etching to form the opening 71 may include removing a portion of the metallic region 68, as well as a portion of the capping layer 64. In other embodiments, the width of the metallic region 68 removed for the opening 71 may be less than the width of the metallic region 68, so that a portion of the metallic region 68 remains on one or both sides of the opening 71.

Although the openings 71 are depicted as being formed in the middle of the metallic region 68 of the source/drain contact 70, it should be understood that the openings 71 may be formed toward one end or the other of the metallic region 68.

Figure 12A:
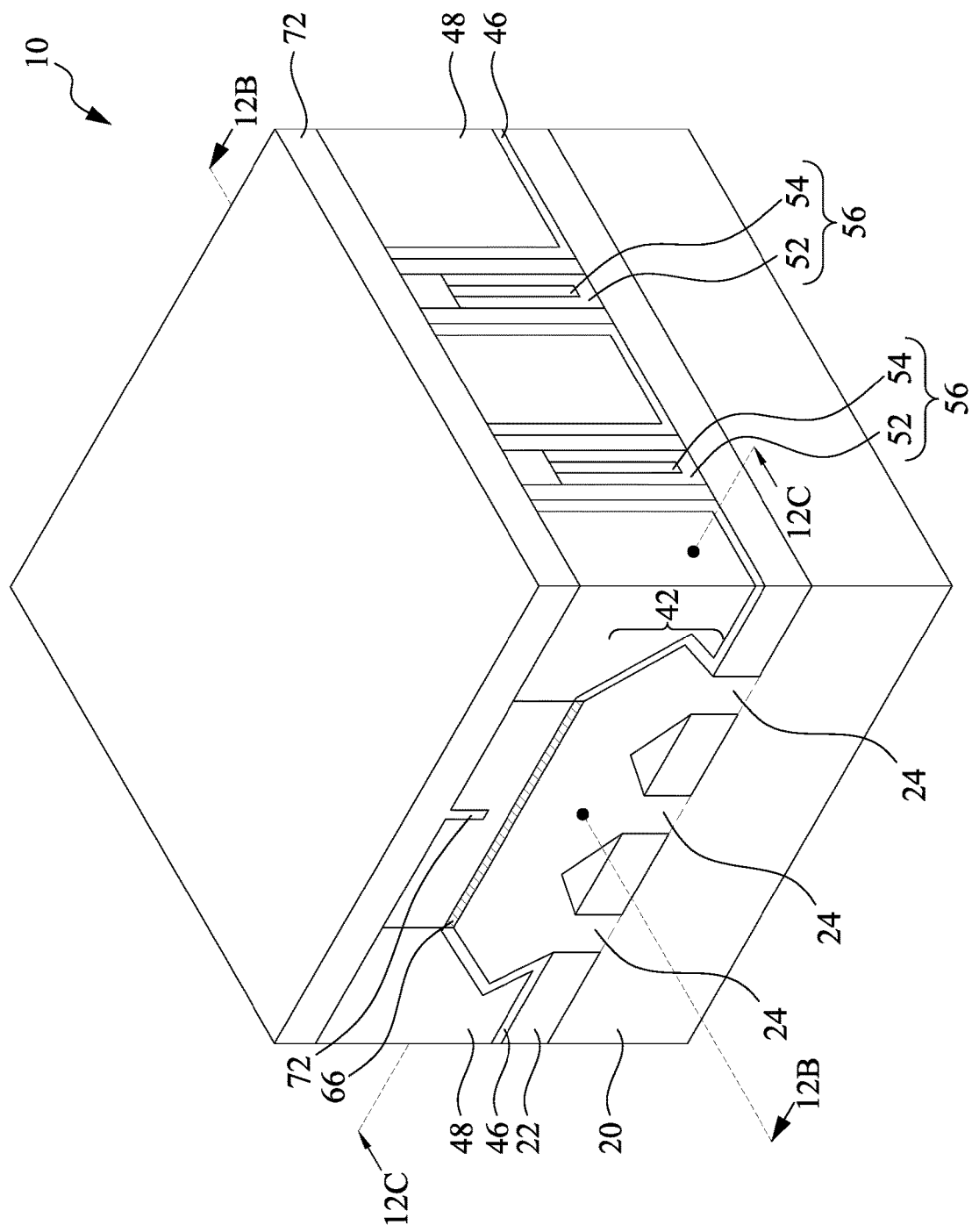
Figure 12B:
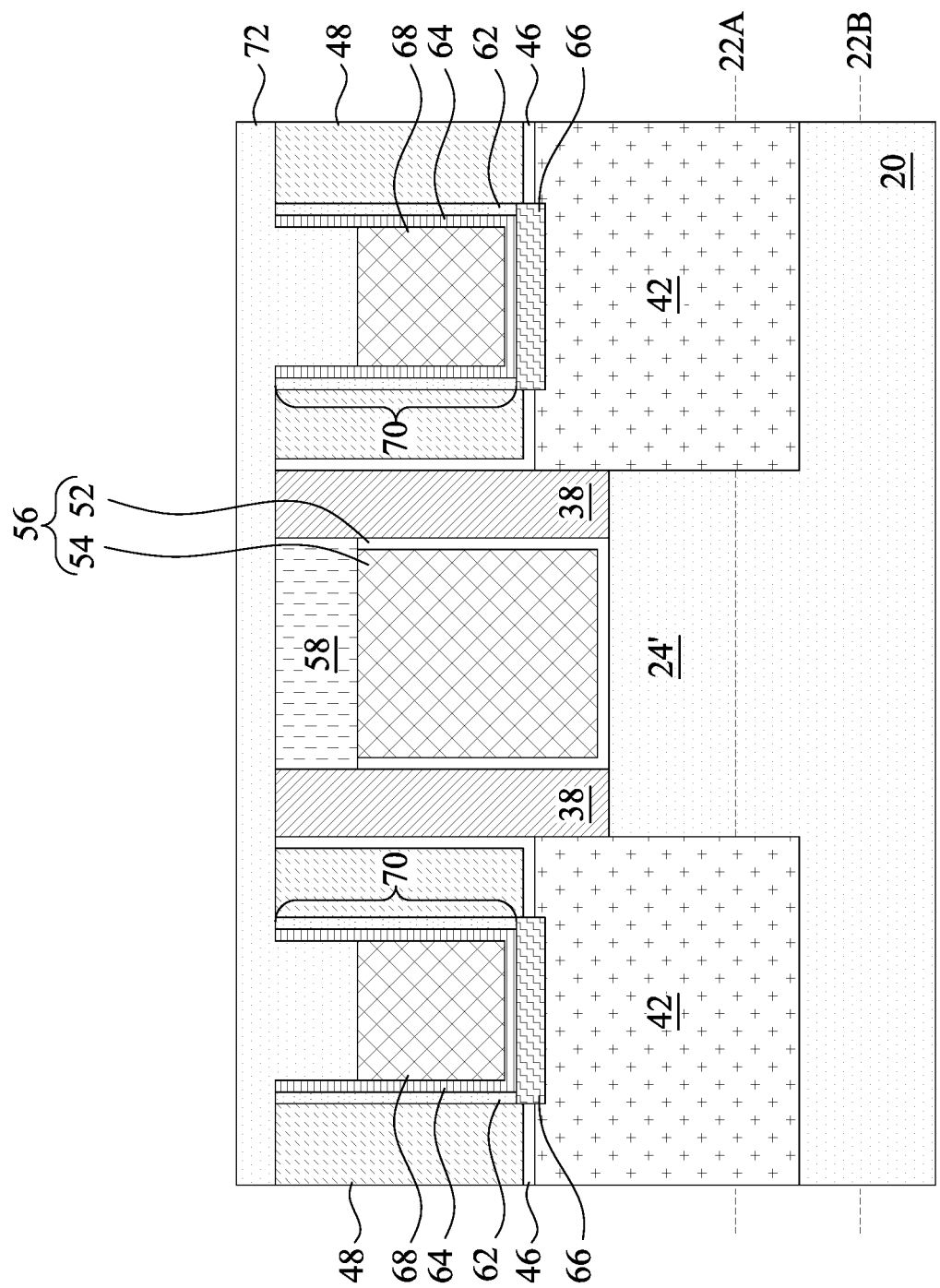
Figure 12C:
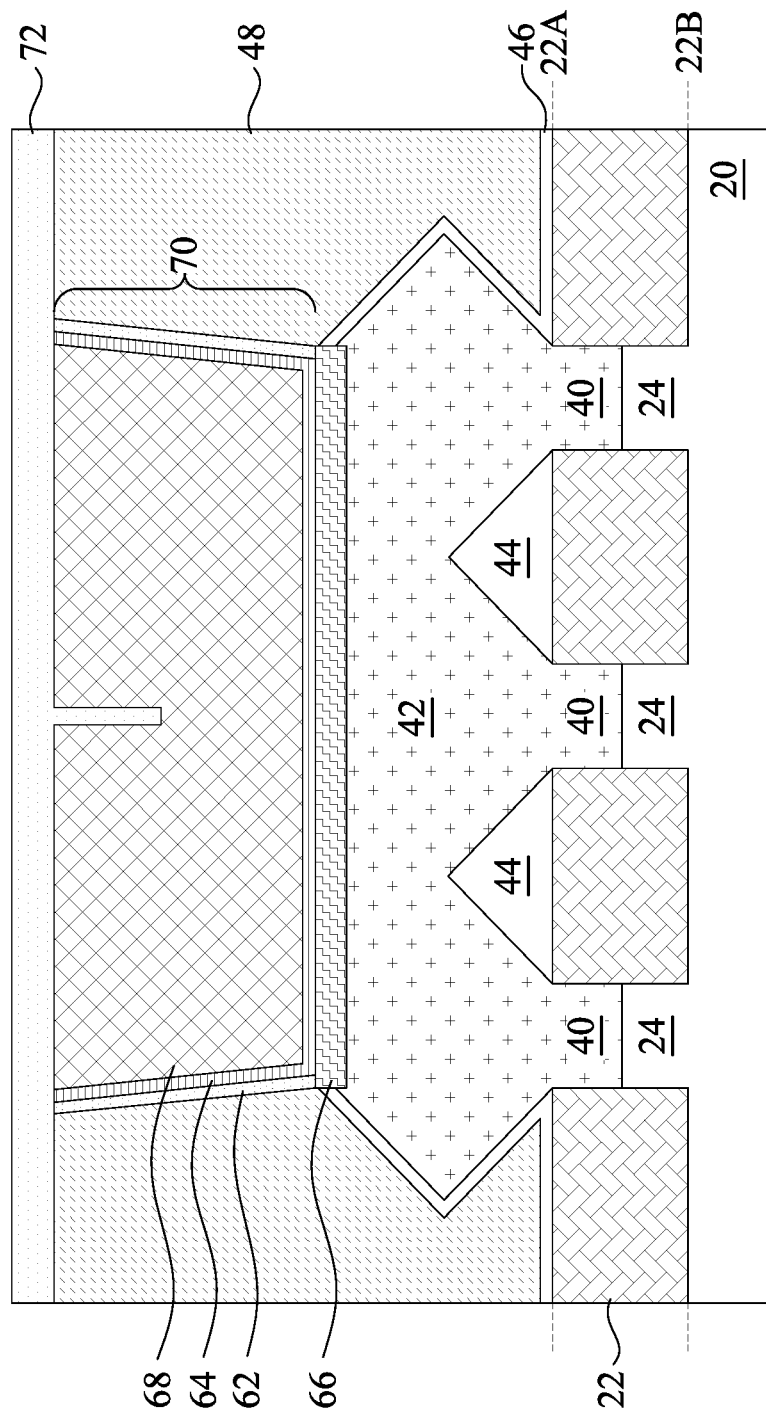

Referring to FIGS. 12A, 12B, and 12C, a dielectric material 72 is deposited over and in the openings 71 of the source/drain contact plugs 70. FIG. 12A illustrates a perspective view, FIG. 12B illustrates the reference cross-section 12B-12B in FIG. 12A, and FIG. 12C illustrates the reference cross-section 12C-12C in FIG. 12A. The respective process is also illustrated as process 222 in the process flow 200 shown in FIG. 29. The dielectric material 72 may be formed of any suitable material by any suitable process. In some embodiments, the dielectric material 72 may be silicon oxide, silicon nitride, silicon oxynitride, aluminum oxide, the like, or combinations thereof. The dielectric material 72 may be deposited in the openings 71 and over the structure by ALD, HDPCVD, CVD, FCVD, spin-on coating, the like.

Figure 13A:
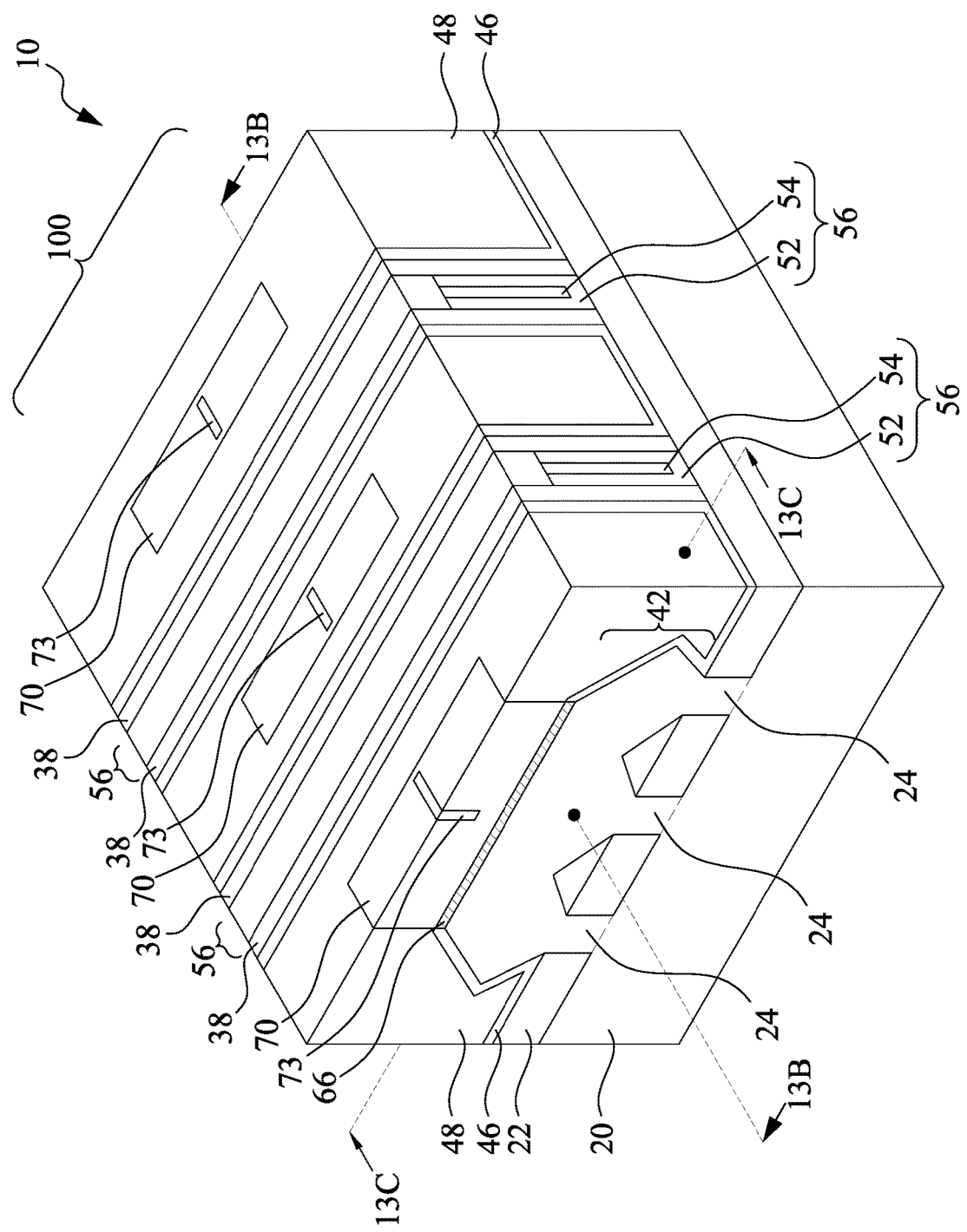
Figure 13B:
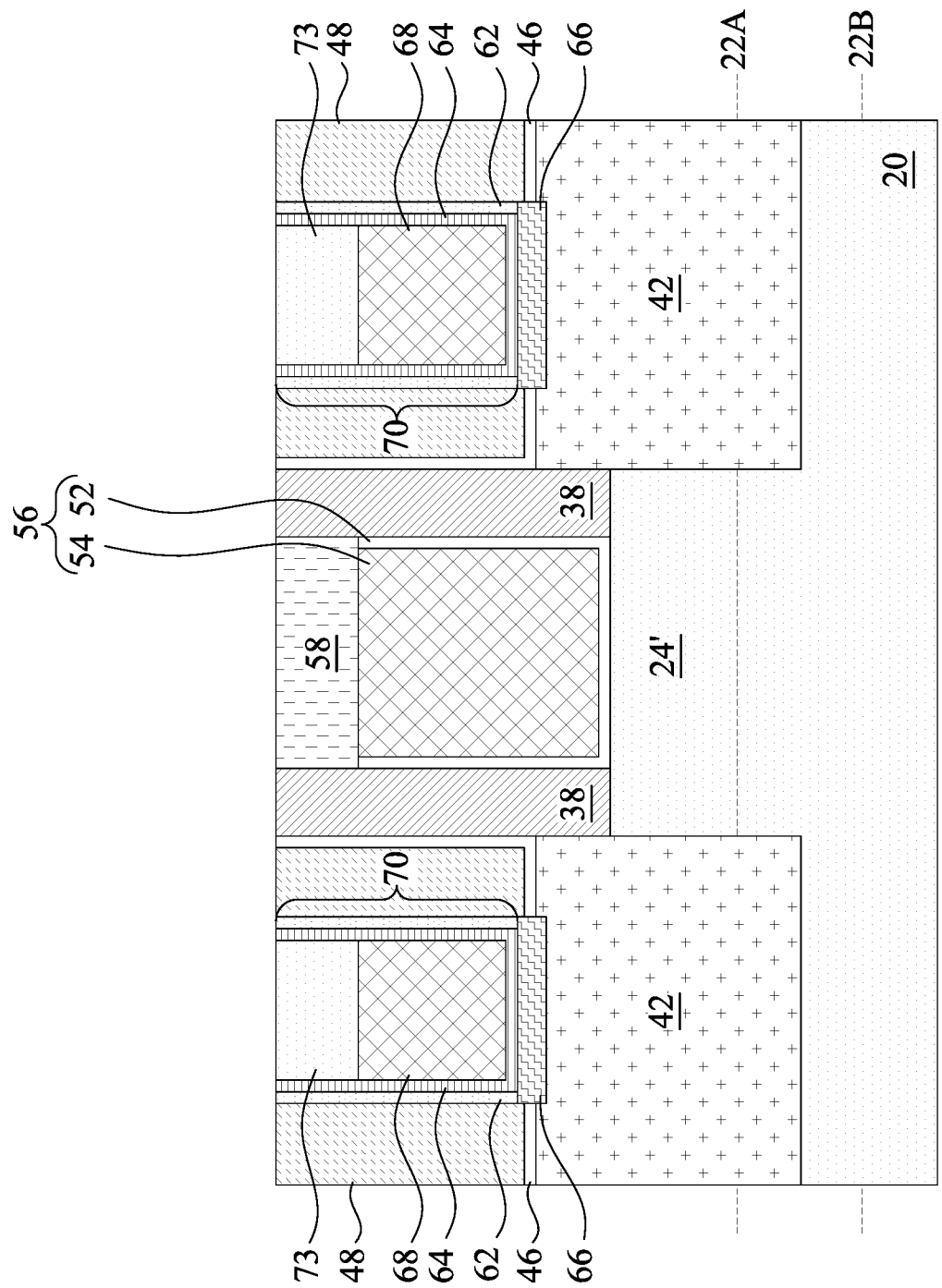
Figure 13C:
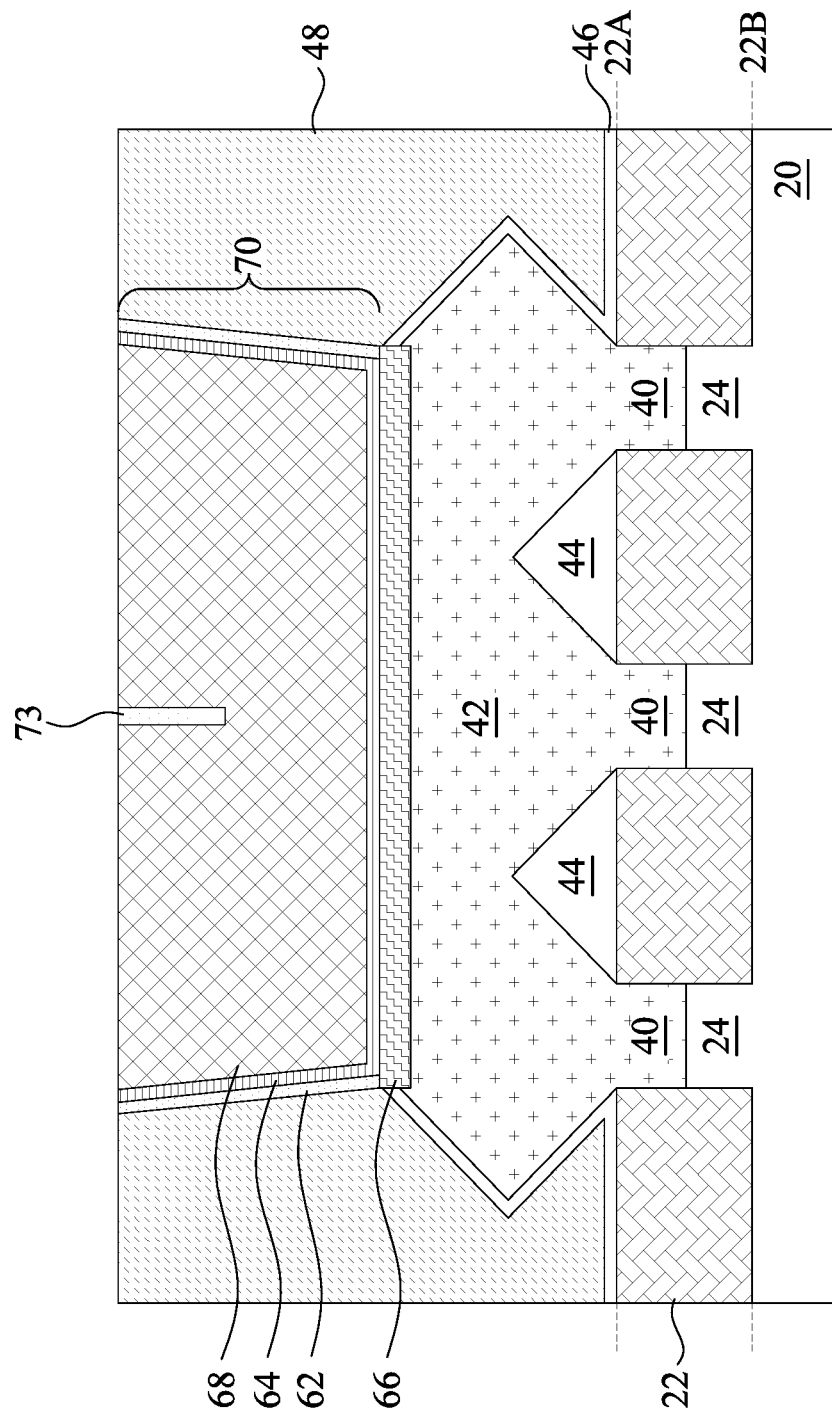

Referring to FIGS. 13A, 13B, and 13C, a planarization process is used to remove portions of the dielectric material 72 over the source/drain contact plugs 70, thereby forming the inter block 73. FIG. 13A illustrates a perspective view, FIG. 13B illustrates the reference cross-section 13B-13B in FIG. 13A, and FIG. 13C illustrates the reference cross-section 13C-13C in FIG. 13A. The respective process is also illustrated as process 222 in the process flow 200 shown in FIG. 29. The planarization process may include a CMP process, a grinding process, an etching process, or combinations thereof.

Figure 14A:
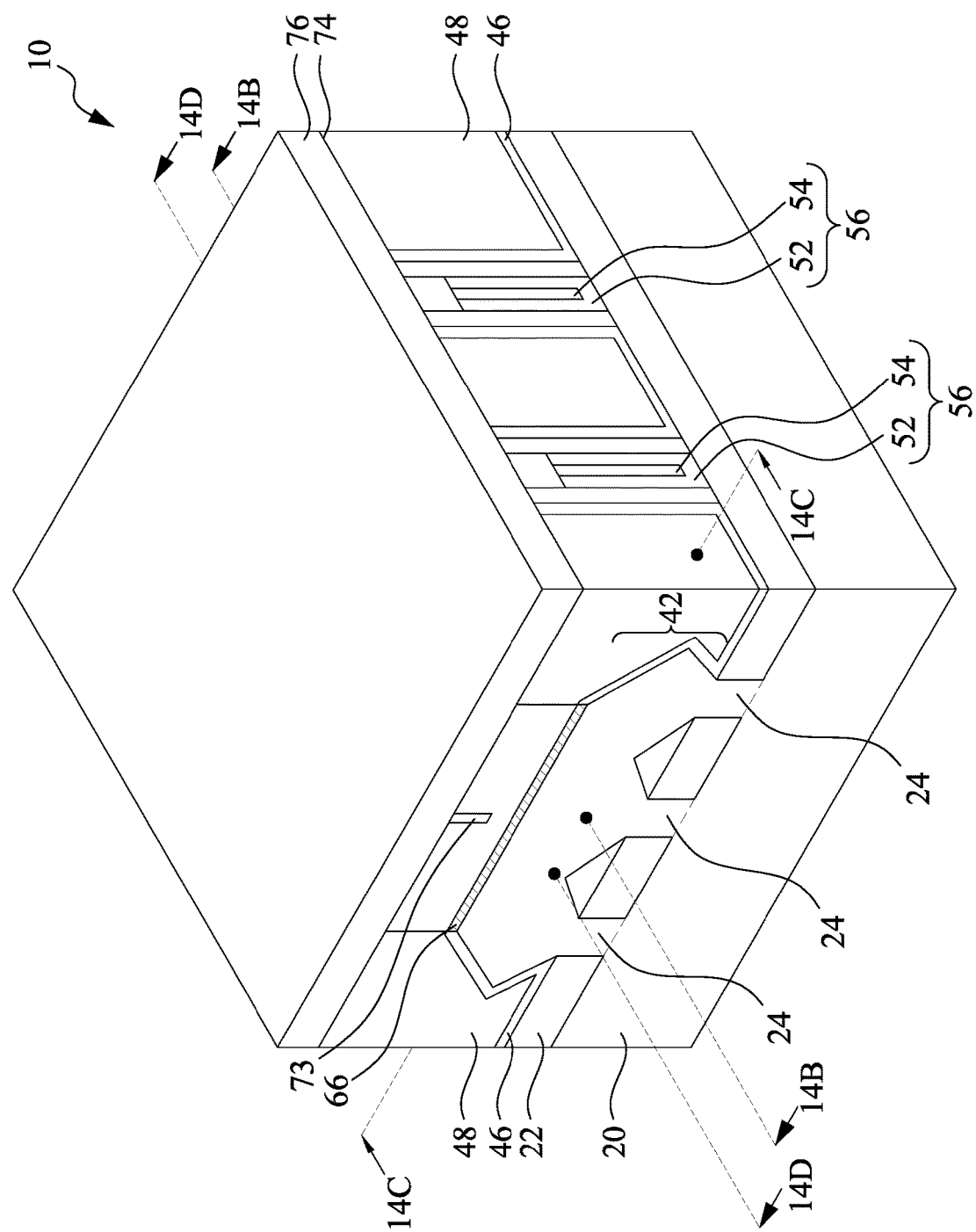
Figure 14B:
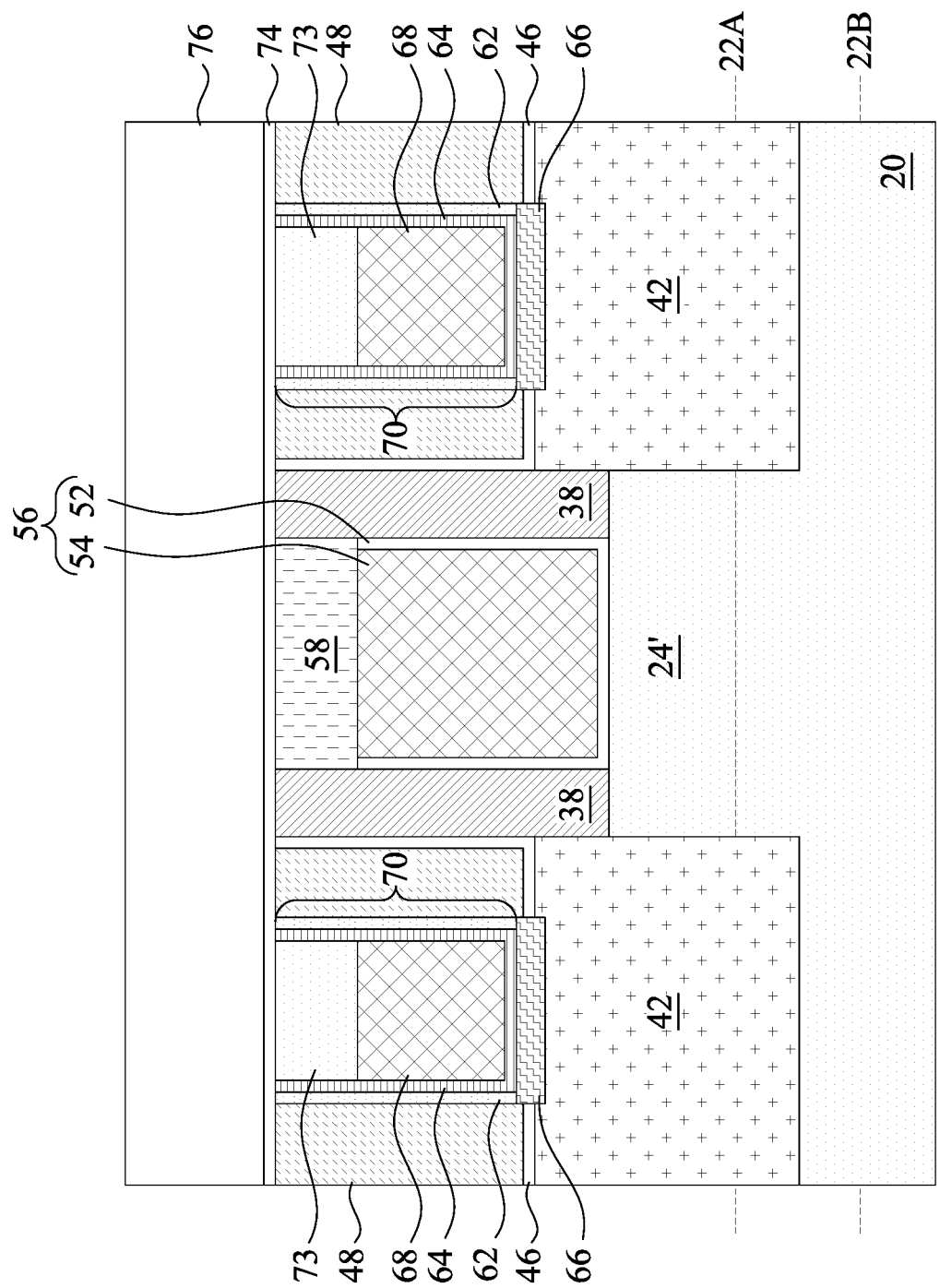
Figure 14C:
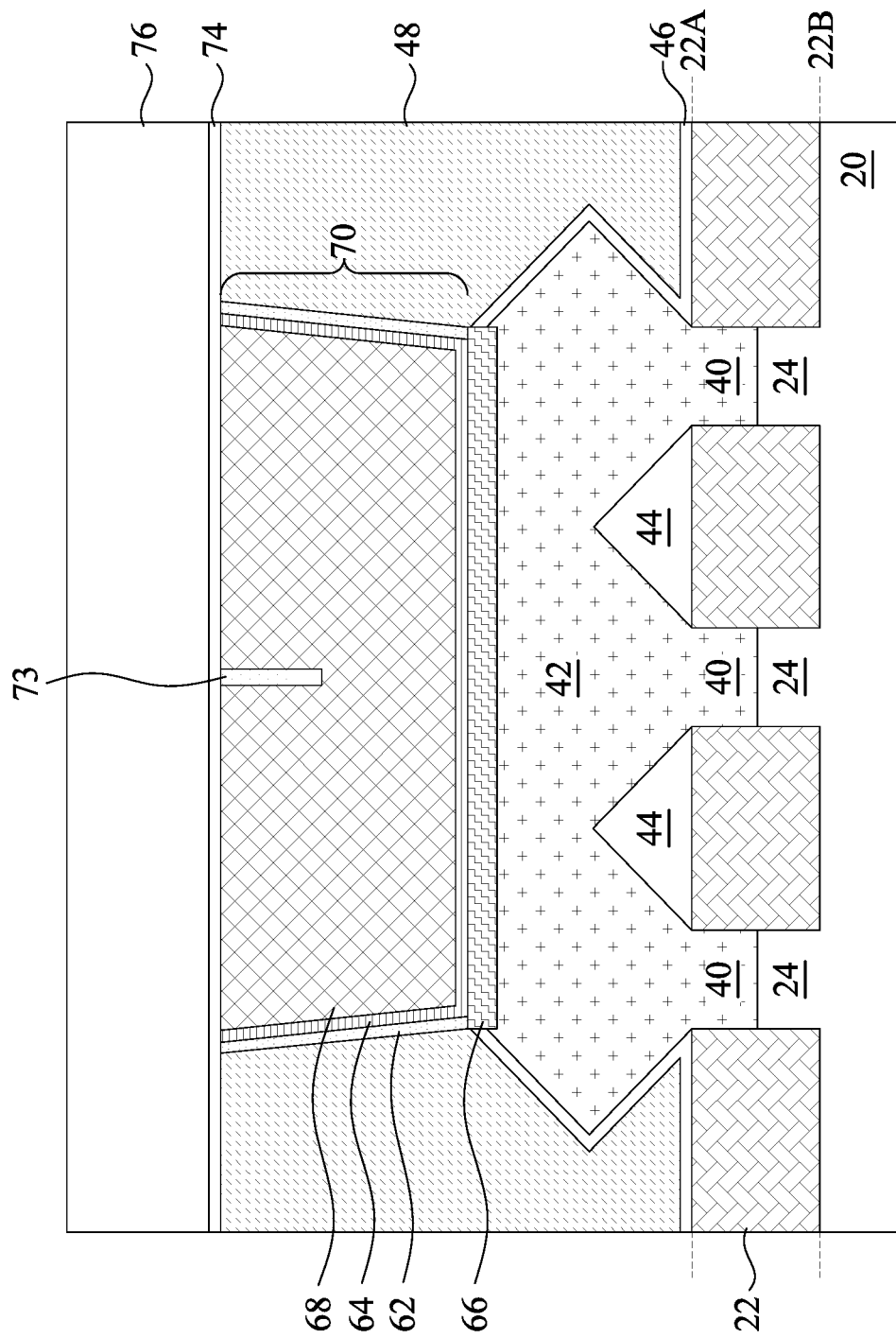
Figure 14D:
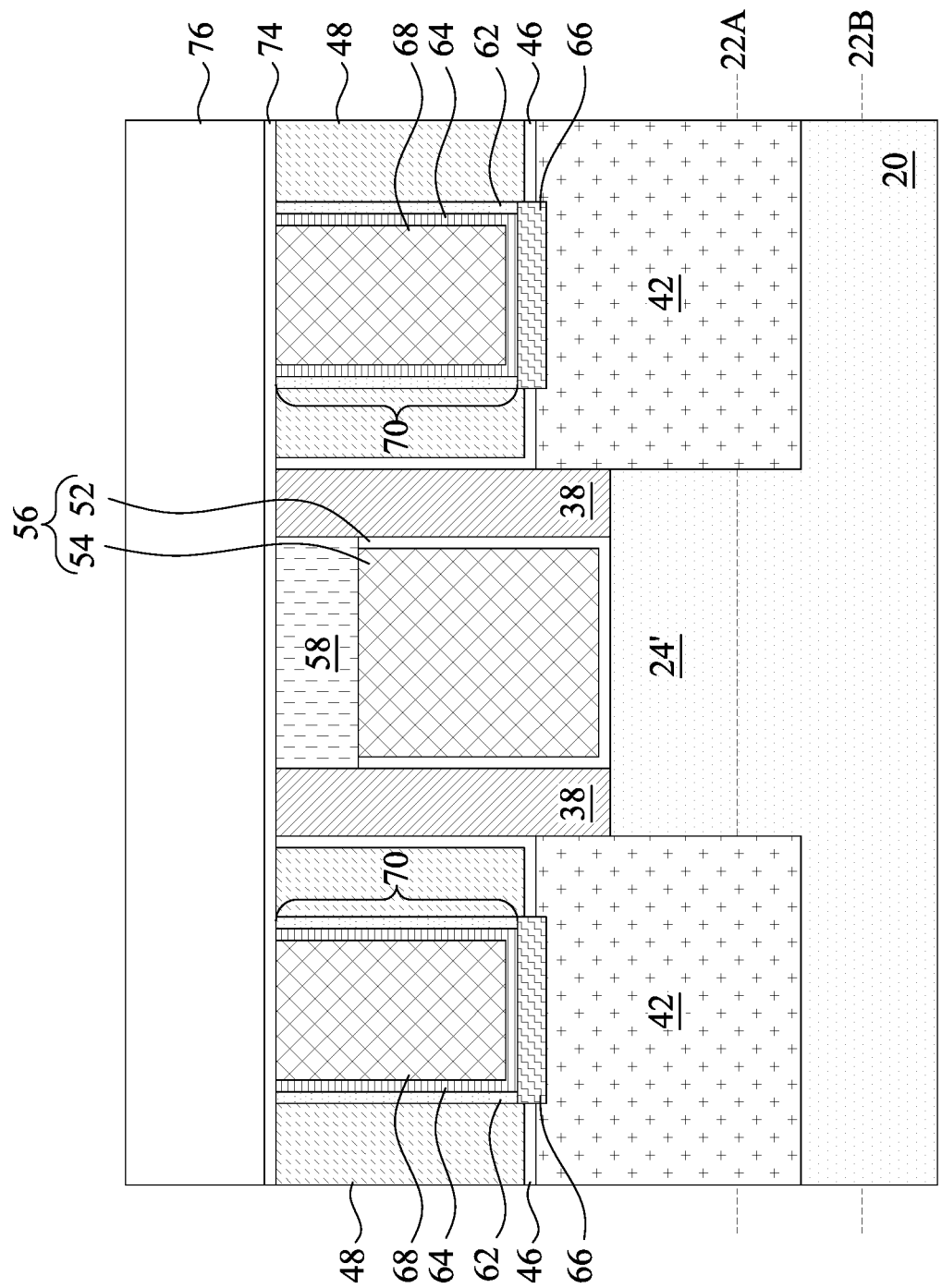

Referring to FIGS. 14A, 14B, 14C, and 14D, etch stop layer (ESL) 74 and inter-layer dielectric (ILD) 76 are deposited. FIG. 14A illustrates a perspective view, FIG. 14B illustrates the reference cross-section 14B-14B in FIG. 14A, FIG. 14C illustrates the reference cross-section 14C-14C in FIG. 14A, and FIG. 14D illustrates the reference cross-section 14D-14D in FIG. 14A. The respective process is illustrated as process 224 in the process flow 200 shown in FIG. 29. ESL 74 may be formed of a dielectric material such as SiN, SiCN, SiC, AlO, AlN, SiOCN, SiOC, or the like, or composite layers thereof. The formation method may include PECVD, ALD, CVD, FCVD, HDPCVD, or the like.

ILD 76 is deposited over ESL 74. The material and the formation method of ILD 76 may be selected from the same candidate materials and formation methods, respectively, for forming ILD 48. For example, ILD 76 may include silicon oxide, PSG, BSG, BPSG, or the like, which includes silicon therein. In accordance with some embodiments, ILD 76 is formed using PECVD, FCVD, HDPCVD, spin-on coating, or the like. In accordance with alternative embodiments, ILD 76 may be formed of a low-k dielectric material.

Figure 15A:
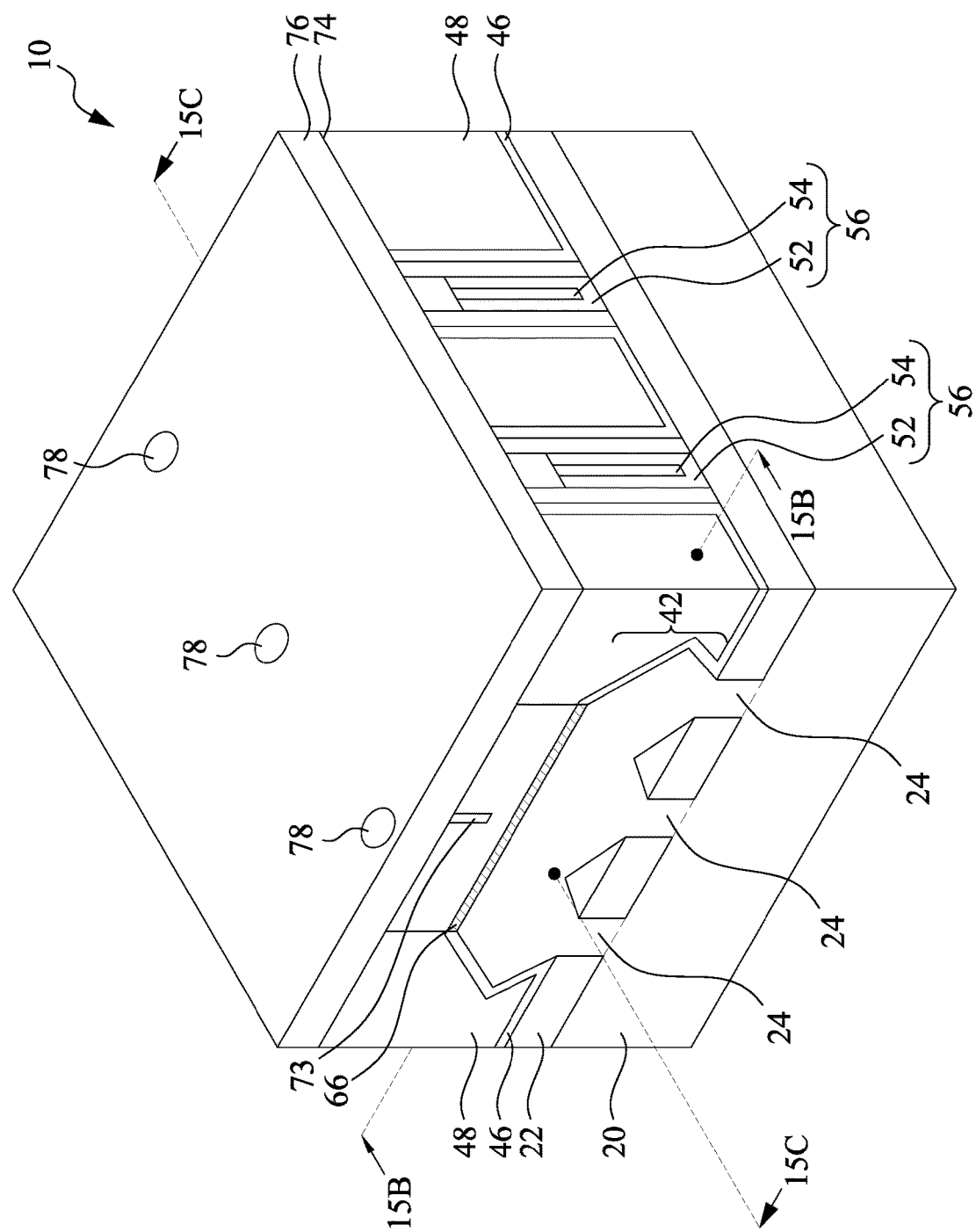
Figure 15B:
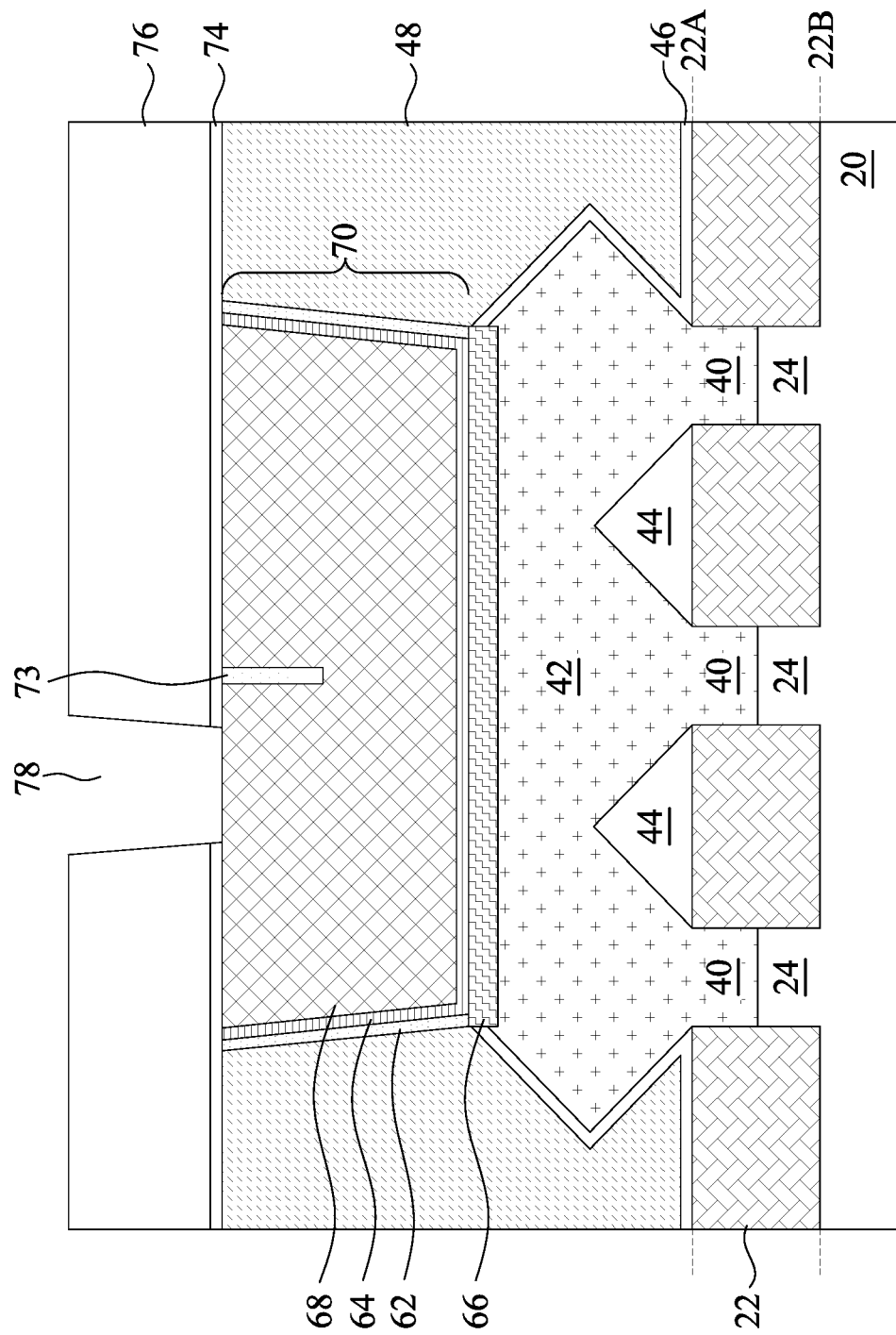
Figure 15C:
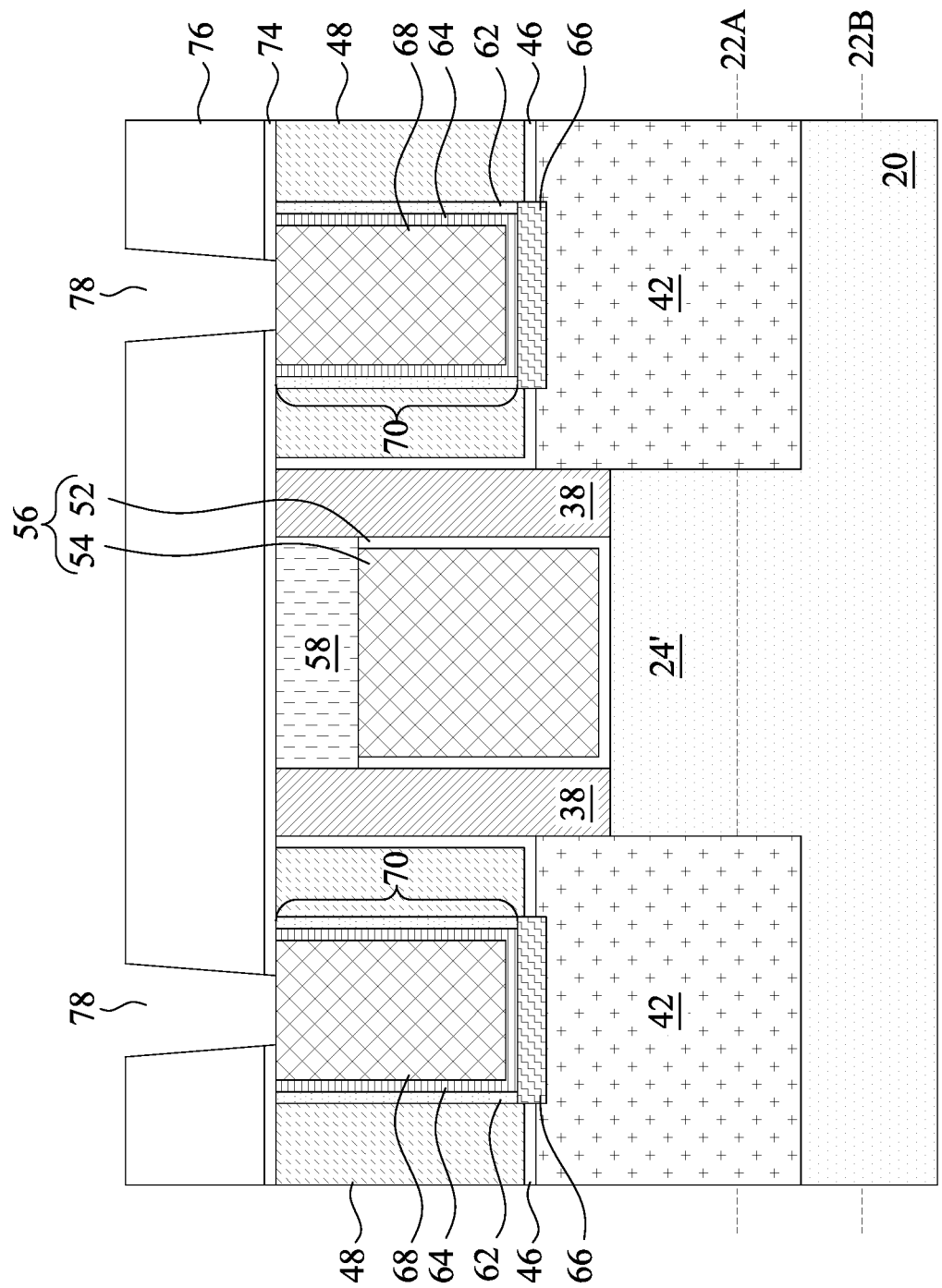

Referring to FIGS. 15A, 15B, and 15C, first contact openings 78 for the first conductive structures 84 are formed. FIG. 15A illustrates a perspective view, FIG. 15B illustrates the reference cross-section 15B-15B in FIG. 15A, and FIG. 15C illustrates the reference cross-section 15C-15C in FIG. 15A. The respective process is illustrated as process 226 in the process flow 200 shown in FIG. 29. An etching mask (not shown), which may be a tri-layer, is formed over the ILD 76. The etching mask is patterned to form openings therein which are then used to define the pattern of the first contact openings 78 in ILD 76. If the etching mask is a tri-layer mask, the top layer may be a photoresist material which is patterned using acceptable photolithography techniques. The top layer is then used to pattern the middle layer by an etching process, and the middle layer is used to pattern the lower layer by another etching process. The lower layer then becomes the etching mask for forming the first contact openings 78. The etching mask is used to protect areas of the ILD 76 which are not to be etched. The ILD 76 is then etched to form the first contact openings 78. In accordance with some embodiments, the etching process includes a main etching process utilizing a suitable etchant selective to the ILD 76, using the ESL 74 as an etch stop.

Next, the ESL 74 is etched to reveal the source/drain contact plugs 70. The respective process is also illustrated as process 226 in the process flow 200 shown in FIG. 29. The ESL 74 etching may be performed using suitable etchant process gases such as $CHF_3$, $C_xH_yF_z$ (x=0~6, y=0~12, z=0~12) while carrier gases such as $N_2$ and/or He, Ar may be added.

As illustrated in FIG. 15B, the first contact opening 78 is disposed above and adjacent to the inter block 73. Although the first contact opening 78 is illustrated as disposed on the left side of the inter block 73, the first contact opening 78 may instead be disposed on the right side of the inter block 73. Further, some of the first contact openings 78 may be on the left of the inter block 73 and some may be on the right of the inter block 73. For example, in one embodiment, the first contact openings 78 may alternate between the left side of the inter block 73 and the right side of the inter block 73 for each source/drain contact plug 70.

Figure 16A:
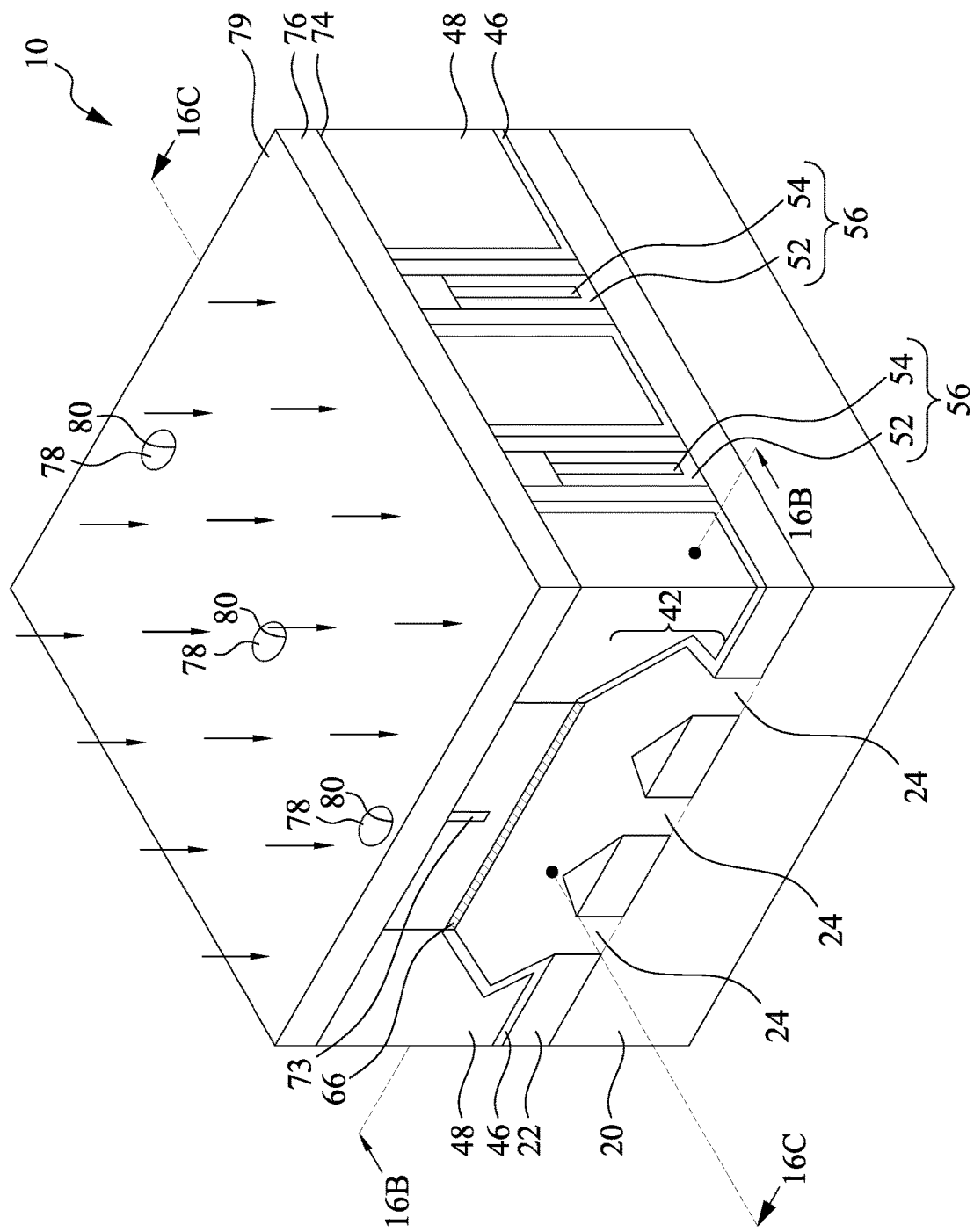
Figure 16B:
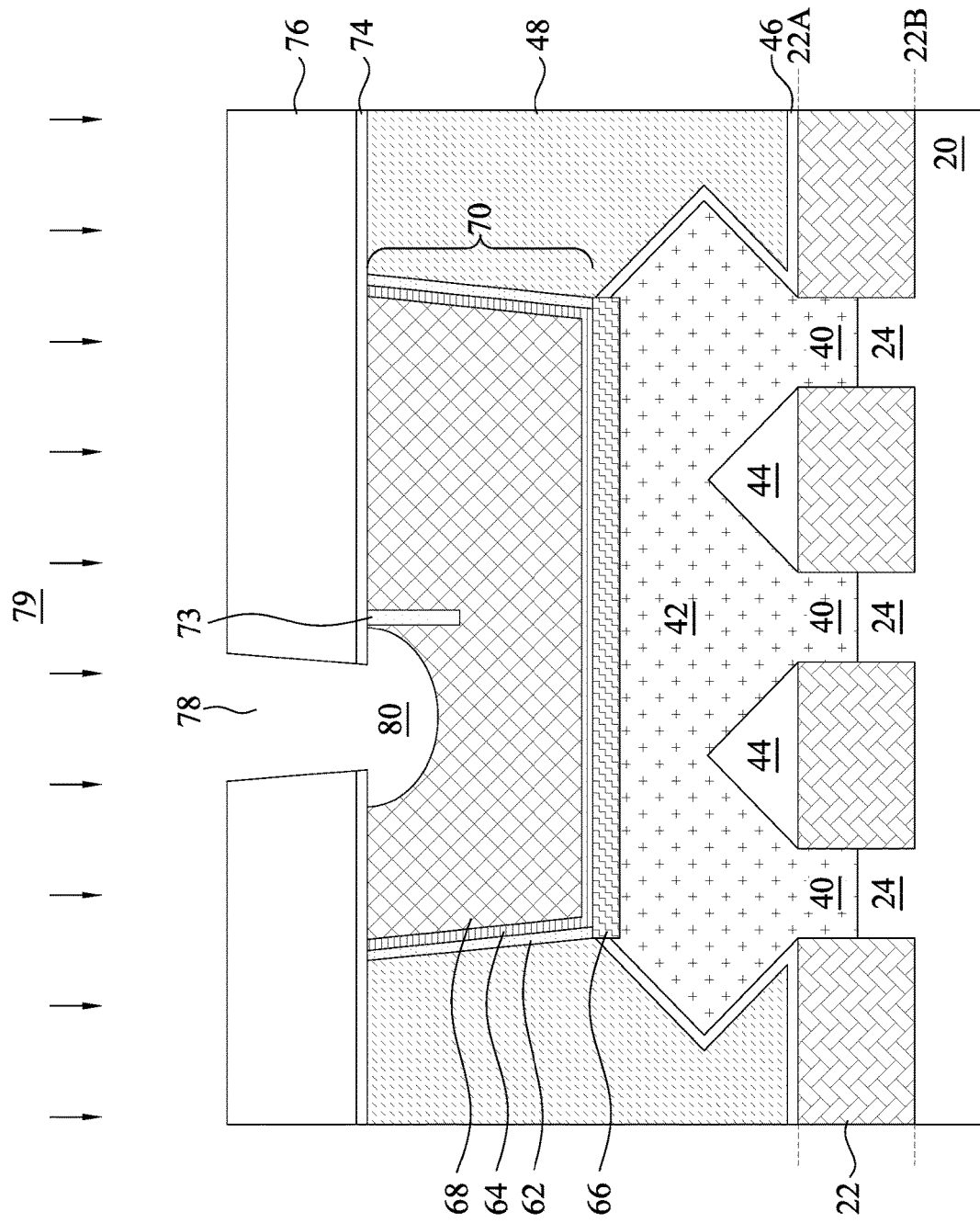
Figure 16C:
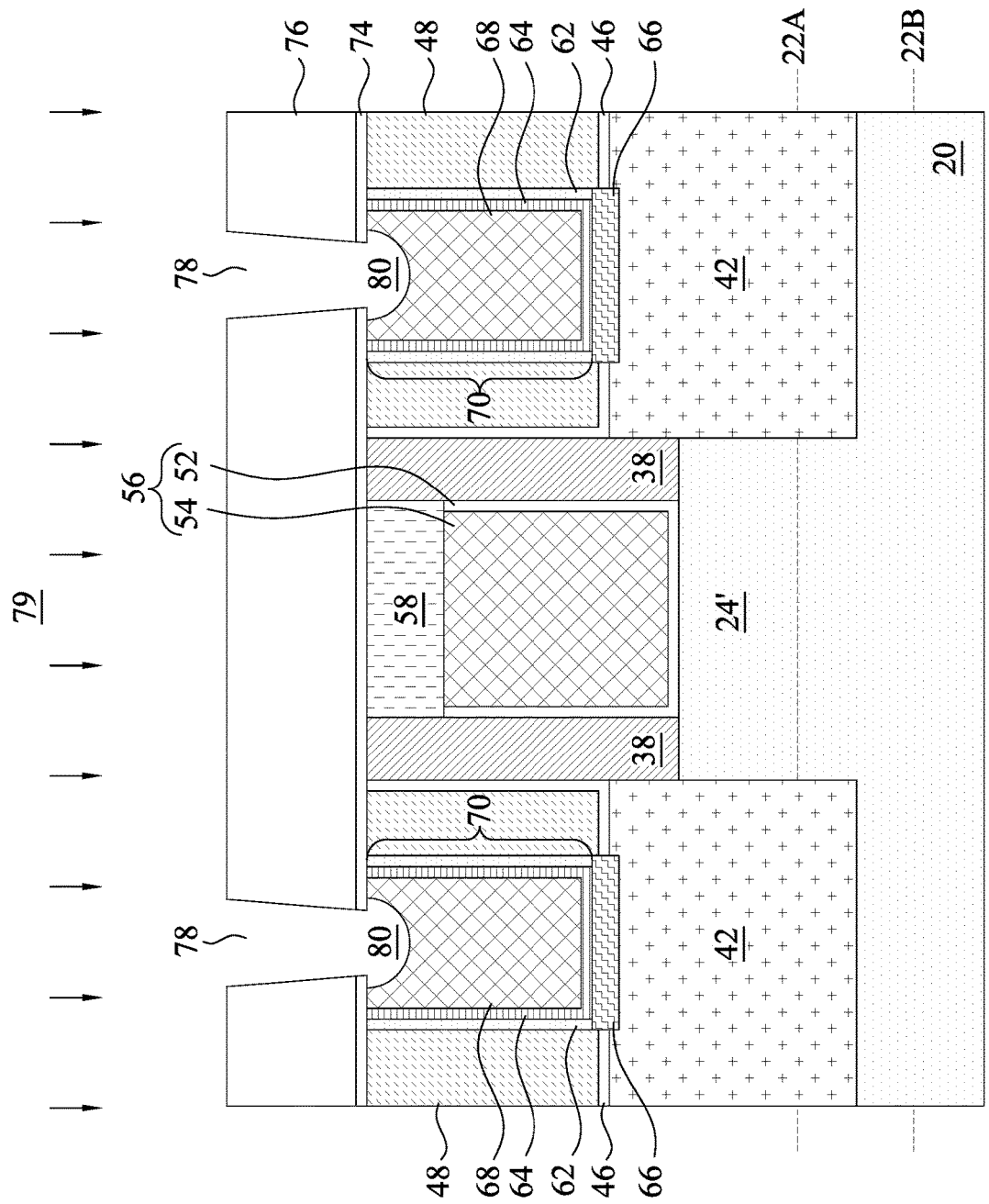

In FIGS. 16A, 16B, and 16C, an etching process 79 is performed on the first contact openings 78 to extend the first contact openings 78 into the metallic regions 68 of the source/drain contact plugs 70 and to form first enlarged openings 80. The first enlarged openings 80 may also be referred to as depressions, recesses, or an inverted mushroom cap. The respective process is illustrated as process 228 in the process flow 200 shown in FIG. 29. The etching process 79 includes the use of an etchant. Following the etching, a follow on cleaning process may be performed using a cleaning agent.

The first enlarged openings 80 provide several advantages. When a subsequent metallic material is deposited in the first enlarged openings 80 and up through the first contact openings 78 the surface area available for the interface between the first enlarged openings 80 and the metallic material is greater so that a bottom-up deposition process has improved adherence to the material of the source/drain contact plugs 70 and lower resistivity. Also, because the first enlarged openings 80 extend laterally further than the bottom of the first contact openings 78, the complete opening is shaped like an inverted mushroom, providing a bottom lip that can help counter any upward force. Further, after the material of the metallic material is deposited in the first enlarged openings 80 and up through the first contact openings 78, the horizontal surface of the deposited contact helps to block any etchant materials that could seep or leak down between the side of the deposited contact and the bottom surface of the ILD 76.

The etching process 79 used to form the first enlarged openings 80 may use any suitable etchant which is selective to the material of the metallic regions 68 of the source/drain contact plugs 70. The etching process 79 can be a wet etch or wet cleaning process where the etchant is provided over the whole surface of the ILD 76 which fills the first contact openings 78 and reacts with the metallic material of the metallic regions 68. For example, where the metallic regions 68 of the source/drain contact plugs 70 include cobalt, the material composition may be CoF (the presence of fluorine resulting from plasma dissociation of process gasses including one or more of $CF_4$, $C_4F_6$, $C_xH_yF_z$ (x=1~6, y=0~12, z=1~12) or C F during the deposition process of the metallic material of the metallic regions 68 of the source/drain contact plugs 70). Aqueous solutions, pure water, deionized water, or organic etchants may be used as the etchant/cleaning agent. Other materials of the source/drain contact plugs 70 may be similarly etched using suitable wet etchants.

The etching of the source/drain contact plugs 70 forms the enlarged openings 80 in the metallic regions 68 of the source/drain contact plugs 70. The first enlarged openings 80 may have a bowl shape. In some embodiments, the first enlarged openings may extend to and reveal part of the inter block 73, as discussed in further detail below with respect to FIGS. 20A, 20B, 20C, and 20D. Following the etching process 79, a cleaning process may be used to clean any etching byproducts. The cleaning process may use any suitable cleaning agent, such as Aqueous solutions, pure water, deionized water, the like, or combinations thereof.

Figure 17A:
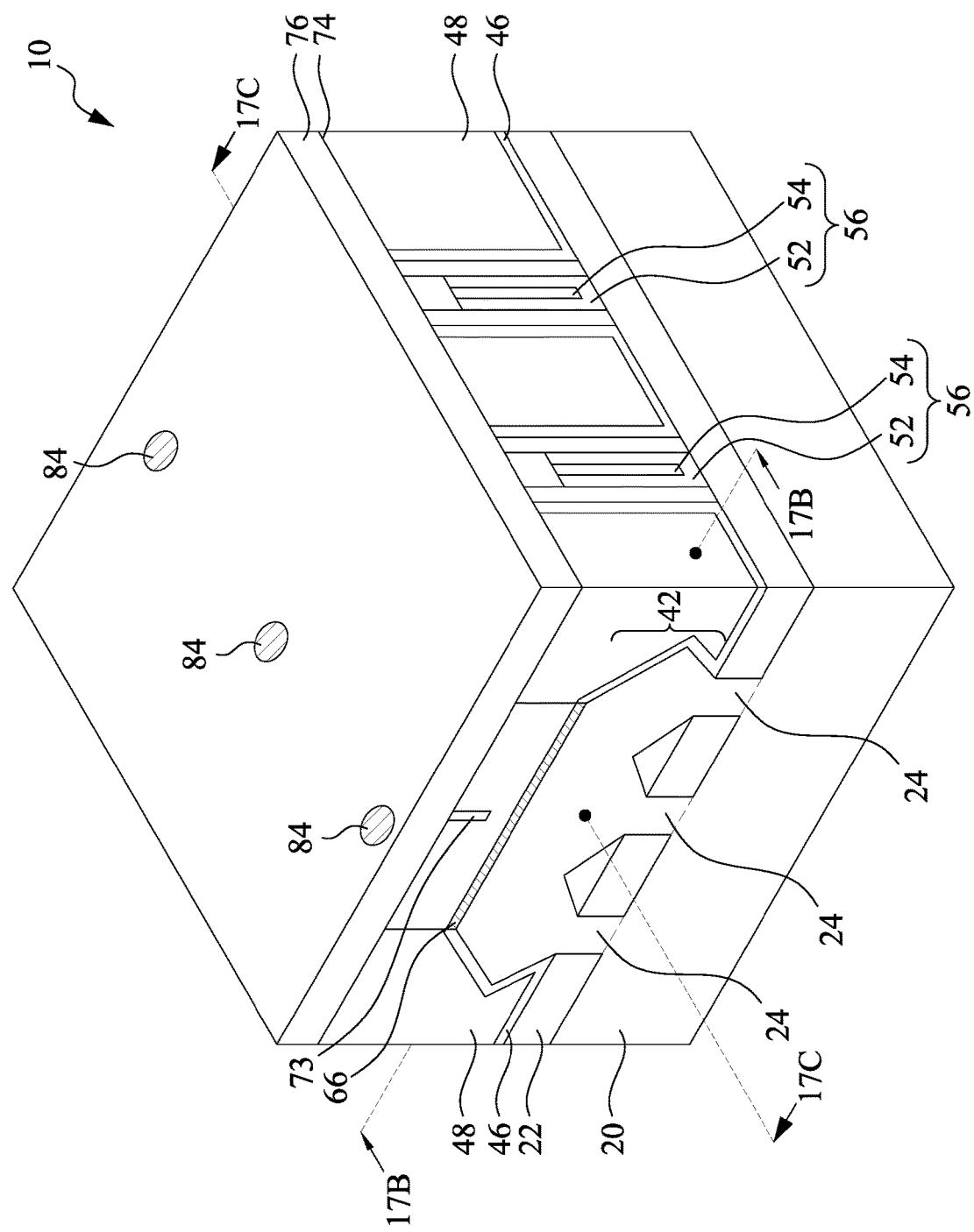
Figure 17B:
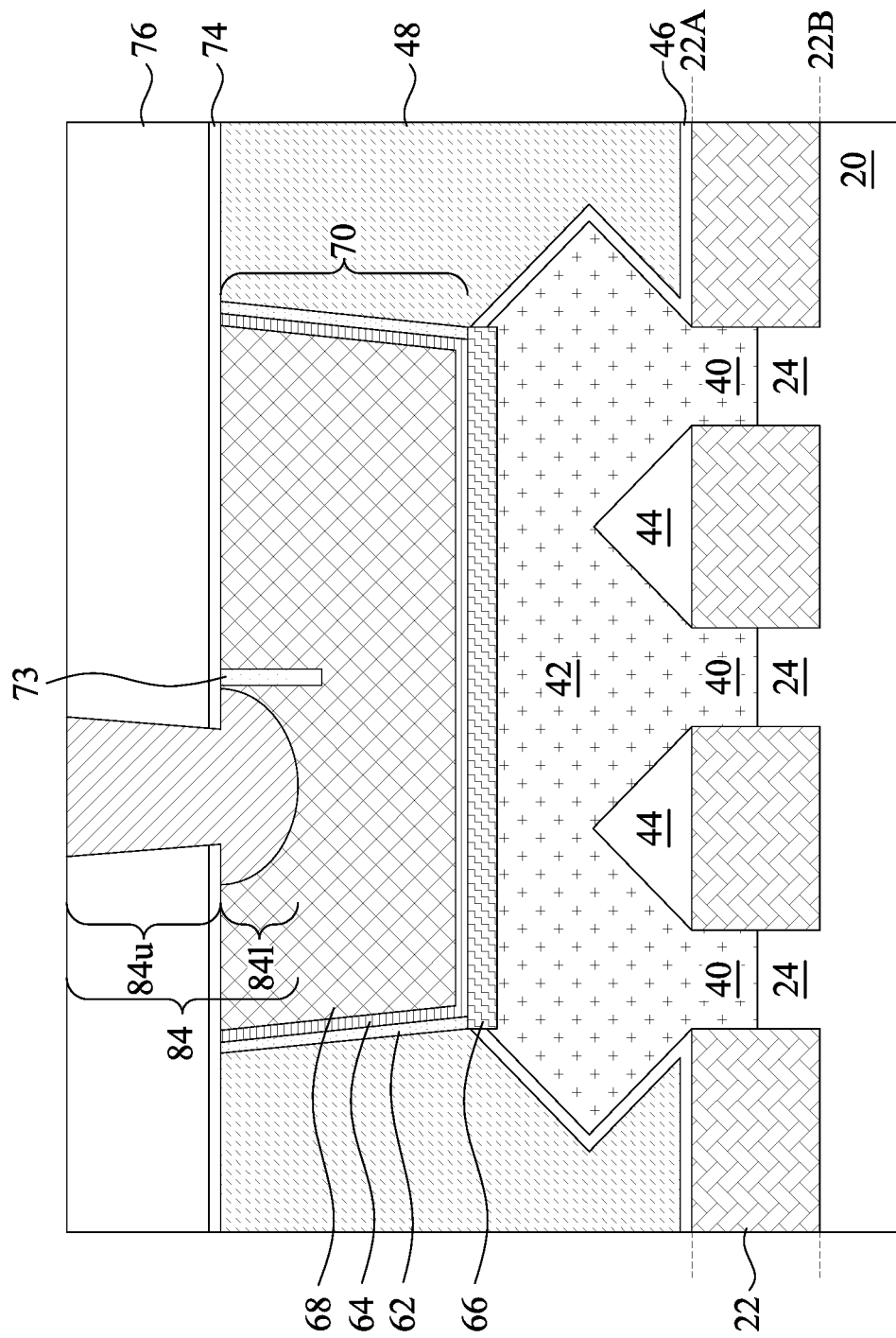
Figure 17C:
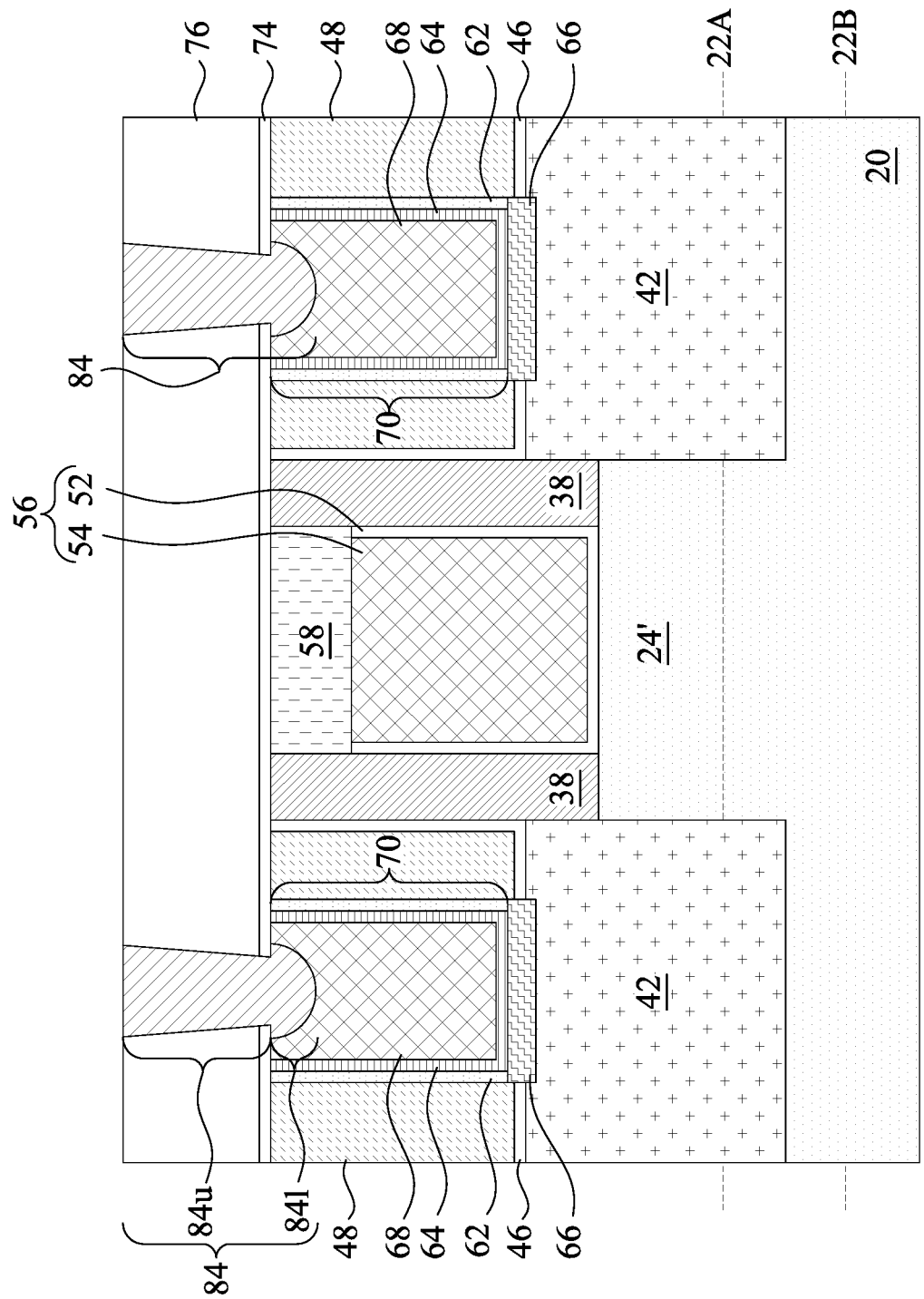

In FIGS. 17A, 17B, and 17C, a metallic material is filled into the first enlarged openings 80 and in the first contact openings 78, and may continue to be deposited to extend above and laterally over the top of the ILD 76. The respective process is illustrated as process 230 in the process flow 200 shown in FIG. 29. In accordance with some embodiments, the metallic material comprises a metal such as Ru, Co, Ni, Cu, Al, Pt, Mo, W, Al, Ir, Os, or combinations thereof. The metallic material is deposited using a bottom-up deposition process, which may be performed using a thermal Chemical Vapor Deposition (CVD) process. The temperature of wafer 10 may be in the range between 50° C. and about 400° C. The bottom-up deposition process may be performed using $WF_6$ and $H_2$ as process gases (when tungsten is to be deposited), or use other process gases when other materials are adopted. With the bottom-up deposition, the first enlarged openings 80 and the first contact openings 78 may be filled with no air-gap generated therein. The deposition method may also include CVD, ALD, PVD, ECP, ELD, or the like.

The deposition of the metallic material may be performed in a temperature range between about 50° C. and about 500° C., with carrier gas including argon or nitrogen with flow rate of about 10 sccm and about 500 sccm in accordance with some embodiments. Reactant gases such as the metalcontaining precursor, $H_2$, $O_2$, $NH_3$, or the like may be added, with flow rates of about 10 sccm and about 500 sccm, and pressure in the range between about 0.00001 Torr and about 10 Torr in accordance with some embodiments.

In accordance with some embodiments, the metallic material is formed of a homogenous material, and does not include a barrier layer. In accordance with alternative embodiments, the metallic material is formed of a homogenous material, and there is a conformal barrier layer (not shown) formed before the metallic material is deposited. The conformal barrier layer may be formed of titanium, titanium nitride, tantalum, tantalum nitride, or the like.

Still referring to FIGS. 17A, 17B, and 17C, a planarization process is used for removing excess portions of the metallic material (which may extend laterally over the top of the ILD 76), and hence first conductive structures 84 are formed. The respective process is also illustrated as process 230 in the process flow 200 shown in FIG. 29. The first conductive structures 84 include lower (expanded) portions 84*l*, which extend into the metallic regions 68 of the source/drain contact plugs 70, and upper portions 84*u*, which are disposed in the ILD 76 and laterally surrounded by the ILD 76. The lower portions 84*l* may be considered contact extensions or contact extension regions of the first conductive structures 84. The lower portion 84*l* of the first conductive structures 84 extend laterally beyond the respective overlying upper portions 84*u*. In the illustrated embodiment of FIGS. 17A, 17B, and 17C, the upper portions 84*u* are aligned to the lower portions 84*l* of the first conductive structures 84. In other words, the side-to-side centers of the upper portions 84*u* are aligned with the side-to-side centers of the lower portions 84*l*. In other embodiments, such as will be discussed in greater detail with respect to FIGS. 24A, 24B, 24C, and 24D, the upper portions 84*u* may not be aligned to the lower portions 84*l* of the first conductive structures 84. In other words, the side-to-side centers of the upper portion 84*u* are not aligned with (or are offset from) the side-to-side centers of the lower portion 84*l*.

Due to the lower portions 84*l*, the resulting first conductive structures 84 have the advantage of providing greater stability to counter upward force. The lower portions 84*l* are wider than the bottom of the upper portions 84*u*, providing a lip of the first conductive structures 84, which resists upward force. A further advantage of the lower portions 84*l* of the first conductive structures 84 results from the exposed surface area of the metallic regions 68. The greater surface area provides better adherence of the first conductive structures 84 to the metallic region 68. The greater surface area also reduces conductive resistance between the metallic region 68 and the first conductive structures 84.

Figure 18A:
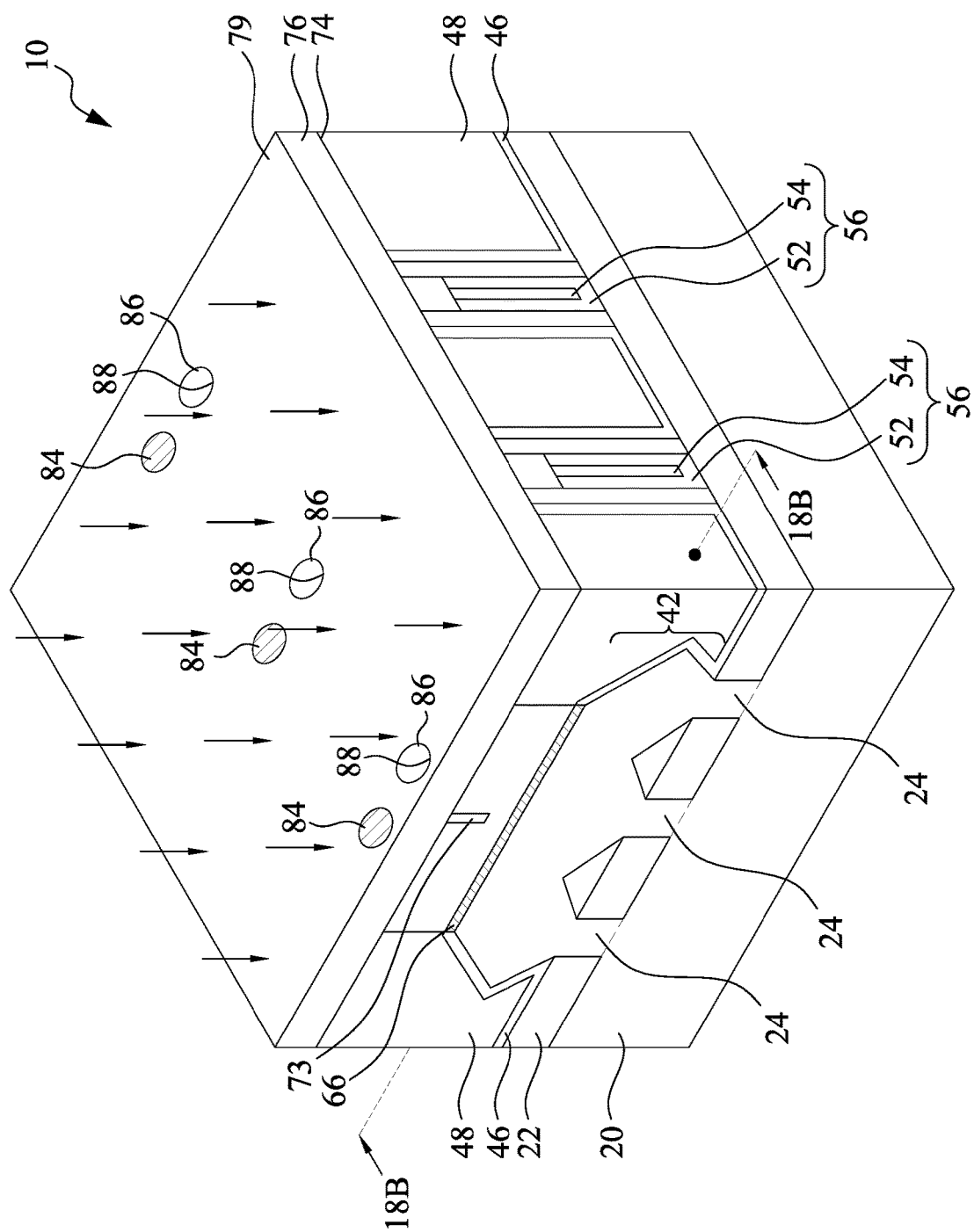
Figure 18B:
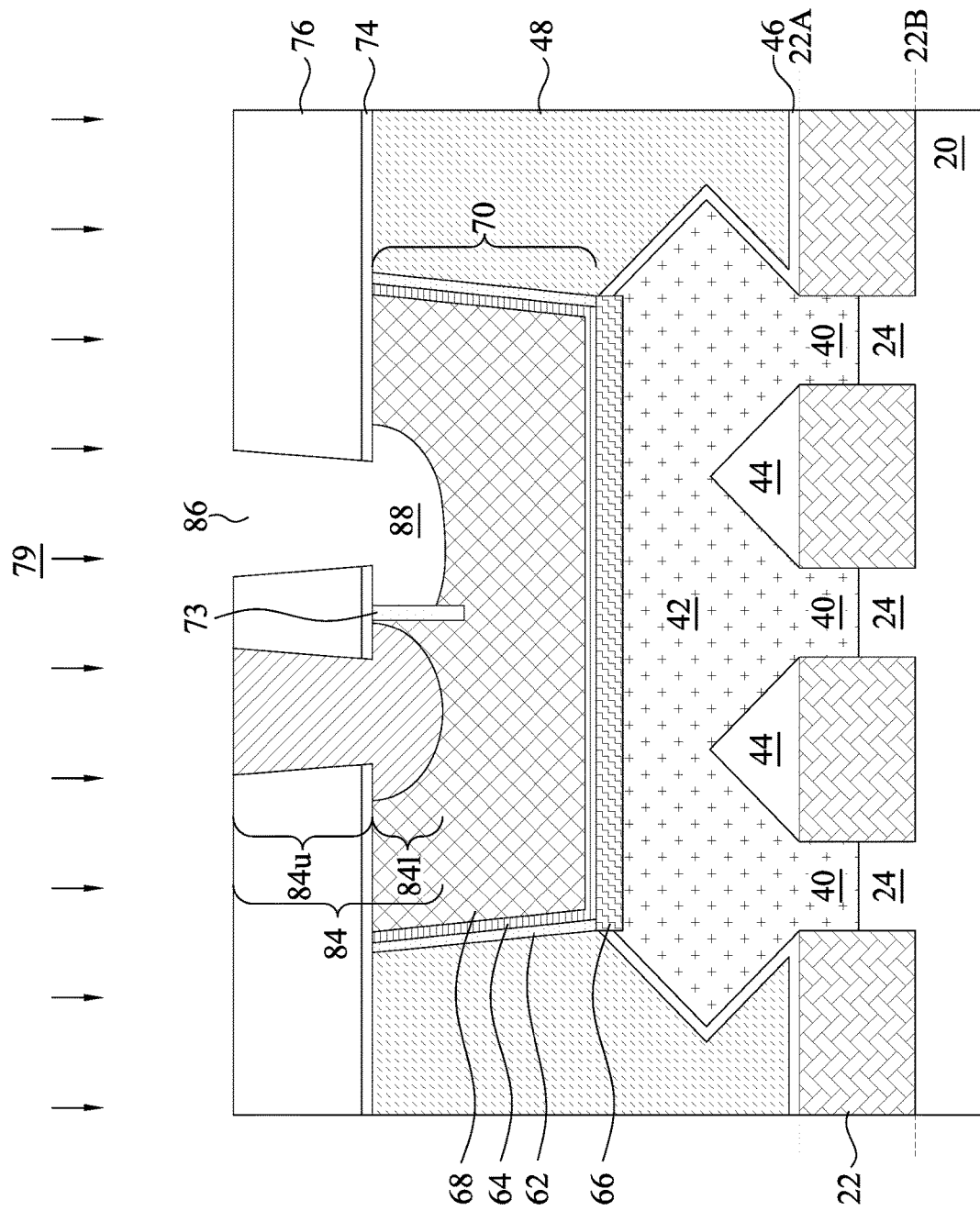

In FIGS. 18A and 18B, second contact openings 86 and second enlarged openings 88 are formed on the other side of the inter block 73 from the first conductive structures 84. FIG. 18A illustrates a perspective view and FIG. 18B illustrates a view on the reference cross-section 18B-18B in FIG. 18A. The respective process is illustrated as process 234 in the process flow 200 shown in FIG. 29. The second contact openings 86 may be formed using processes and materials similar to those discussed above with respect to the first contact openings 78. The second enlarged openings 88 may be formed using processes and materials similar to those discussed above with respect to the first enlarged openings 80. As will be discussed in greater detail below, the second enlarged openings 88 may be subsequently filled with second conductive structures 94 which are formed of a different material than the first conductive structures 84. As illustrated in FIG. 18B, the second enlarged opening 88 may extend laterally to expose a portion of the inter block 73. The size of the second enlarged opening 88 may be increased by increasing the etching dwell time and/or by including multiple etching processes in forming the second enlarged opening 88.

When the etching process, such as the etching process 79, is used to form the second enlarged openings 88, the inter block 73 prevents etchant from contacting the first conductive structures 84 as well as cleaning agents (if used) from contacting the first conductive structures 84. As noted above, the first conductive structures 84 may be made from a different material than the metallic region 68, creating a condition where galvanic effects can be an issue. If the wet etchant or cleaning agent were to contact the interface of the first conductive structures 84 and the metallic region 68, a galvanic reaction could occur, causing an increase in resistivity. A galvanic reaction occurs due to an exchange of electrons due to the differences in electrode potential between two dissimilar materials which are coupled through an electrolyte. For example, if one of the materials of the metallic region 68 and first conductive structures 84 is cobalt and the other is tungsten, because the difference in electrode potential between cobalt and tungsten is significant, if an electrolyte (such as a wet etchant or cleaning agent) was introduced to their interface, then galvanic corrosion would occur. Tungsten is more reactive than cobalt. Thus, if the interface between the first conductive structure 84 and the metallic region 68 is exposed to the etchant solution and/or the cleaning agent a galvanic reaction may occur between the tungsten and the cobalt, the tungsten losing electrons to the cobalt, causing oxidation of the tungsten and galvanic corrosion at the interface. The same issue may occur with any two dissimilar metals. For example, both tungsten and cobalt have a higher electrode potential than titanium nitride.

Figure 19A:
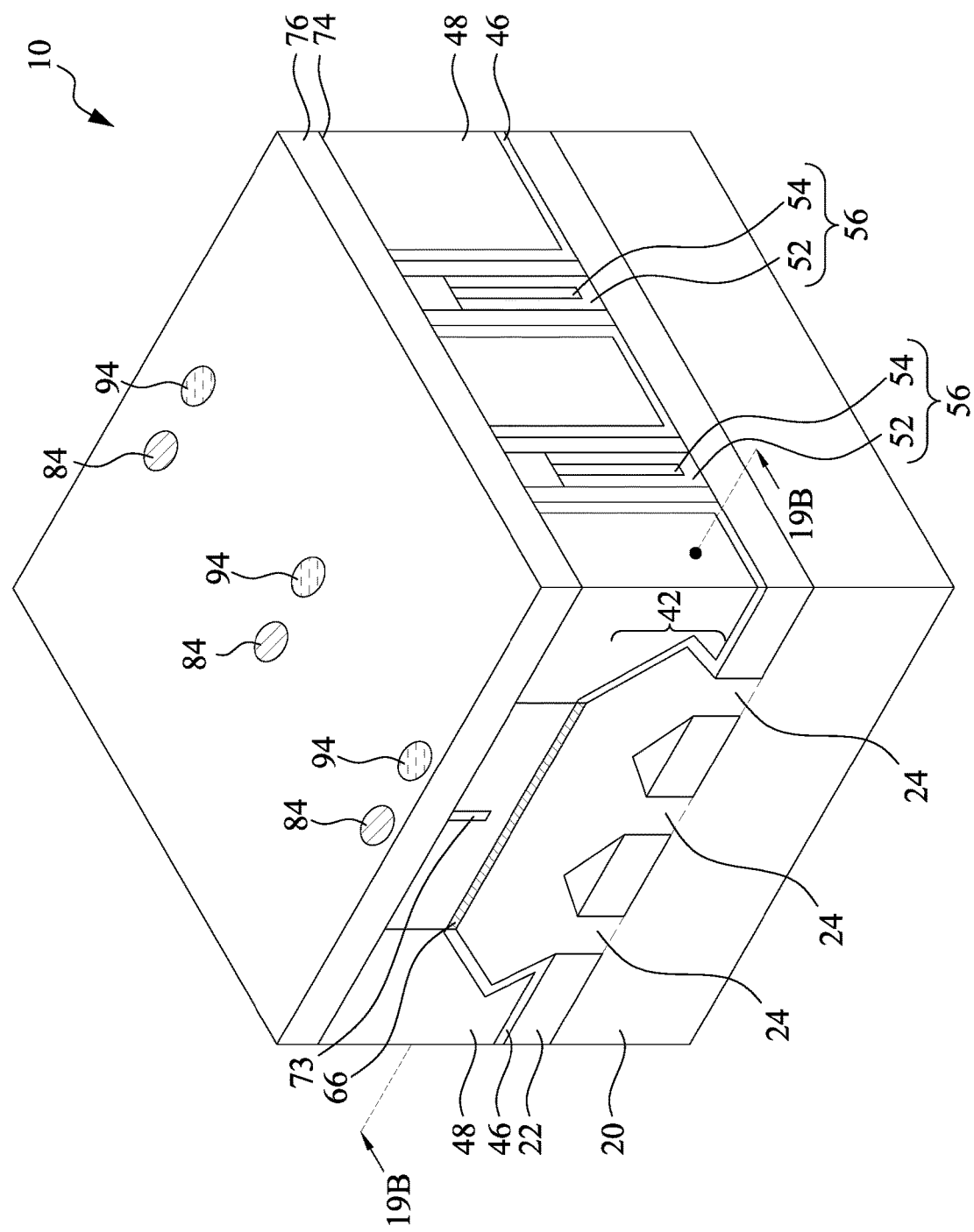
Figure 19B:
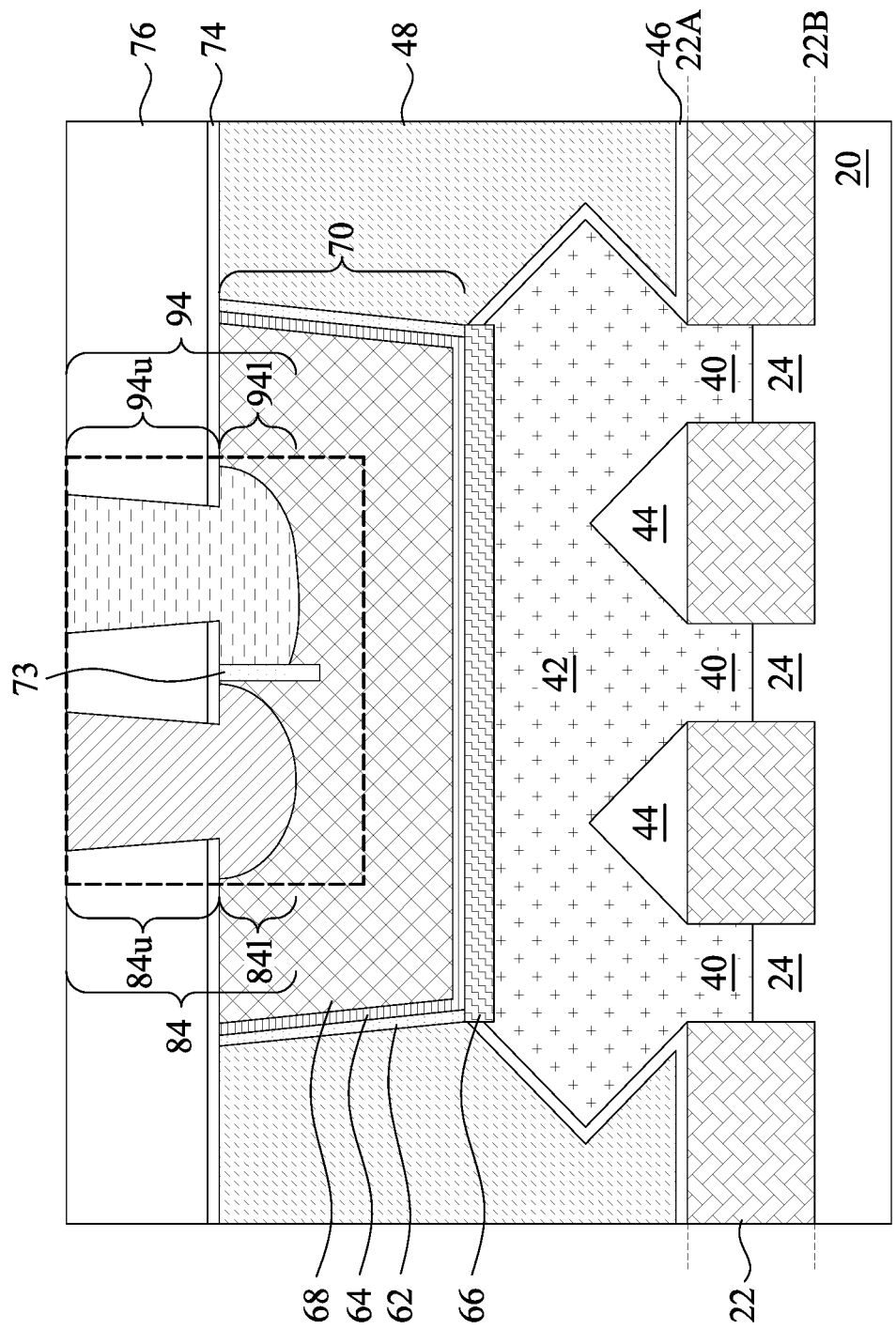

In FIGS. 19A and 19B, second conductive structures 94 are formed in the second contact openings 86 and in the second enlarged openings 88. FIG. 19A illustrates a perspective view and FIG. 19B illustrates a view on the reference cross-section 19B-19B in FIG. 19A. The respective process is illustrated as process 236 in the process flow 200 shown in FIG. 29. The second conductive structures 94 may be formed using processes and material similar to those used above to form the first conductive structures 84. In some embodiments, the second conductive structures 94 may be formed from a different material than the first conductive structures 84. In such embodiments, because the inter block 73 is disposed in the metallic region 68, the first conductive structure 84 is prevented from contacting the second conductive structure 94. As such, a galvanic corrosion reaction is reduced or prevented from occurring between the two dissimilar metals.

Figure 20A:
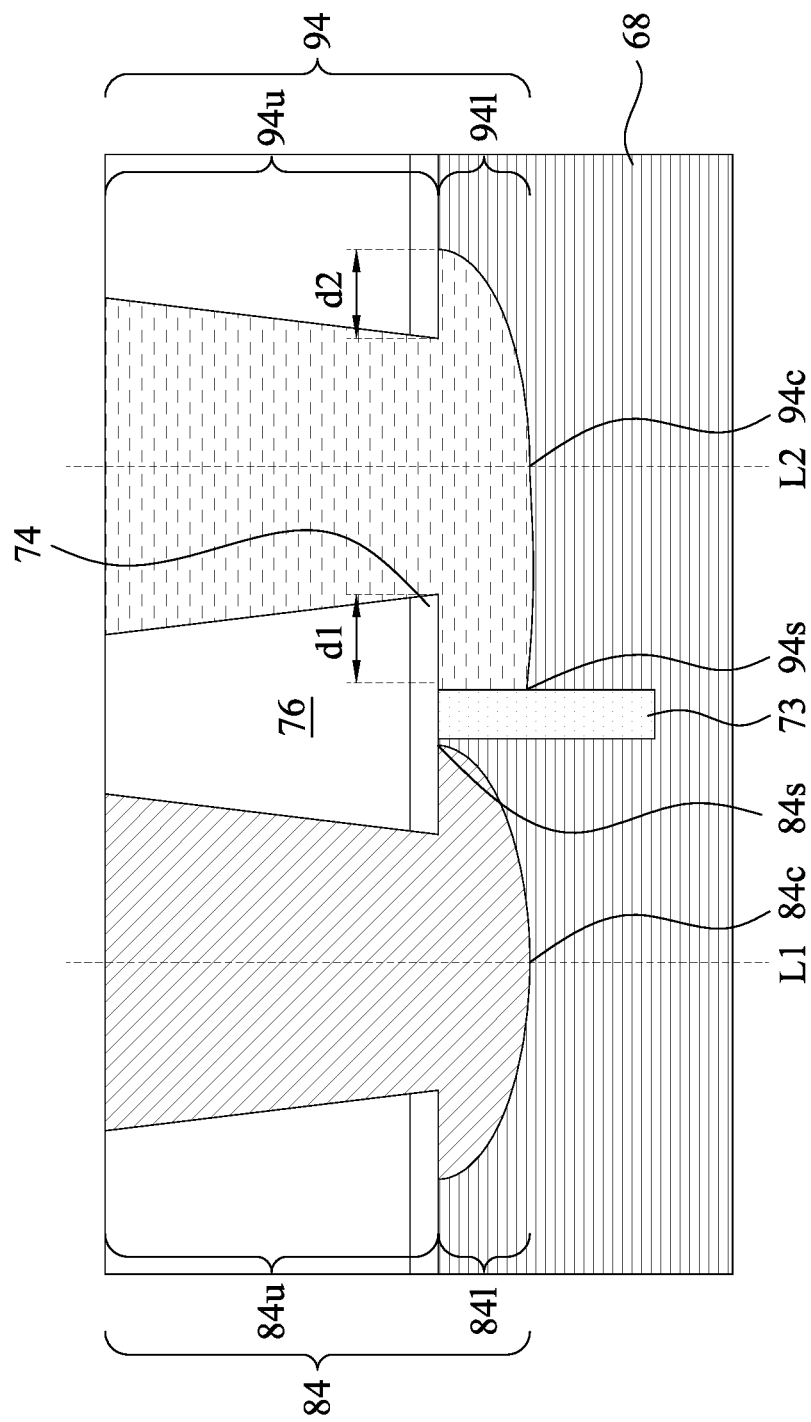
FIGS. 20A, 20B, 20C, and 20D illustrate enlarged views of contact structures in accordance with various embodiments.

FIGS. 20A, 20B, 20C, and 20D illustrate close up views of the dashed box in FIG. 19B according to various embodiments. In FIG. 20A, the first conductive structure 84 has a lower portion 84*l* which extends laterally toward the inter block 73, but does not touch the inter block 73. The second conductive structure 94 has a lower portion 94*l* that extends laterally toward the inter block 73 and contacts the inter block 73. For the second conductive structure 94, because the lower portion 94*l* contacts the inter block at 94*s*, the lower portion 94*l* is asymmetrical about a center line L2. As the second enlarged openings 88 are formed, when the etchant reaches the inter block 73, it is prevented from progressing any further, causing the etchant to be concentrated at the inter block 73. Opposite to the inter block 73, however, the etchant can spread laterally further than the etchant can spread on the side closer to the inter block 73. In other words, the distance d1 may be less than the distance d2 for the corresponding lower portion 94*l*. In contrast, the etchant on the first enlarged opening 80 spreads relatively evenly, causing the lower portion 84*l* to be symmetrical about the center line L1.

Figure 20B:
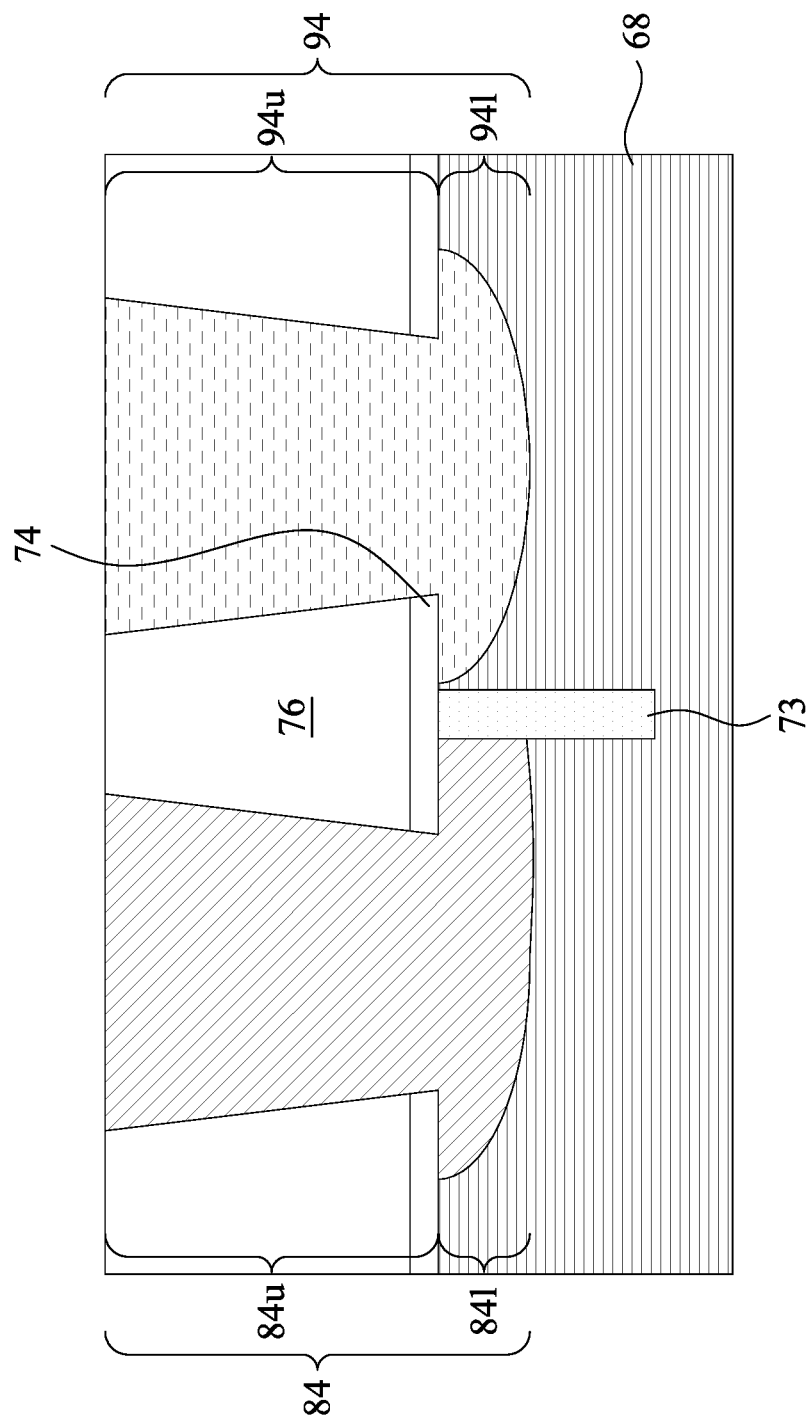
Figure 20C:
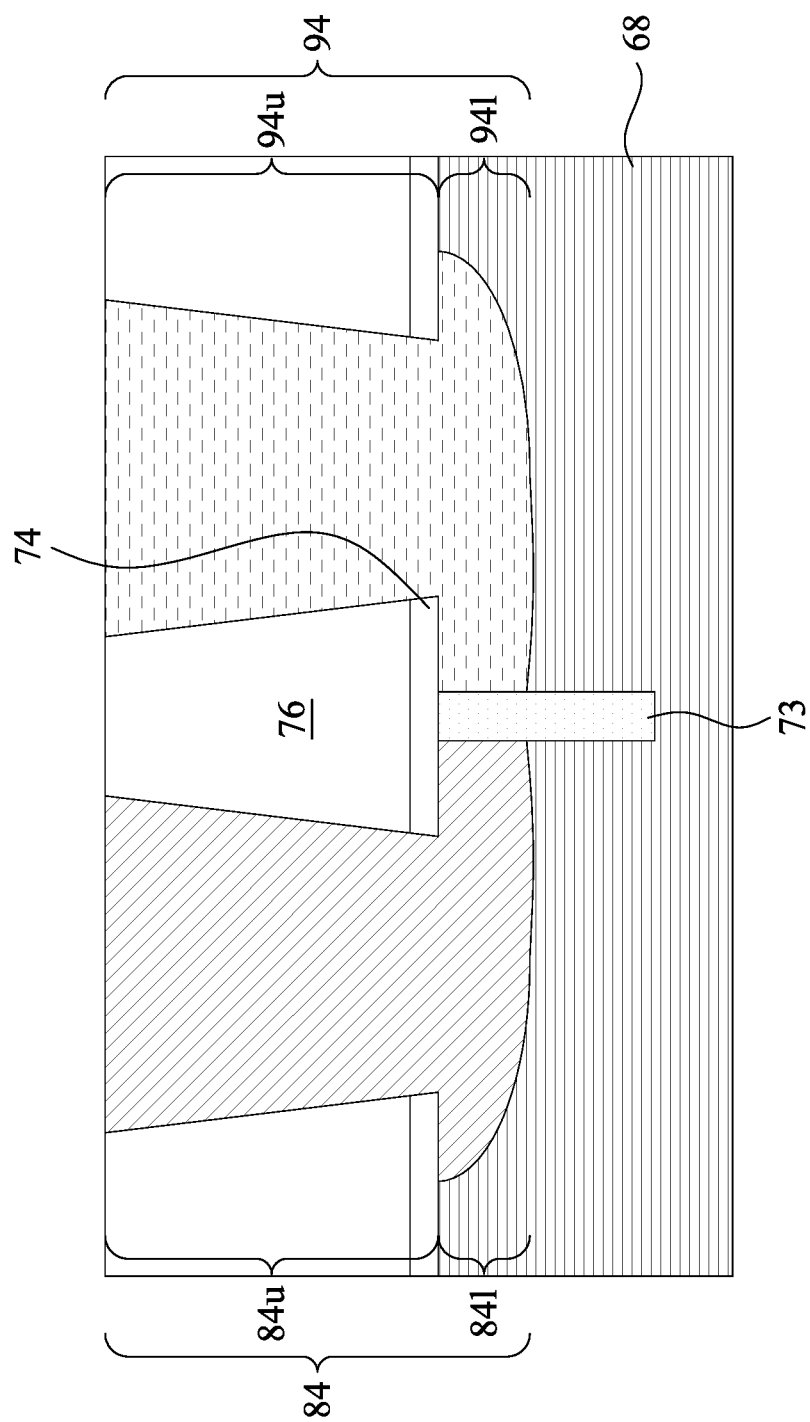
Figure 20D:
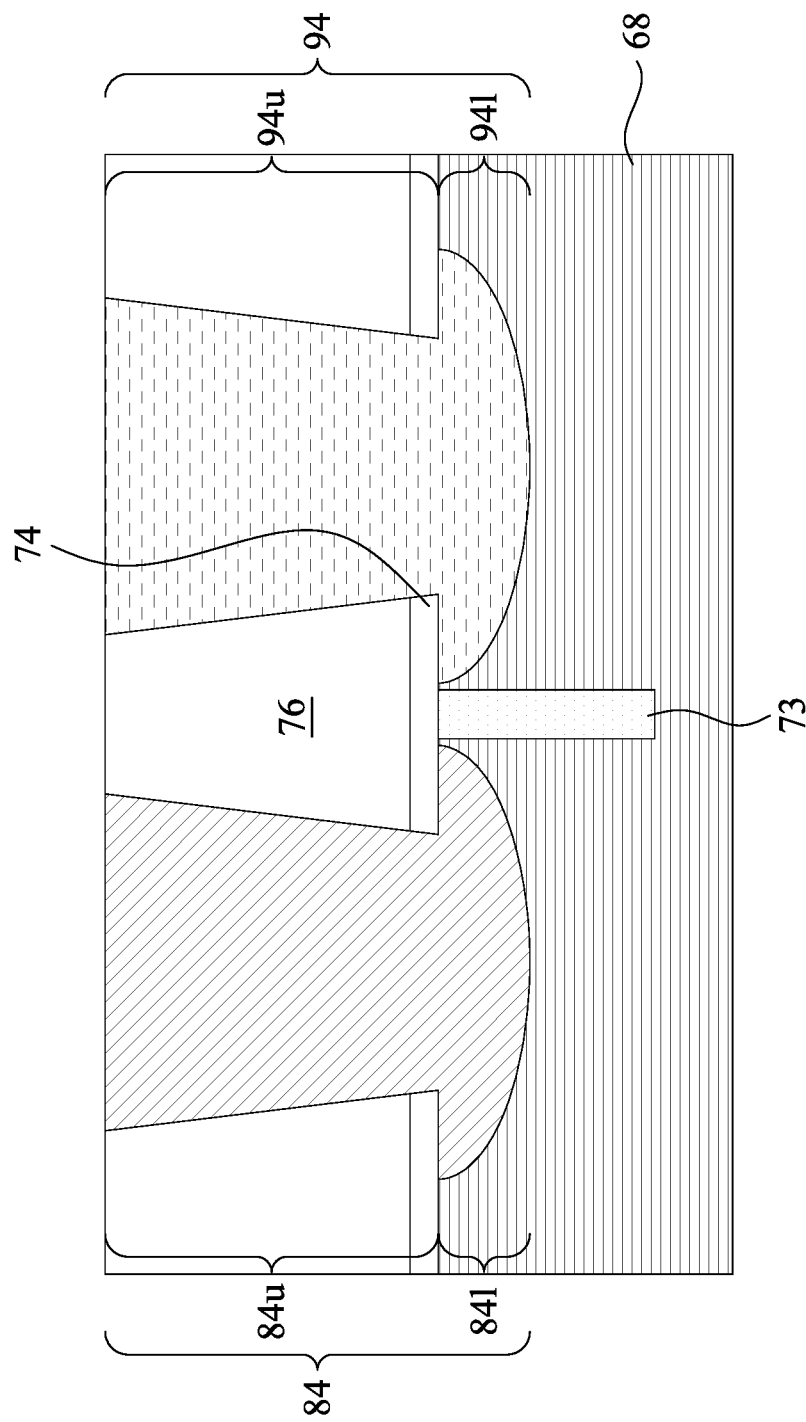

In FIG. 20B, the first conductive structure 84 has a lower portion 84*l* that extends laterally toward the inter block 73 and contacts the inter block 73. The second conductive structure 94 has a lower portion 94*l* which extends laterally toward the inter block 73, but does not touch the inter block 73. In FIG. 20C, both the first conductive structure 84 and second conductive structure 94 have lower portions 84*l* and 94*l* which extend toward the inter block 73 and contact the inter block 73. In FIG. 20D, both the first conductive structure 84 and second conductive structure 94 have lower portions 84*l* and 94*l* which extend toward the inter block 73, but do not contact the inter block 73.

Figure 21A:
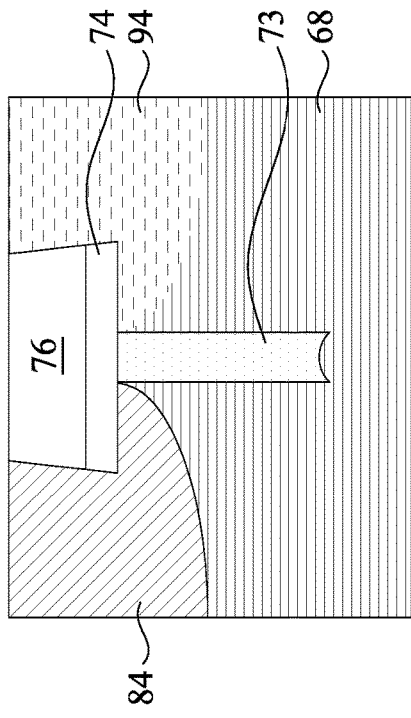
FIGS. 21A, 21B, 21C, 21D, 21E, 21F, 21G, 21H, 21I, and 21J are enlarged views of an inter block in accordance with various embodiments.
Figure 21B:
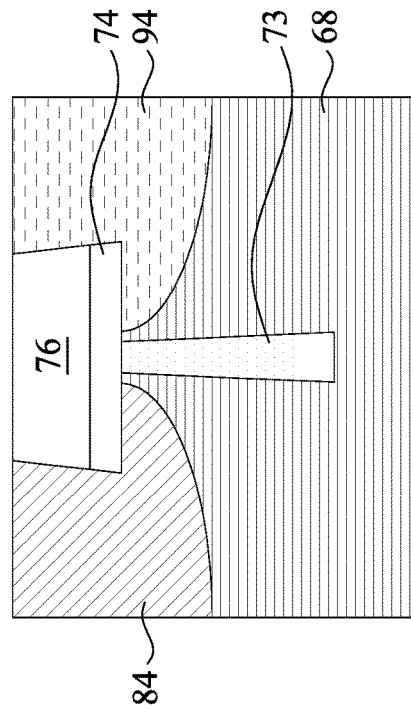
Figure 21C:
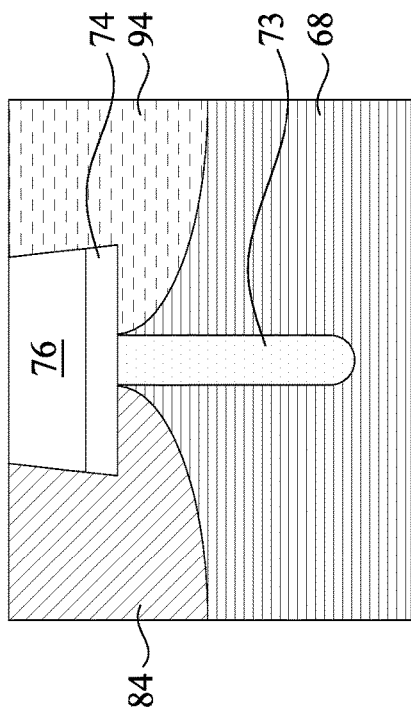
Figure 21D:
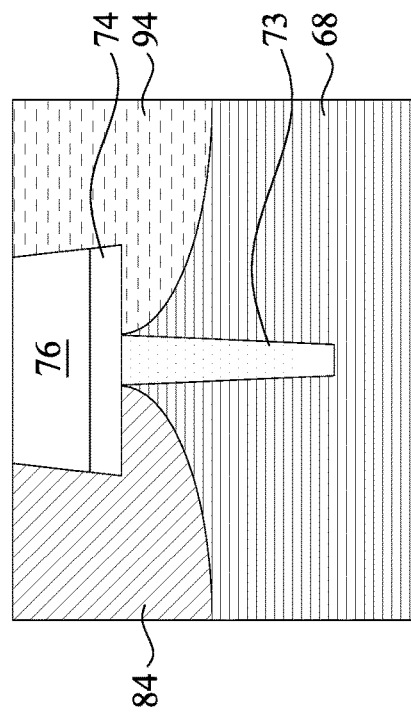
Figure 21E:
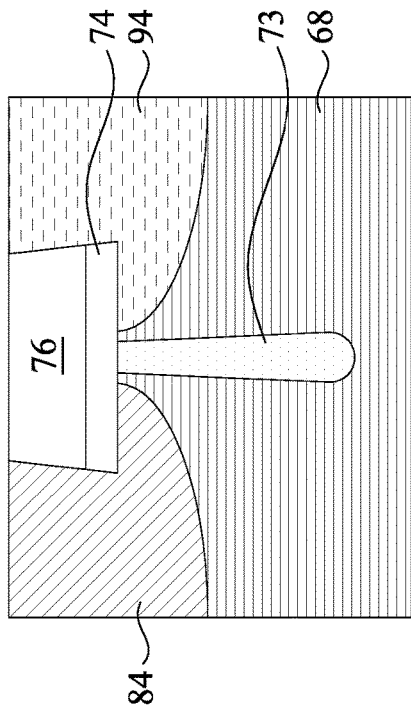
Figure 21F:
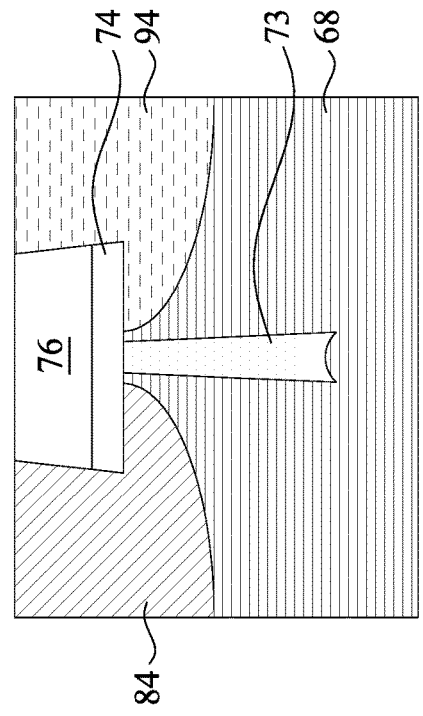
Figure 21G:
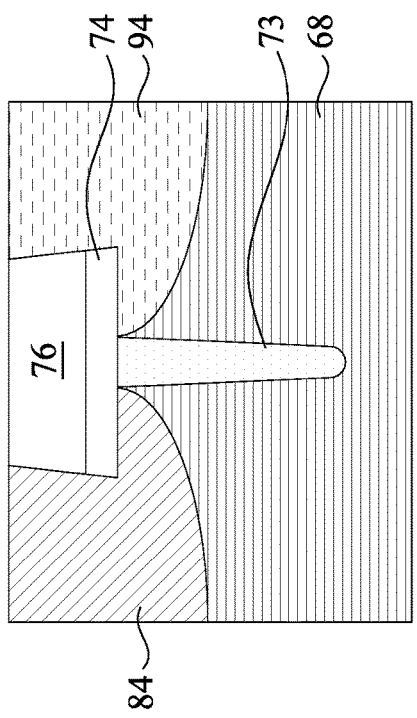
Figure 21H:
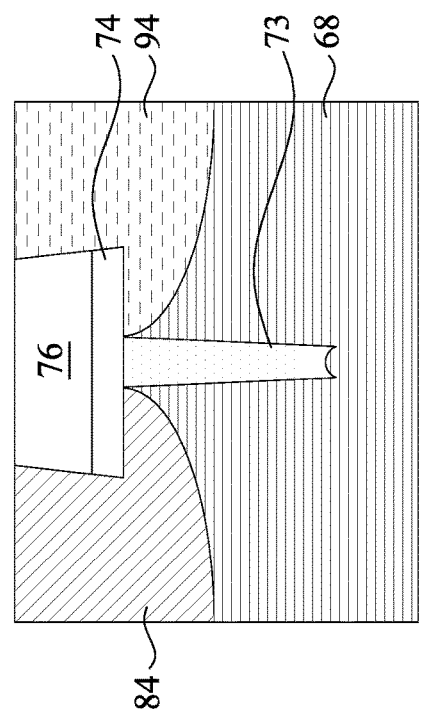
Figure 21J:
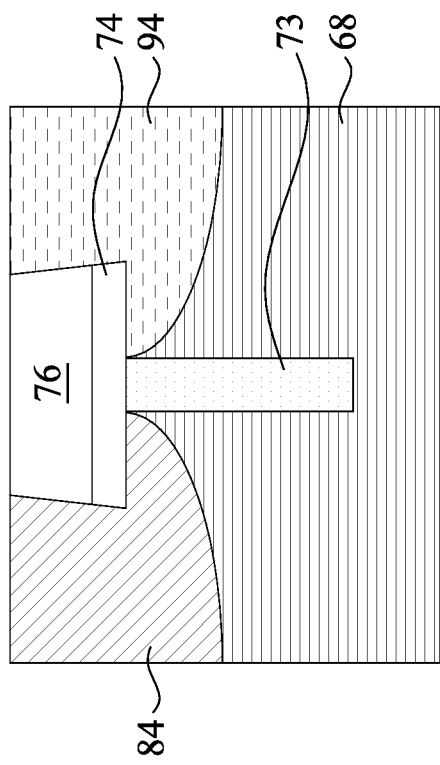
Figure 21I:
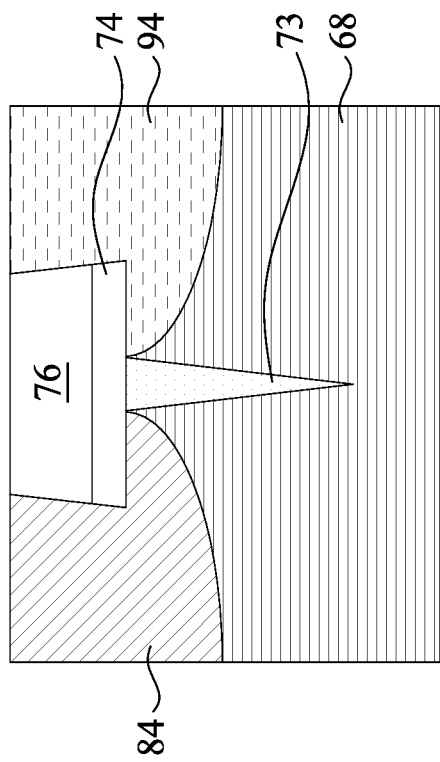

In FIGS. 21A-21J, views of various configurations of the inter block 73 are illustrated, in accordance with various embodiments. For each of the views of the various configurations of the inter block 73, the different shapes of the inter block 73 are formed through controlling the etching processes used to make the corresponding inter block opening 71, described above with respect to FIGS. 11A, 11B, and 11C. In FIGS. 21A through 21J, the inter block 73 has sidewalls with angle between 70° and 110° with respect to a horizontal line. In FIGS. 21A, 21B, and 21J, the sidewalls are about 90°. In FIGS. 21C, 21E, 21G, and 21I, the sidewalls have an angle between about 70° and 90°. In FIGS. 21D, 21F, and 21H, the sidewalls have an angle between about 90° and 110°. The corresponding etching process to form the opening or slot for the inter block 73 of FIGS. 21A through 21J can use plasma etching gas $C_xH_yF_z$ (x/y/z=0~12), $C_xH_yCl_z$ (x/y/z=0~12), $C_xH_yBr_z$ (x/y/z=0~12) to form the opening or slot for the inter block 73. Tuning the ratios and process conditions of the etching can provide the different sidewall angles. The inter block 73 may have a flat, convex, concave, or pointed shaped bottom depending on the ratios and process conditions of the etching. After forming the opening or slot for the inter block 73, the opening or slot may be filled with an insulting material, such as HfO, $Si_3N_4$, SiOH, SiC, SiOC, or C materials by CVD, PVD, SCVD, PECVD. The upper surfaces of the inter block 73 may then be planarized using a planarization process, such as a CMP to form the inter block 73.

FIGS. 22A, 22B, and 22C through FIGS. 26A and 26B illustrate the formation of gate contacts, in accordance with some embodiments. The respective process is illustrated as process 232 in the process flow 200 shown in FIG. 29. As noted in FIG. 29, the forming of the gate contacts may be performed after forming the first conductive structures 84 and before forming the second conductive structures 94. In some embodiments, however, both the first conductive structures 84 and second conductive structures 94 may be formed prior to forming the gate contacts. In some embodiments, the formation of the gate contacts can also include forming an inter block, a first gate contact on one side of the inter block, and a second gate contact on the other side of the inter block. In other embodiments, an inter block is not used. In some embodiments where a gate inter block is used, the inter block may be formed at the same time and using the same processes as those used for forming the inter block 73. The process described below includes forming the gate inter block after the ILD 76 is formed, however, the previously described process for forming the inter block 73 may be substituted.

Figure 22A:
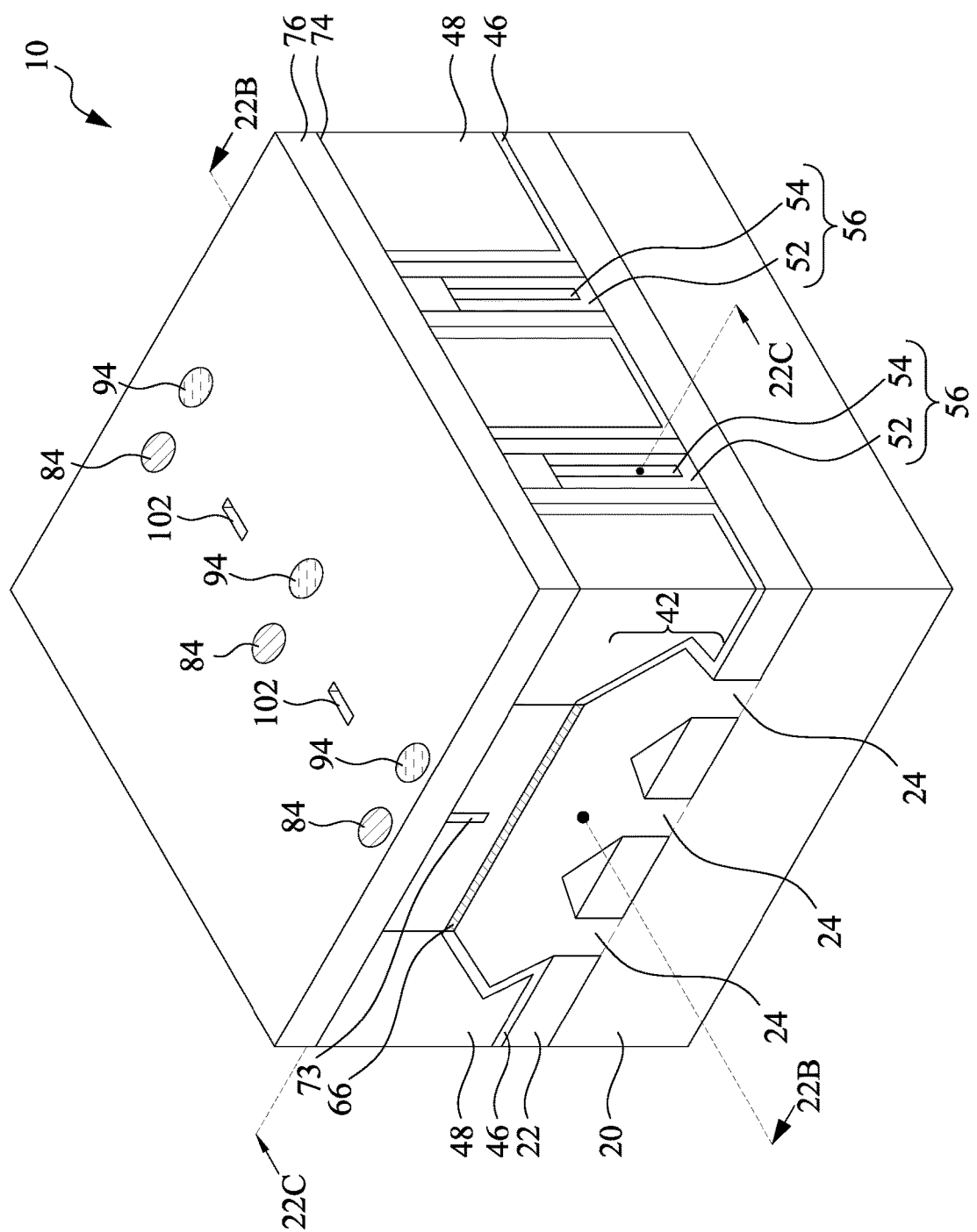
Figure 22B:
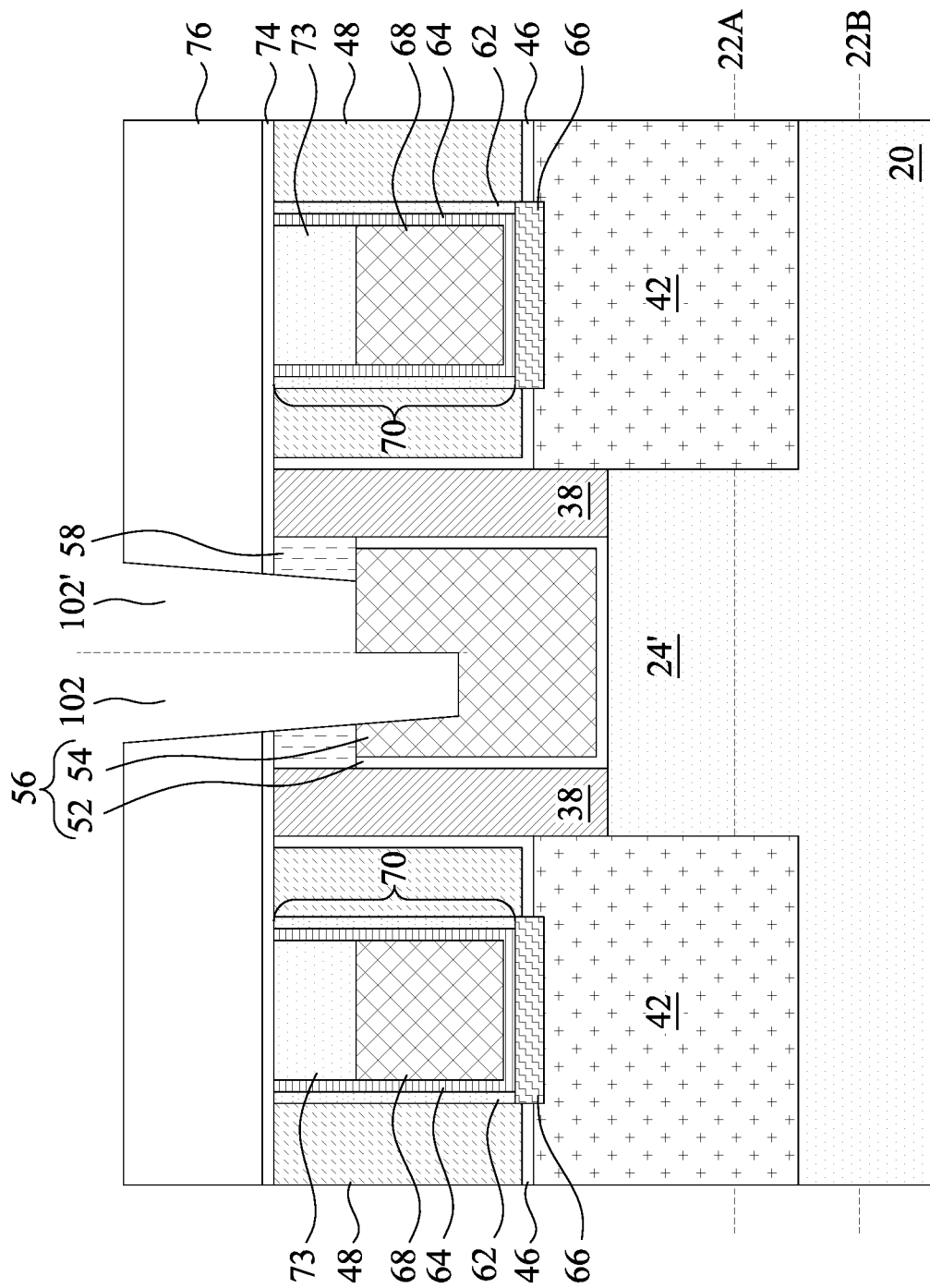
Figure 22C:
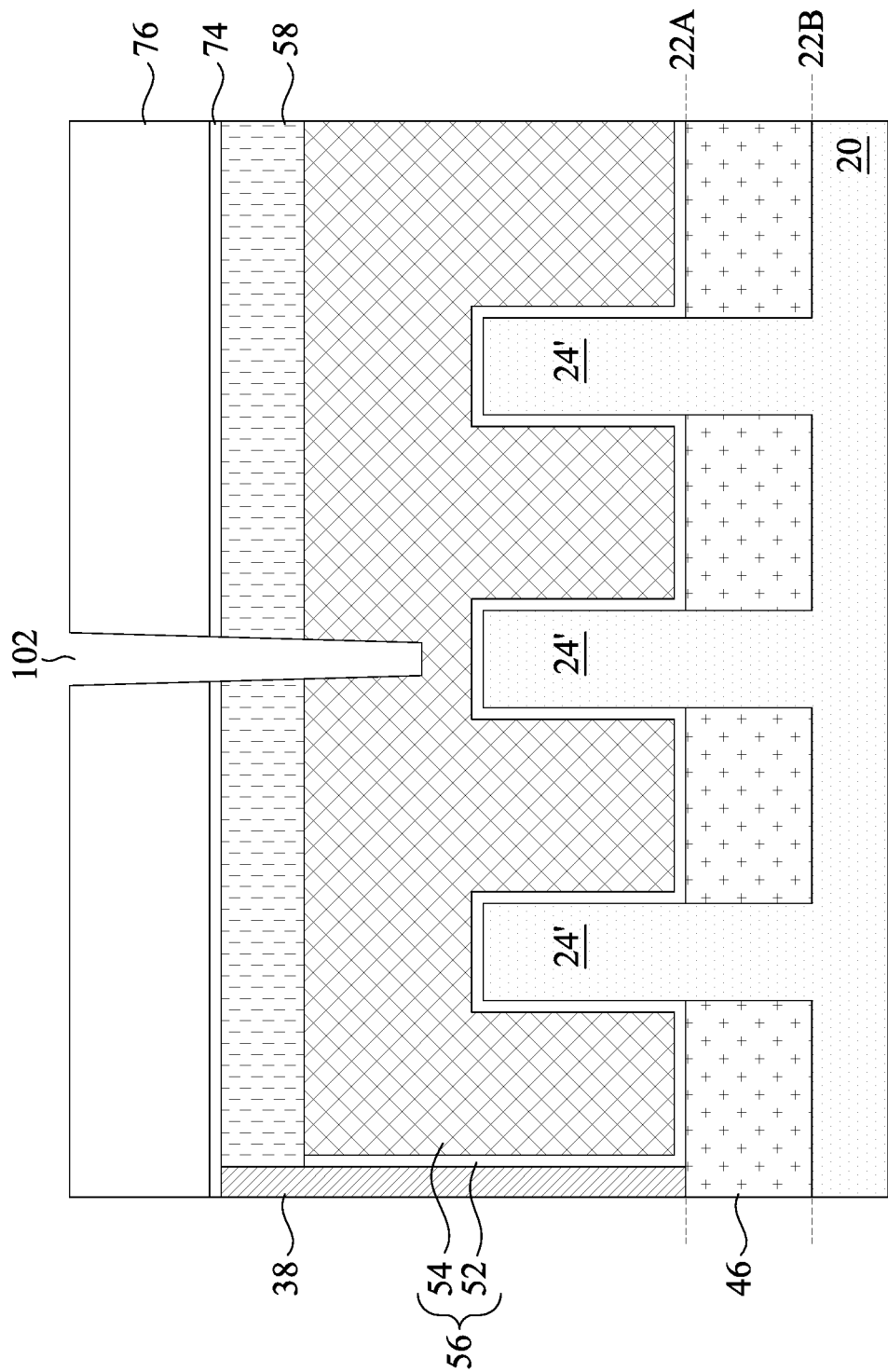

In FIGS. 22A, 22B, and 22C, openings 102 are formed in the gate electrode 54. FIG. 22A illustrates a perspective view, FIG. 22B illustrates the reference cross-section 22B-22B in FIG. 22A, and FIG. 22C illustrates the reference cross-section 22C-22C in FIG. 22A. The respective process is illustrated as process 252 in the process flow 232 shown in FIG. 30. The view in FIG. 22B includes two options for forming openings for inserting an opening for an inter block in the gate area. Openings 102 are formed through the ILD 76, ESL 74, hard mask 58, and partially into the gate electrode 54. Openings 102' are formed through the ILD 76, ESL 74, and hard mask 58, but do not go into the gate electrode 54. The openings 102 or openings 102' may be formed using processes similar to those described above with respect to forming the openings 71. In particular, the openings 102 or openings 102' may be formed by any suitable process, such as, by an acceptable photolithography process where a one-, two-, or three-layer photomask may be formed over the ILD 76 and developed and/or patterned to form an opening therein, which is then transferred to the gate electrode 54 by an etching process to form the openings 102 or openings 102'. The etching process may be a dry etch or wet etch and the openings 102 or openings 102' may result in several different shapes, which are discussed in further detail above with respect to FIGS. 21A through 21J. In some embodiments, a portion of the gate electrode 54 may remain on either side of the openings 102 (between the openings 102 and the gate dielectrics 52), such as illustrated in FIG. 22B, while in other embodiments, the openings 102 may extend laterally further than the gate electrode 54, and into the gate dielectrics 52 and/or into the gate spacers 38. For example, the lateral extent of the openings 102 may terminate in the gate spacers 38. In other embodiments, an inter block may not be used in the gate region, and therefore the openings 102 or openings 102' may be omitted.

Figure 23A:
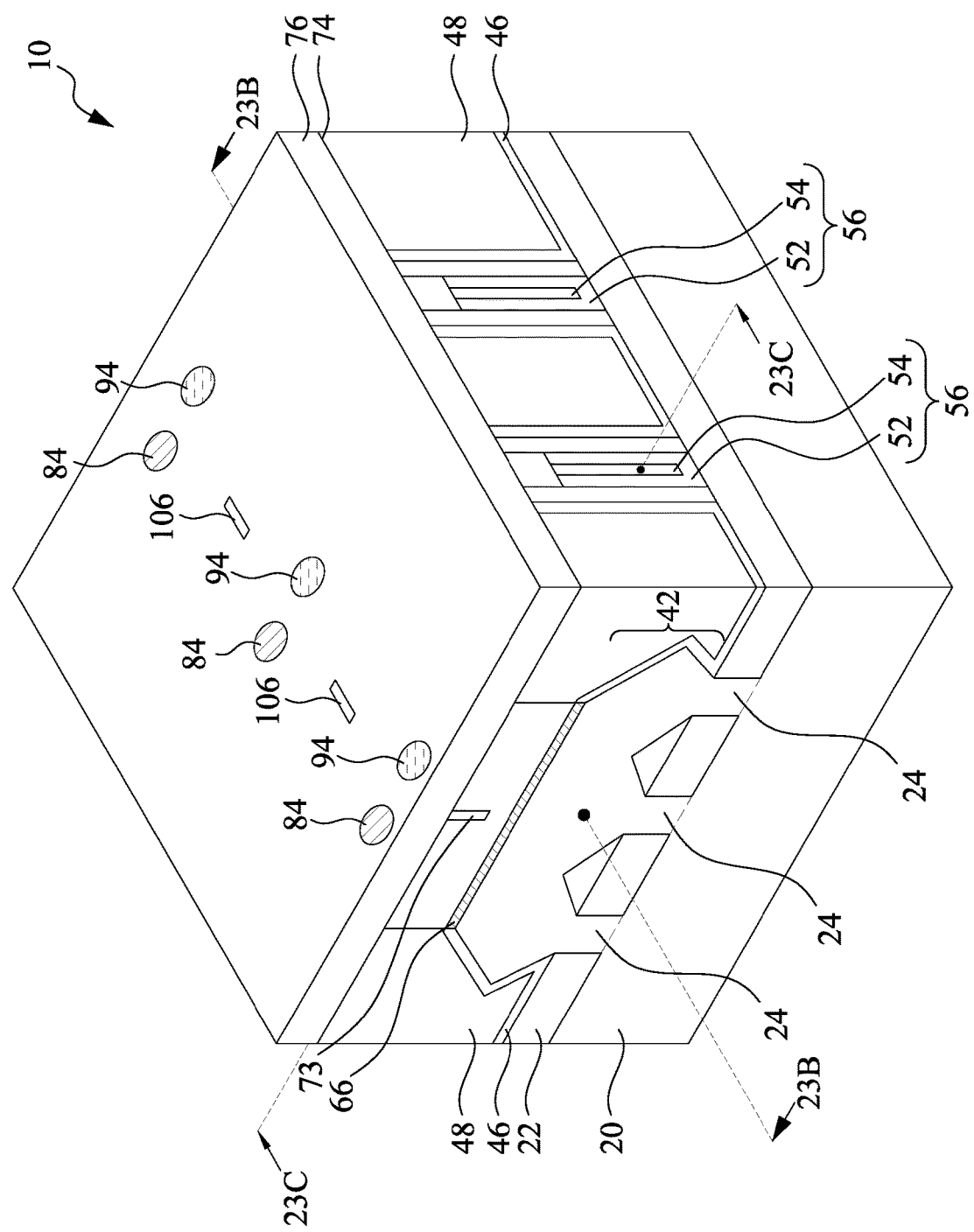
Figure 23B:
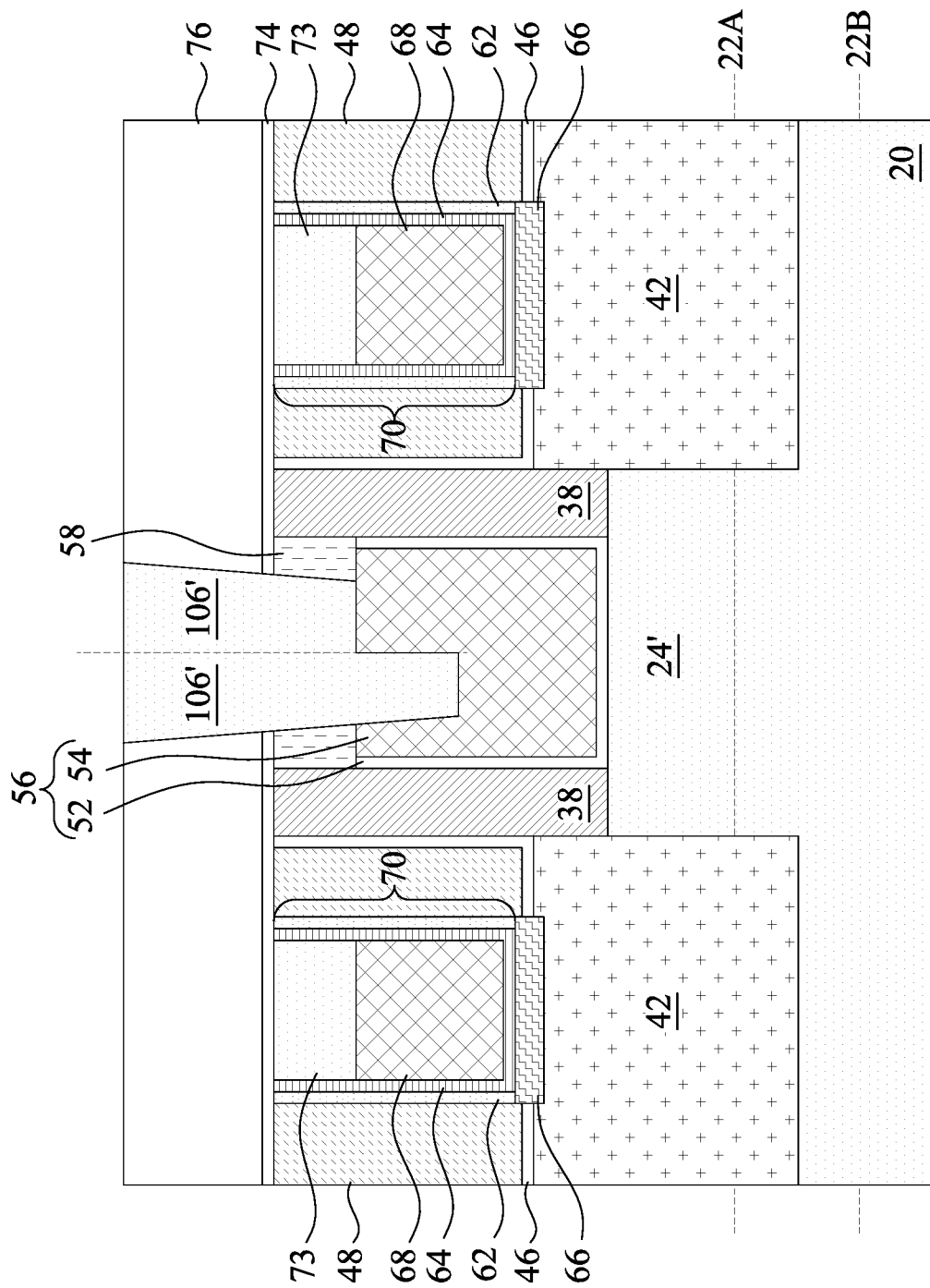
Figure 23C:
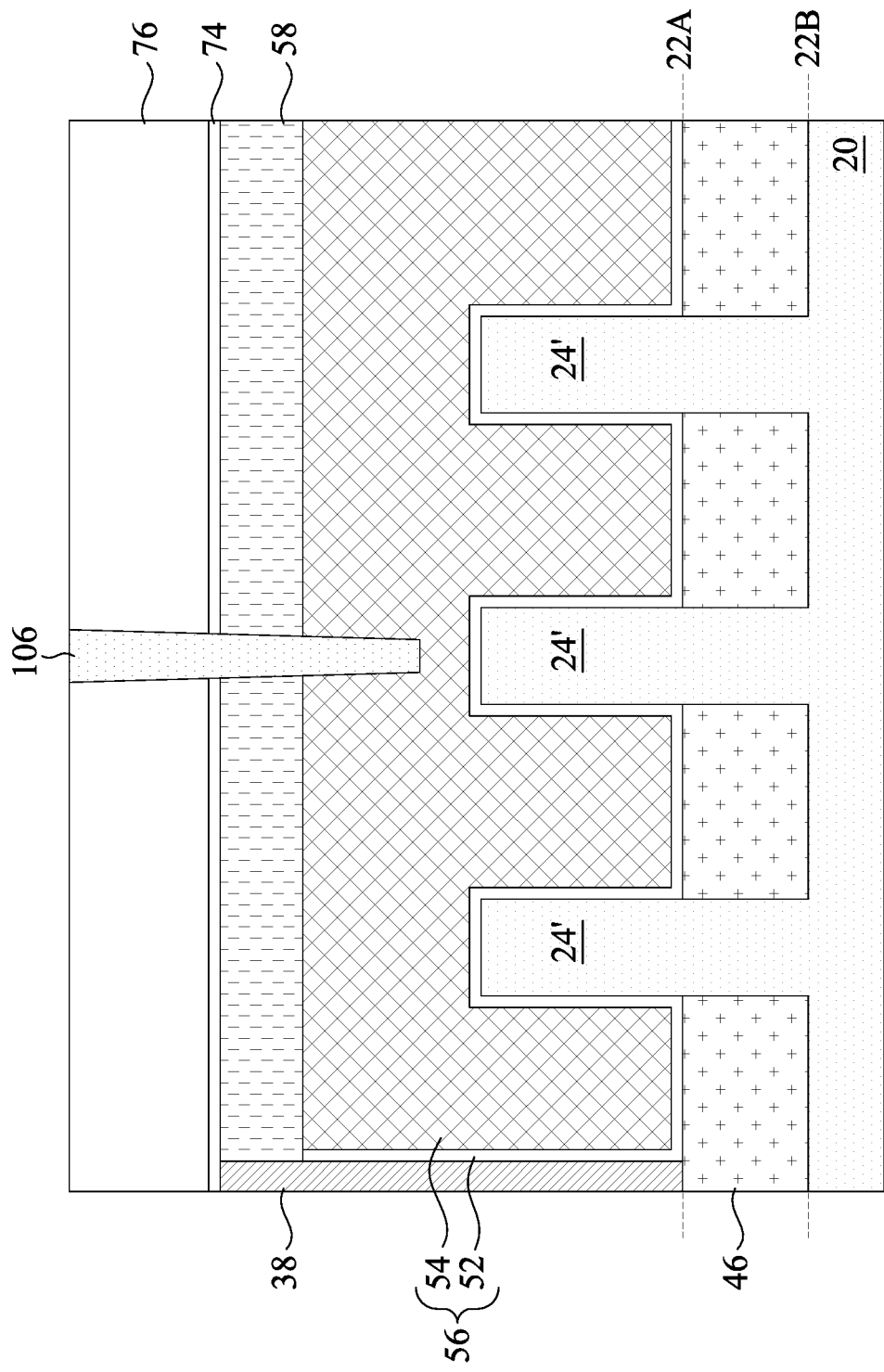

In FIGS. 23A, 23B, and 23C, inter blocks 106 are formed in the gate electrode 54. FIG. 23A illustrates a perspective view, FIG. 23B illustrates the reference cross-section 23B-23B in FIG. 23A, and FIG. 23C illustrates the reference cross-section 23C-23C in FIG. 23A. The respective process is also illustrated as process 252 in the process flow 232 shown in FIG. 30. The dashed outline of the process 252 indicates that it is an optional process. The view in FIG. 23B includes two options for forming the inter blocks 106' or the inter blocks 106', depending on whether the opening 102 or the openings 102' were used (see FIG. 22B). The inter blocks 106 or the inter blocks 106' may be formed by depositing a dielectric material in the openings 102 or the openings 102' using processes and materials similar to those used to form the dielectric material 72. Following the deposition of the dielectric material, a leveling process may be used to level the upper surfaces of the dielectric material with the upper surfaces of the ILD 76, thereby forming the inter blocks 106 or the inter blocks 106'. The inter blocks 106 or the inter blocks 106' may be formed using processes and materials similar to those used to form the inter blocks 73 from the dielectric material 72. If the inter blocks 106 or the inter blocks 106' are formed in the same process as the formation of the inter blocks 73, then the upper surface of the inter block 73 will be level with the upper surface of the ILD 48. FIG. 23C illustrates that the inter block 106 is disposed over the protruding fins 24' of the fin, however, the inter block 106 may be disposed anywhere along the length of the gate electrode 54, so long as space remains on either side of the inter block 106 for first and second gate contacts to be formed.

Figure 24A:
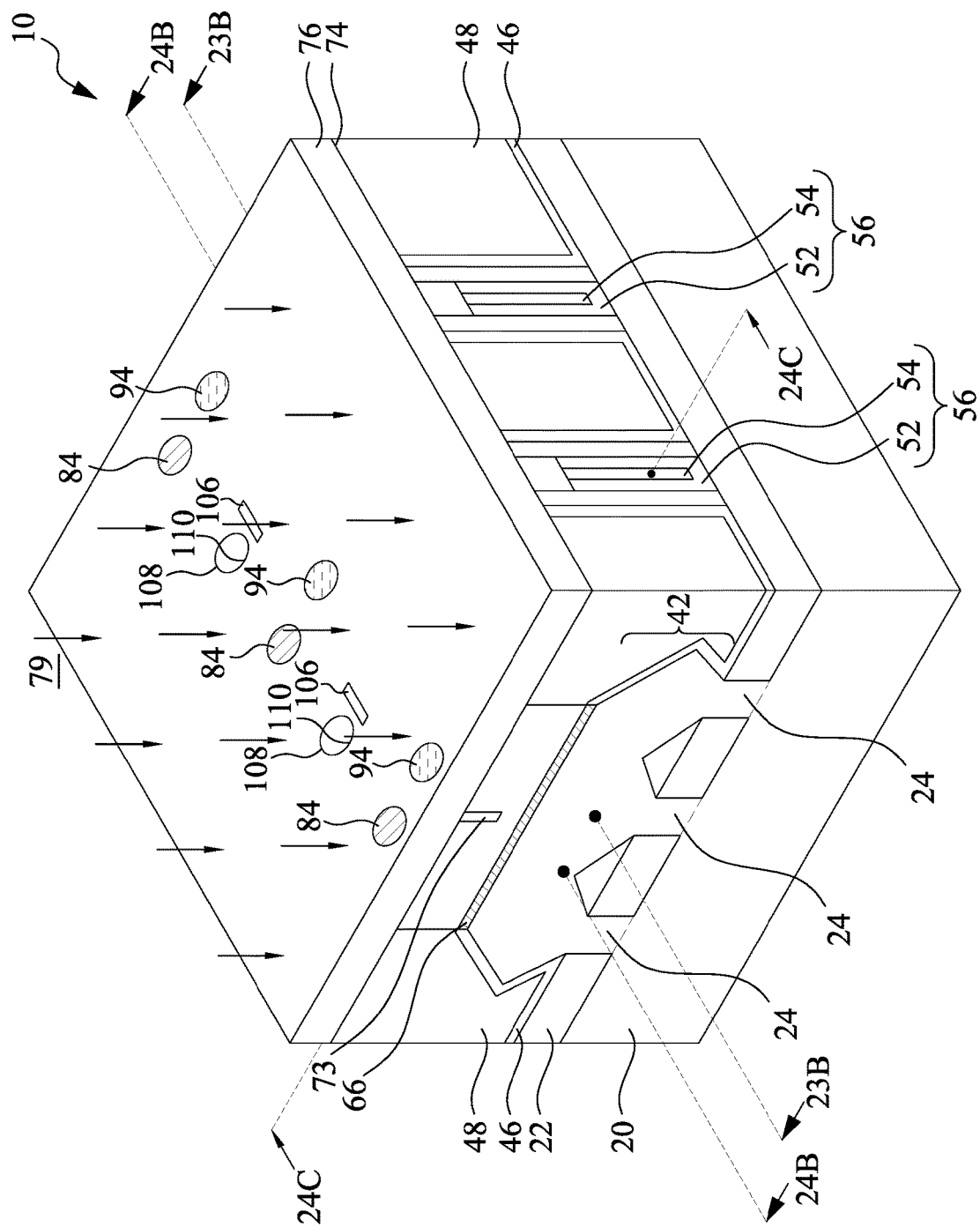
Figure 24B:
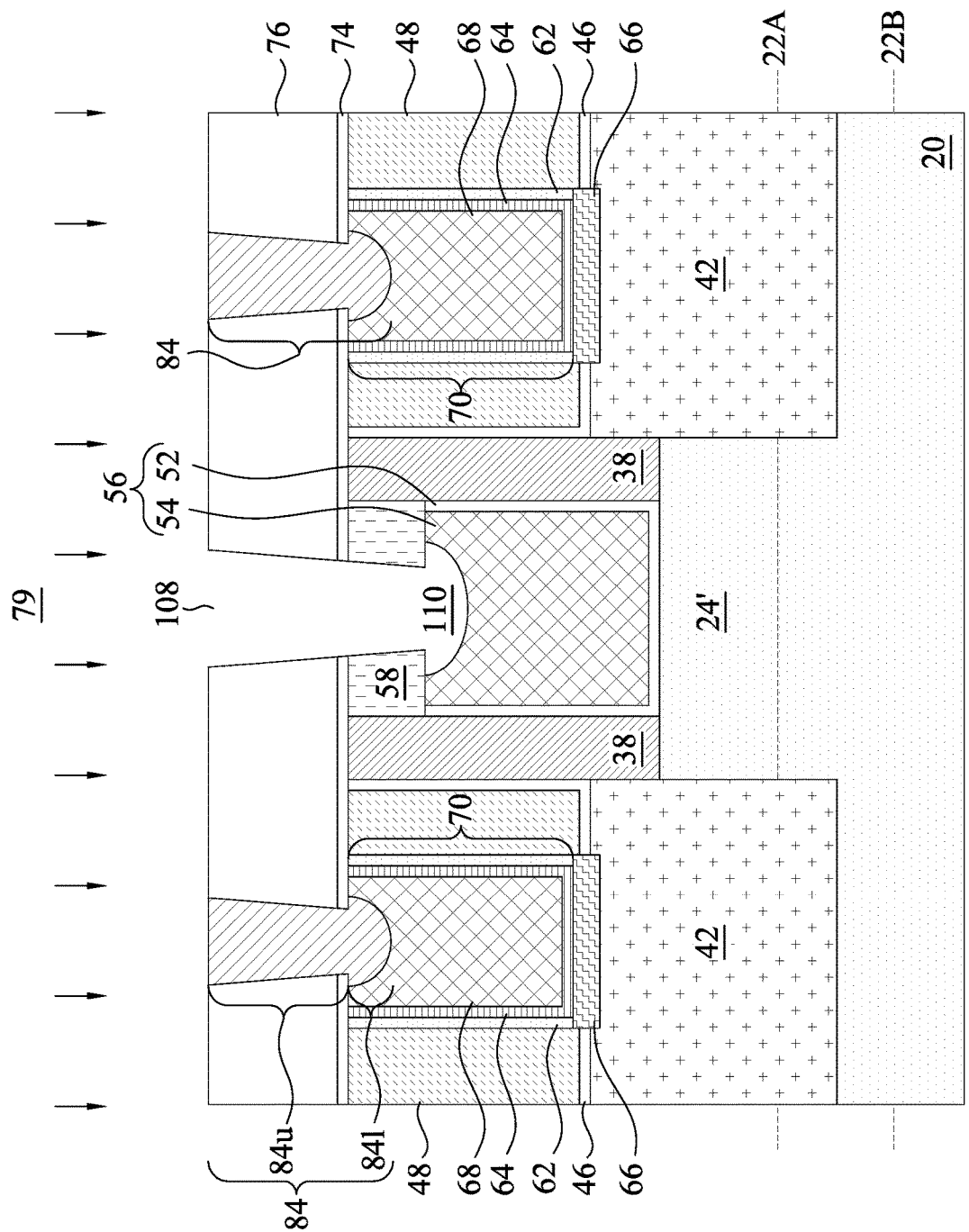
Figure 24C:
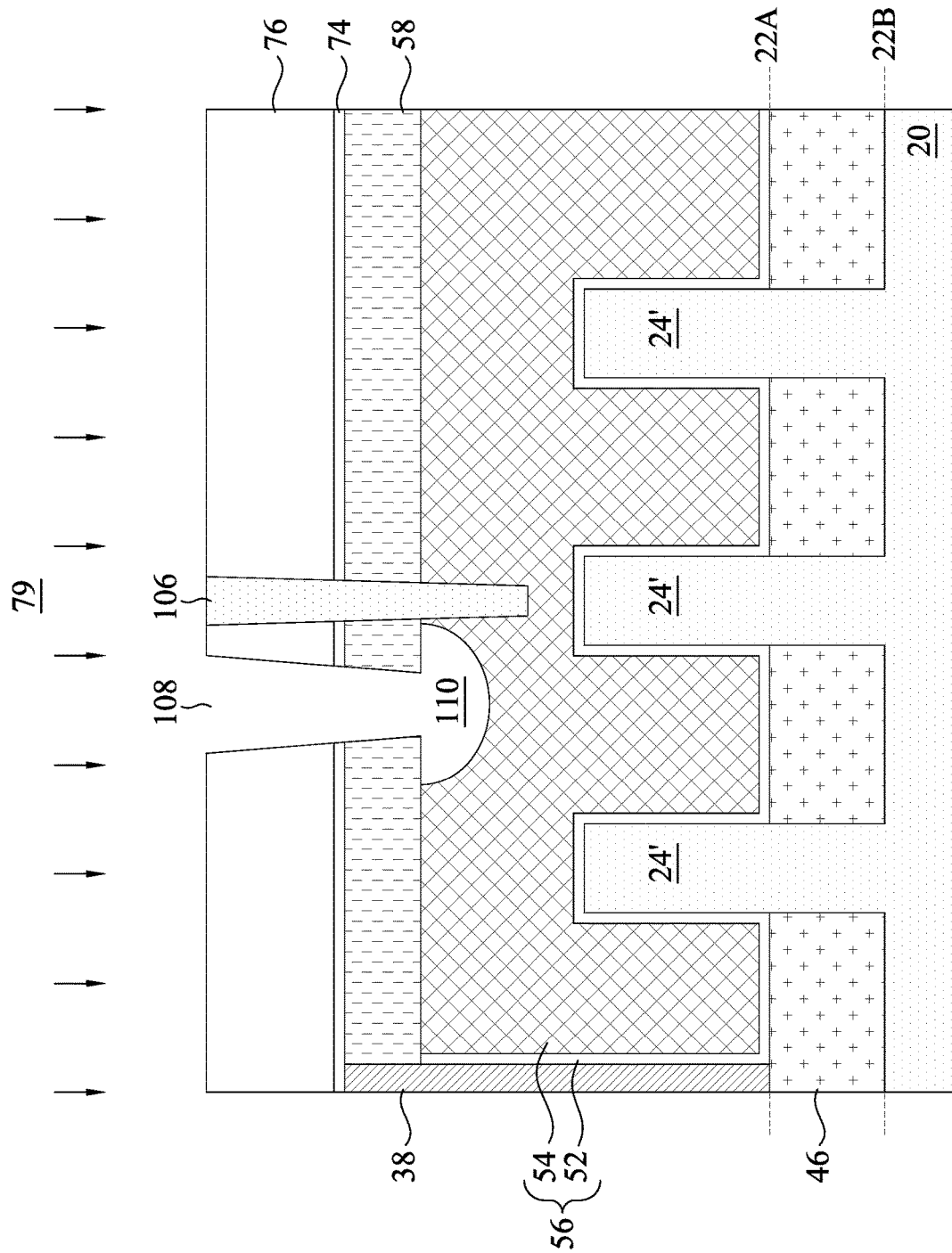

In FIGS. 24A, 24B, and 24C, first openings 108 and first enlarged openings 110 are formed in the gate electrode 54. FIG. 24A illustrates a perspective view, FIG. 24B illustrates the reference cross-section 24B-24B in FIG. 24A, and FIG. 24C illustrates the reference cross-section 24C-24C in FIG. 24A. The reference cross-section 23B-23B is overlaid on FIG. 24A, illustrating that the cross section 24B-24B is adjacent the cross-section 23B-23B. The respective process is illustrated as process 254 in the process flow 232 shown in FIG. 30. The first openings 108 may be formed using processes and materials similar to those discussed above with respect to the formation of the openings 102. The process 79 may be used to form the first enlarged openings 110. The process 79 of FIGS. 24A, 24B, and 24C is like unto the process 79 discussed above.

Figure 25A:
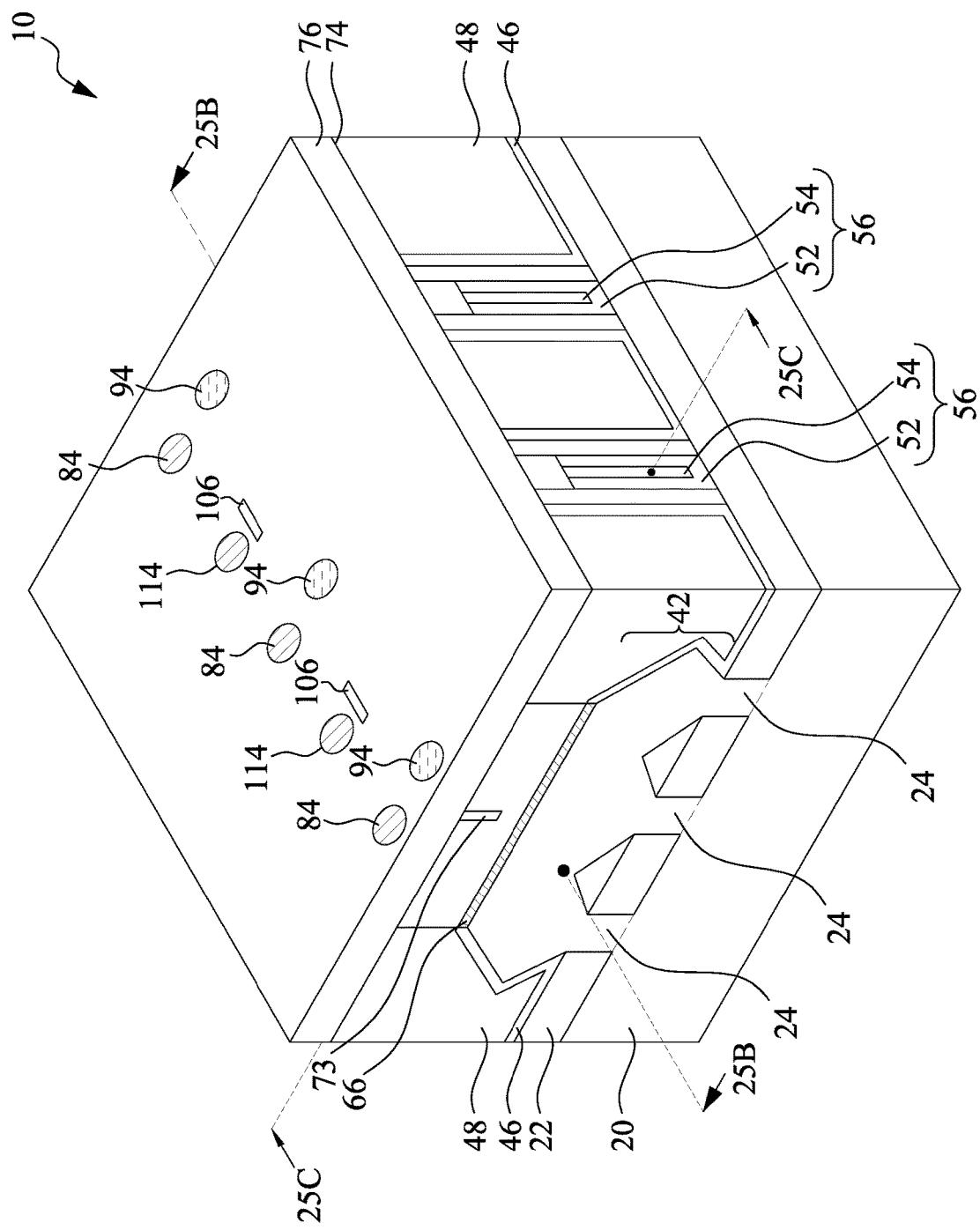
Figure 25B:
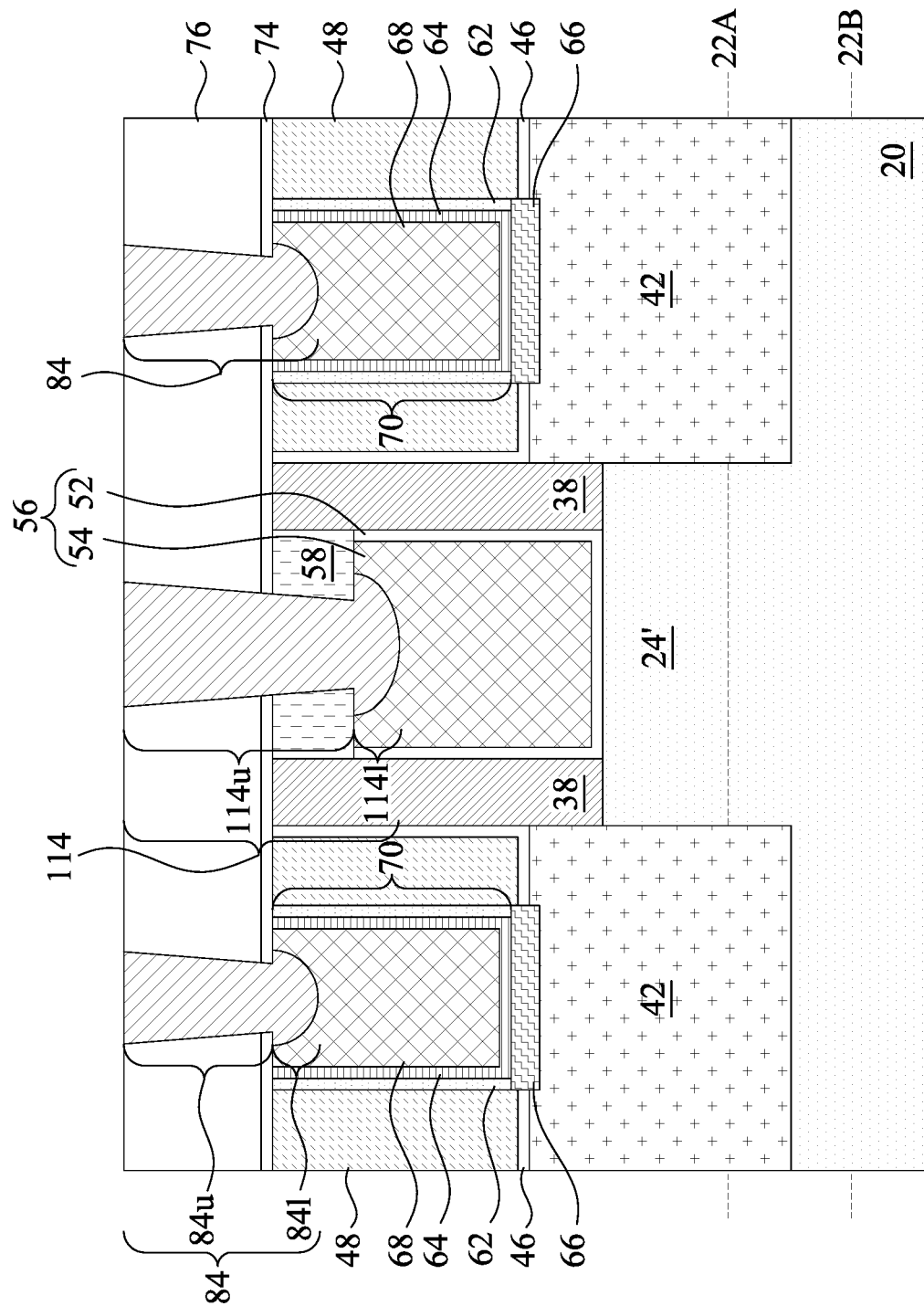
Figure 25C:
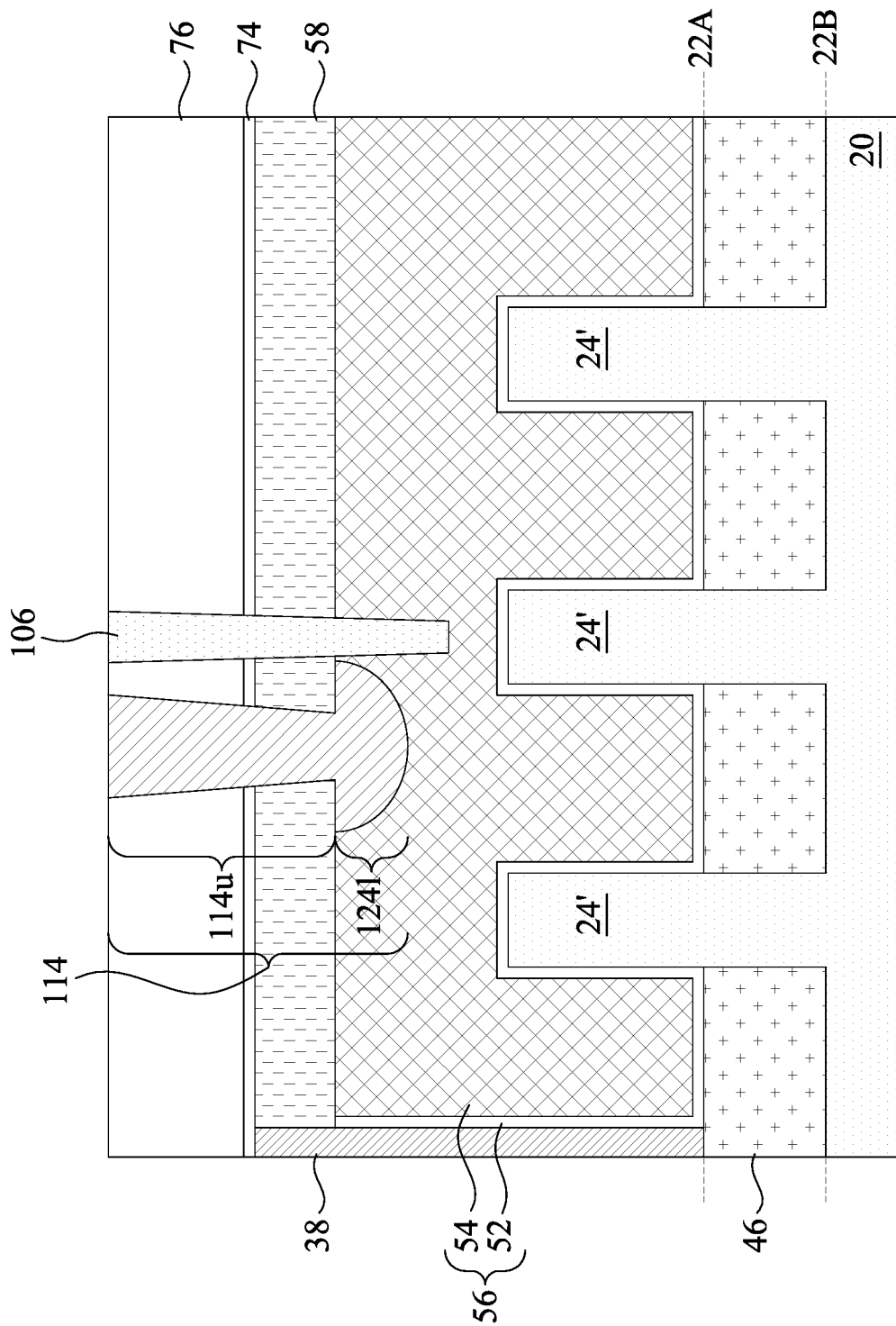

In FIGS. 25A, 25B, and 25C, first gate contacts 114 are formed in the first openings 108 and first enlarged openings 110. FIG. 25A illustrates a perspective view, FIG. 25B illustrates the reference cross-section 25B-25B in FIG. 25A, and FIG. 25C illustrates the reference cross-section 25C-25C in FIG. 25A. The respective process is illustrated as process 256 in the process flow 232 shown in FIG. 30. The first gate contacts 114 may be formed using processes and materials similar to those discussed above with respect to the first conductive structures 84. In short, the lower portion 114*l* of the first gate contacts 114 may be formed using a bottom up deposition process which continues until the first openings 108 are filled to form the upper portion 114*u* of the first gate contacts 114. Then, a planarization process may be used to level the upper surfaces of the first gate electrode.

Figure 26A:
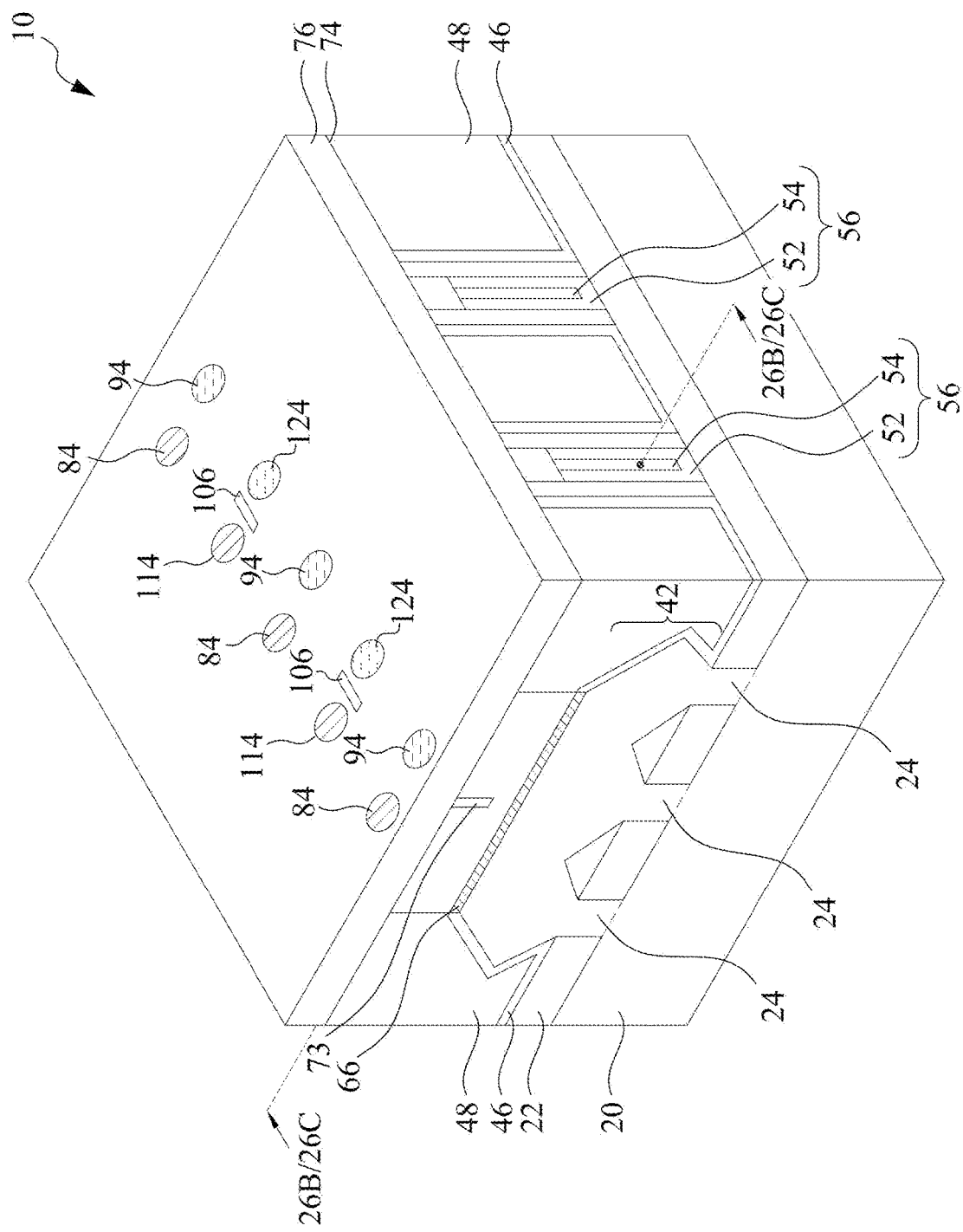
Figure 26B:
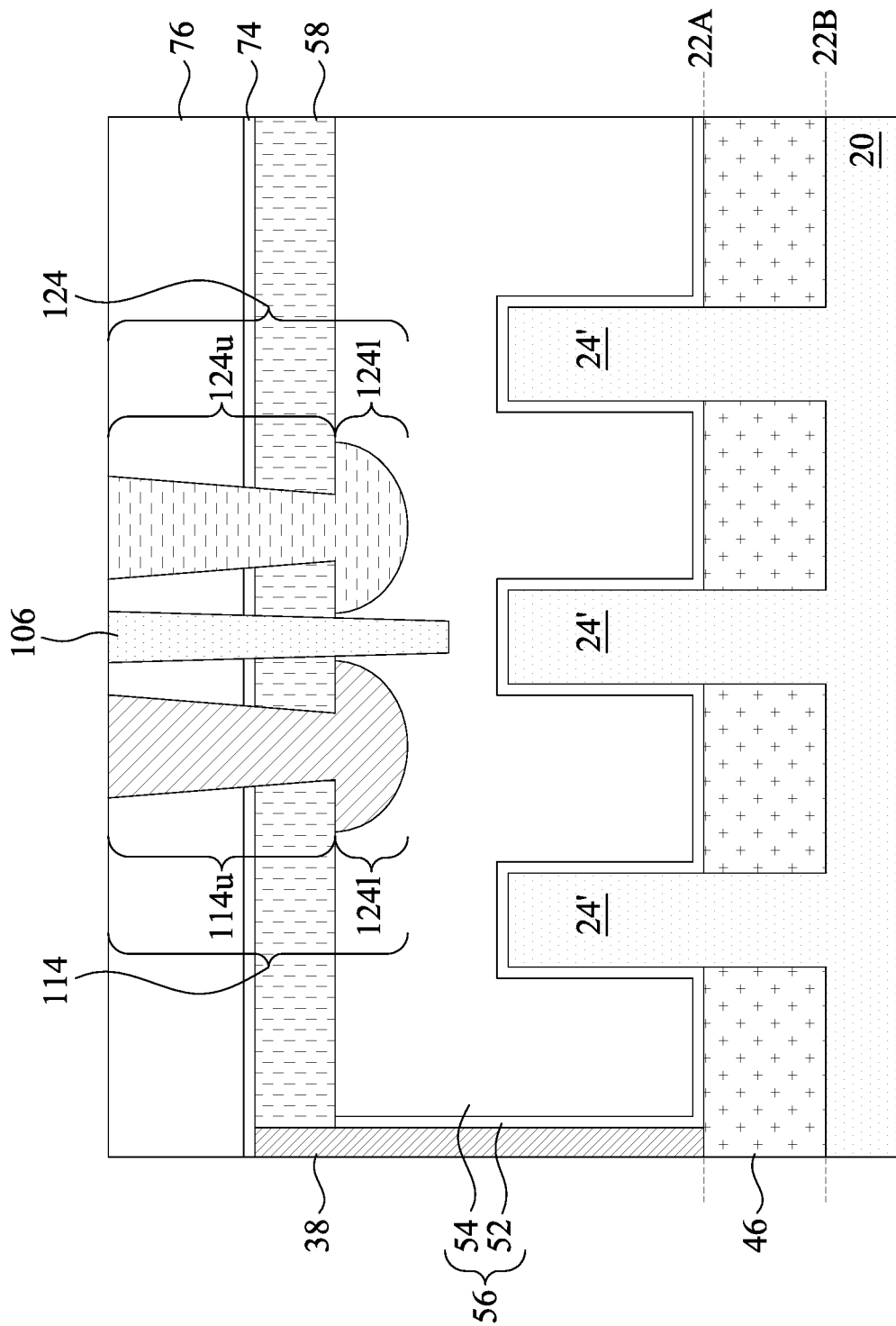
Figure 26C:
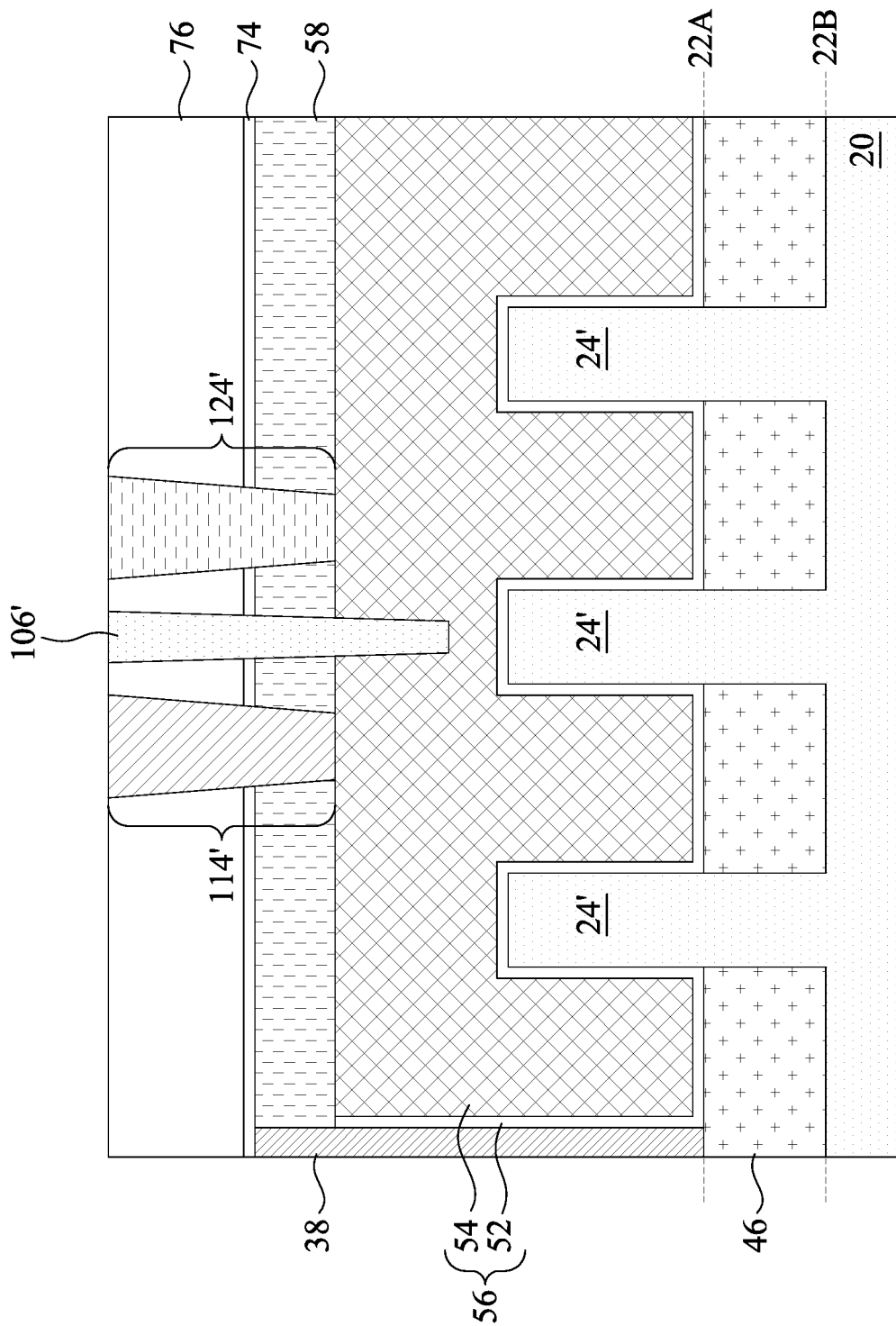

In FIGS. 26A and 26B, second gate contacts 124 are formed. FIG. 26A illustrates a perspective view, FIG. 26B illustrates the reference cross-section 26B-26B in FIG. 26A, and FIG. 26C illustrates the reference cross-section 26C-26C in alternative embodiments of FIG. 26A. The respective process is illustrated as processes 258 and 260 in the process flow 232 shown in FIG. 30. As illustrated in In FIG. 26B, in the process 258, the ILD 76, the ESL 74, and hard mask 58 are etched to form an opening to expose the gate electrode 54. Then, the opening is extended into the gate electrode 54 to form an enlarged opening by an etching process, such as the etching process 79. The opening and enlarged opening may be formed using materials and processes similar to those discussed above with respect to the formation of the first contact opening 78 and enlarged opening 80 of FIGS. 15A through 16C.

In FIG. 26C, the conductive structures 114' and 124' are formed adjacent the inter block 106'. As described above with respect to FIGS. 22B and 22C, the inter block 106' does not extend into the gate electrode 54. Similarly, the first conductive structures 114' and the second conductive structures 124' may also not extend into the gate electrode 54. In such embodiments, the first conductive structures 114' and the second conductive structures 124' may be formed using the same processes described above with respect to the first conductive structures 114 and the second conductive structures 124, except that the enlarged openings are omitted.

Similar to that explained above with respect to the first conductive structure 84, when forming the enlarged opening for the second gate contacts 124, because the inter block 106 is present, a galvanic reaction is avoided between the first gate contacts 114 and the gate electrode 54.

Next, in the process 260, second gate contacts 124 are formed by depositing a metallic material in the enlarged opening by a bottom-up deposition process to form the lower portion 124*l* and continuing the deposition to form the upper portion 124*u*. Then, a planarization process may be used to remove excess portions of the metallic material from over the ILD 76 and to level the upper surface of the second gate contact 124 with the upper surface of the ILD 76. The metallic material may be deposited using processes and materials similar to those discussed above with respect to the first conductive structures 84 of FIGS. 17A-17C.

The inter block 106 is disposed between the first gate contact 114 and the second gate contact 124 and prevents them from contacting one another, and thereby prevents or reduces galvanic corrosion. The shapes of the lower portions 114*l* and lower portions 124*l* may be formed according to any of the shapes in FIGS. 20A-20D, discussed above. As such, the lower portion 114*l* and/or lower portion 124*l* may have an interface with the inter block 106.

Figure 27A:
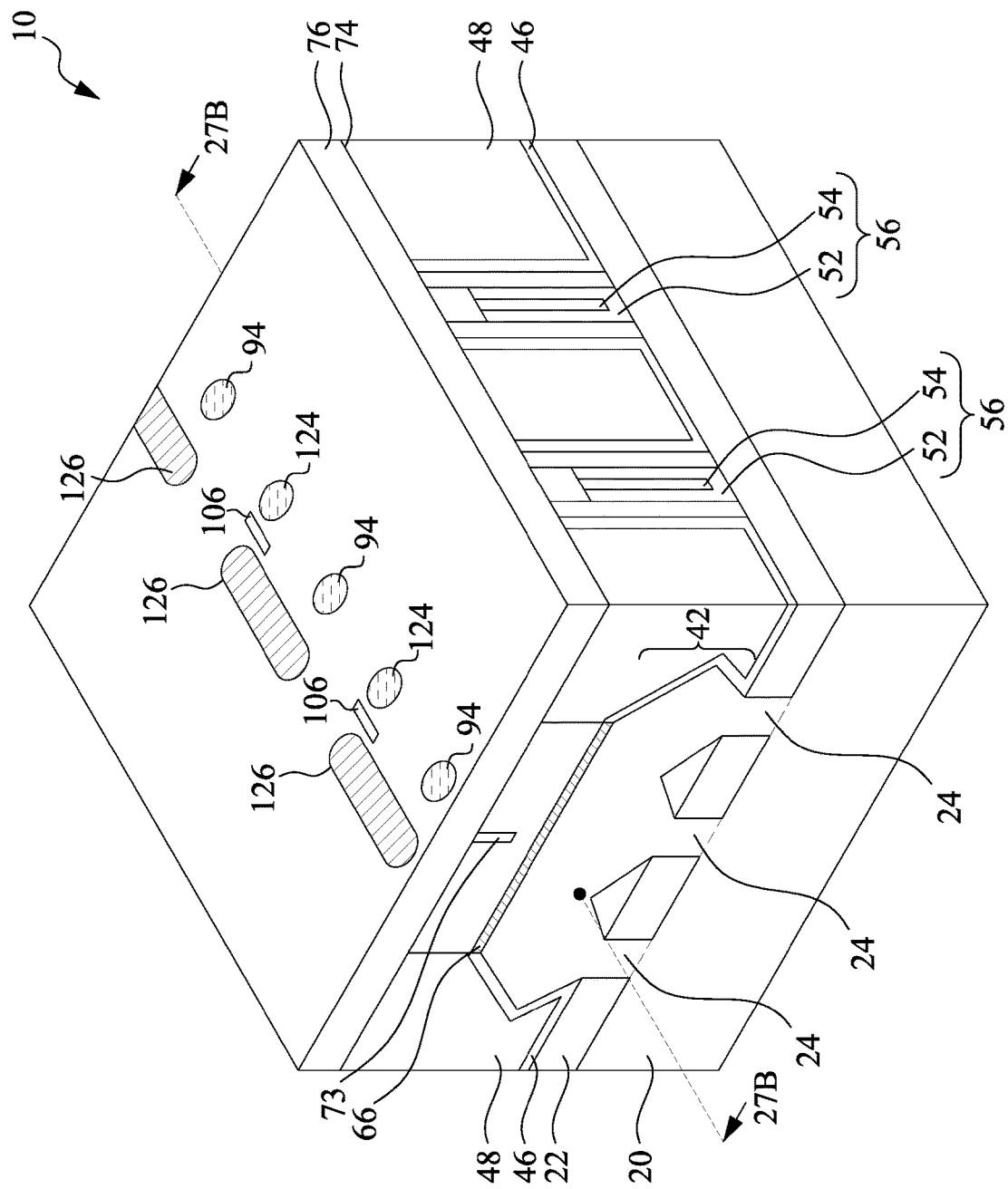
Figure 27B:
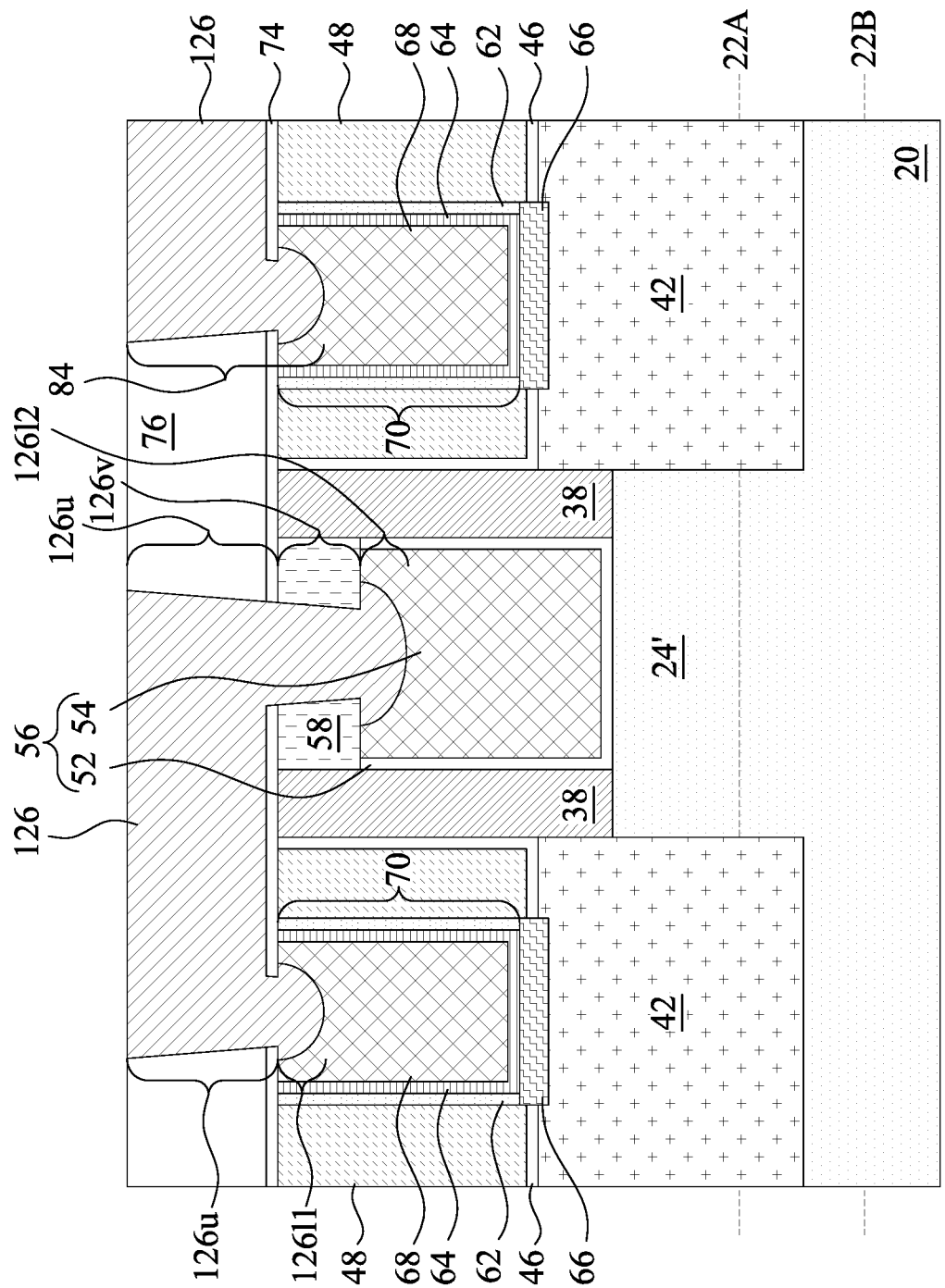

FIGS. 27A and 27B illustrate a conductor 126 which bridges the metallic region 68 to the gate electrode 54. The conductor 126 has an upper portion 126*u*, which is laterally surrounded by the ILD 76 and the ESL 74, and has lower portions 126/1 and 126/2 which are extensions of the conductor 126 into the metallic region 68 and into the gate electrode 54, respectively. A via portion 126*v* physically couples the upper portion 126*u* to the lower portion 126/2. The lower portions 126/1 and 126/2 may be formed using processes similar to those discussed above with respect to the lower portion 84*l* and lower portion 114*l* of FIGS. 18B and 25B, respectively. The bridged portion may be formed by removing the portion of the ILD 76 and ESL 74 between the first conductive structures 84 and first gate contacts 114 while forming openings for the first conductive structures 84 and/or first gate contacts 114, for example after forming the first enlarged openings 80 or first enlarged openings 110 of FIGS. 16B and 24B, respectively. The ILD 76 can be masked for portions of the ILD 76 which are to be kept and an etching process can be used to remove the ILD 76 and the ESL 74. Then, when the metallic material 82 is deposited, it will fill the bridged area of the conductor 126, coupling the metallic region 68 of the source/drain contact plugs 70 with the gate electrode 54. It should be appreciated that the second conductive structure 94 may be bridged with the second gate contact 124 in a similar manner.

Figure 28A:
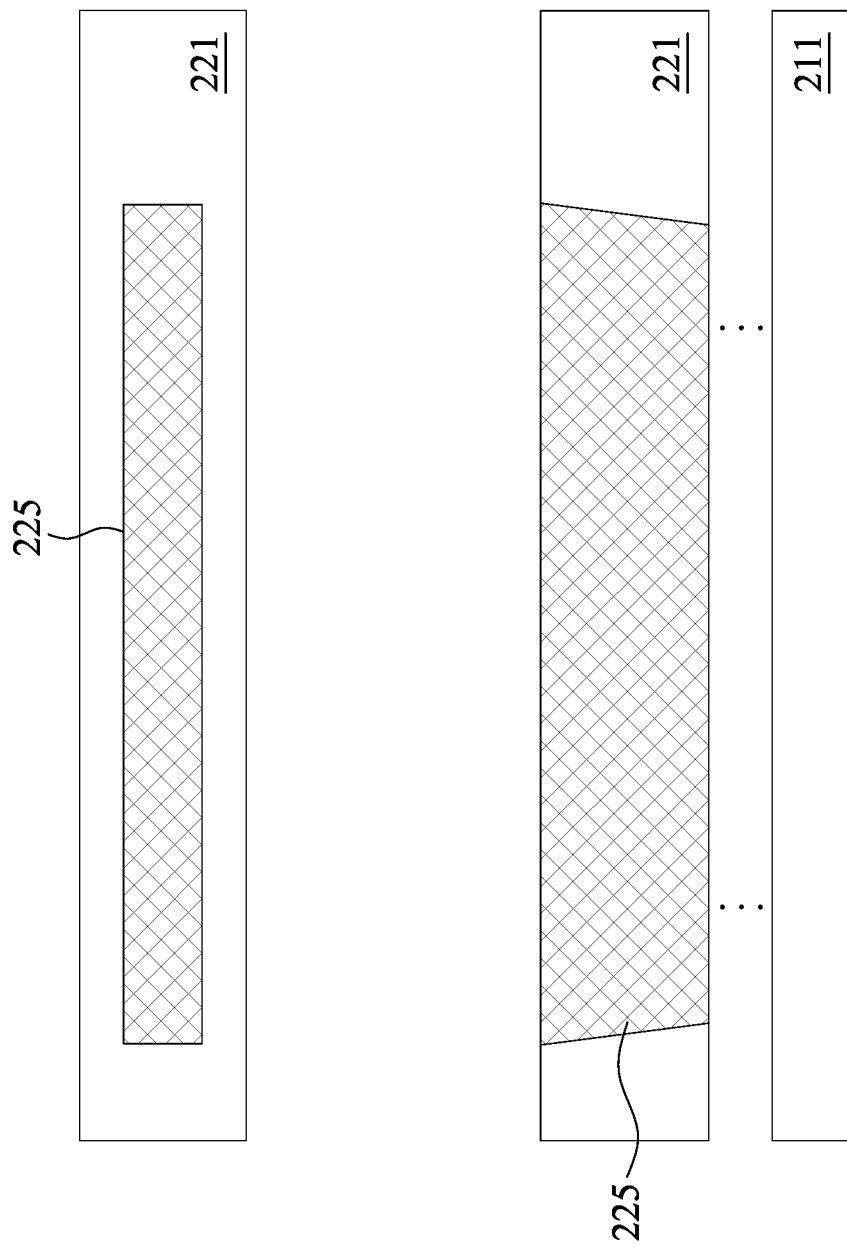
Figure 31:
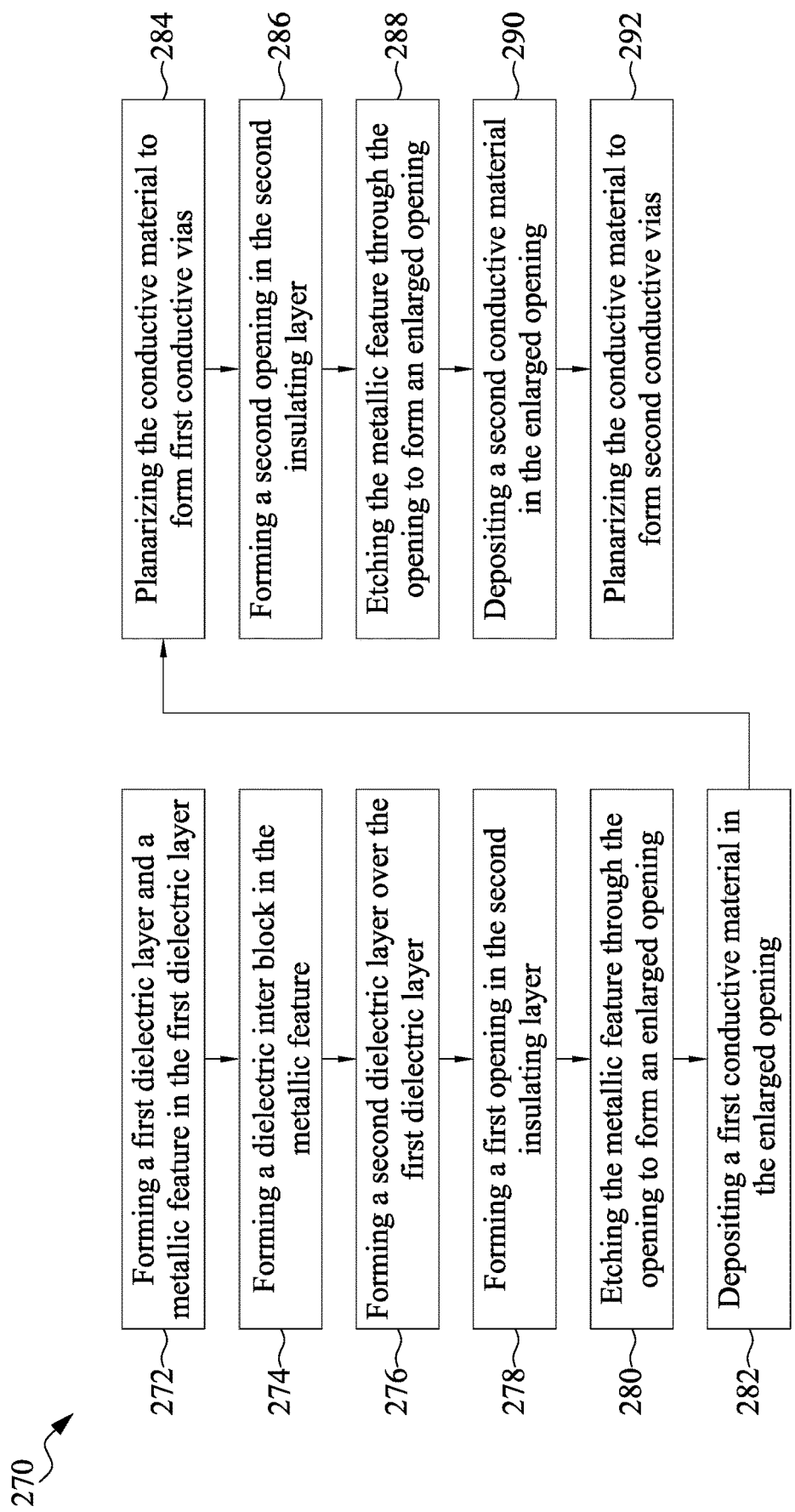
FIG. 31 illustrates a process flow for forming conductive structures in accordance with some embodiments.

FIGS. 28A through 28K illustrate intermediate steps in a process for forming conductive structures to an underlying metallization, in accordance with some embodiments. FIG. 28A illustrates a substrate 211 and dielectric layer 221, with any number of layers and device features interposed therebetween. The upper diagram is a top down view and the lower diagram is a cross-sectional view. The substrate 211 may be a substrate like unto the substrate 20, described above. In addition, the substrate 211 may be a carrier substrate, such as a glass carrier, ceramic carrier, the like, and so forth. The dielectric layer 221 may be any suitable dielectric layer type. In some embodiments, the dielectric layer 221 may be an inter-layer dielectric (ILD) or an inter-metal dielectric (IMD), or the like, and may be a layer in a redistribution structure or interconnect. The dielectric layer 221 may be formed of any suitable material by any suitable process. The respective process is illustrated as process 272 in the process flow 270 shown in FIG. 31. For example, the dielectric layer 221 may be formed of an insulating material, such as an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. In some embodiments, the dielectric layer 221 may be formed of other insulating materials such as silicon nitride, silicon oxycarbide, silicon oxynitride, silicon oxycarbonitride, the like, or combinations thereof. The dielectric layer 221 may be formed by any suitable process, such as by PVD, CVD, HDPCVD, PECVD, FCVD, spin-on coating, or another suitable deposition process.

The metallic feature 225 is disposed within the dielectric layer 221. In some embodiments, the metallic feature 225 may be part of a metallization layer of an interconnect or redistribution structure. The metallic feature 225 may be coupled to one or more conductive features underlying the metallic feature 225, such as conductive vias, metallization layers, silicides, semiconductor materials, or the like. One example of formation of the metallic feature 225 is to form an opening in the dielectric layer 221, for example, using a suitable photomask and photolithography process to etch the opening in the dielectric layer 221. Next, a conductive material may be deposited in the opening, for example, by depositing a seed layer, and then performing a plating process to deposit the conductive material. The conductive material of the metallic feature may include any suitable material, such as copper, tin, tungsten, cobalt, aluminum, gold, titanium, titanium nitride, tantalum, tantalum nitride, and so forth, alloys thereof, combinations thereof, and the like. Then, a planarization process may be used, such as a CMP process to level the upper surface of the metallic feature 225 with the upper surface of the dielectric layer 221. The respective process is also illustrated as process 272 in the process flow 270 shown in FIG. 31. Other processes may be used to form the metallic feature 225 in the dielectric layer 221, including, for example, forming the metallic feature 225 first and then forming the dielectric layer 221 around the metallic feature 225, followed by a planarization process.

Figure 28B:
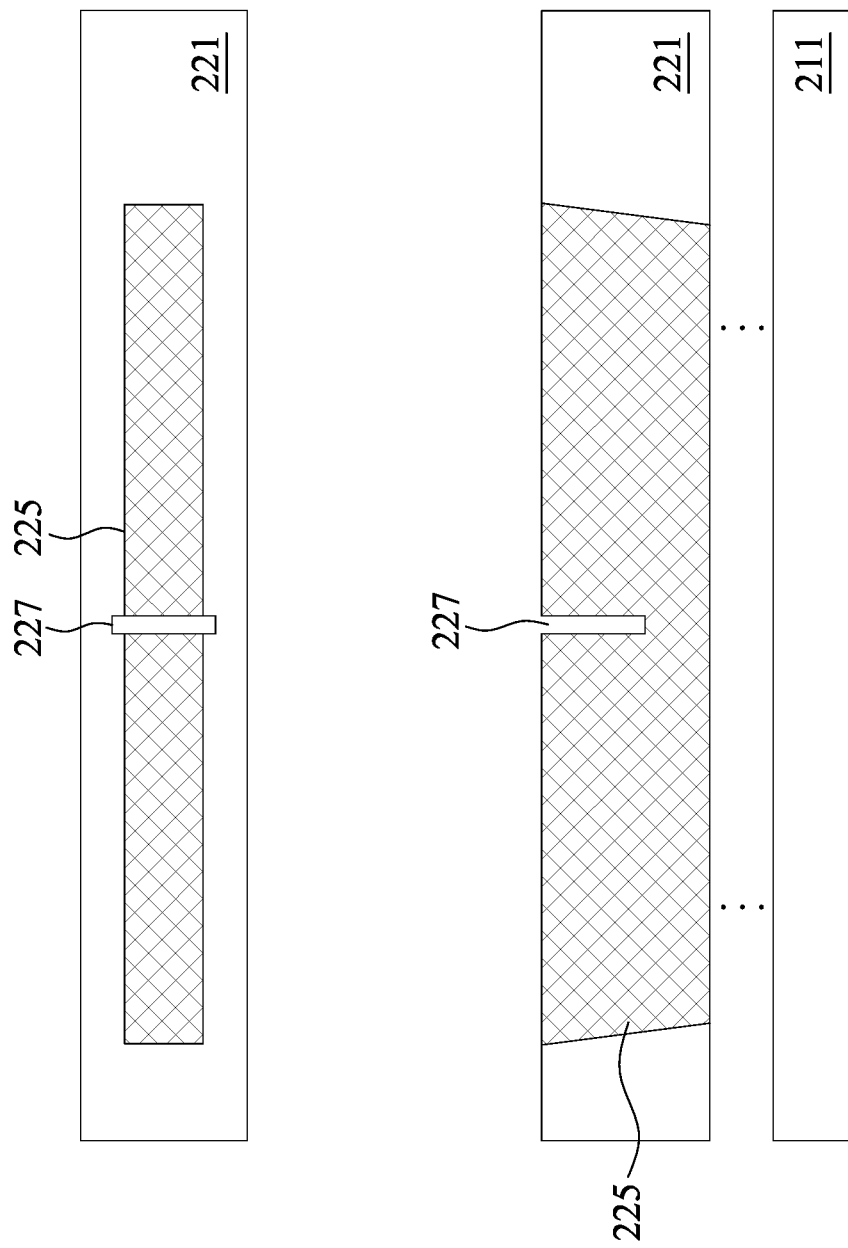

In FIG. 28B, an opening 227 is formed in the metallic feature 225. The respective process is illustrated as process 274 in the process flow 270 shown in FIG. 31. The upper diagram is a top down view and the lower diagram is a cross-sectional view. The opening 227 may be formed by any suitable process, such as, by an acceptable photolithography process where a one-, two-, or three-layer photomask may be formed over the metallic feature 225 and developed and/or patterned to form an opening therein, which is then transferred to the metallic feature 225 by an etching process to form the opening 227. The etching process may be a dry etch or wet etch and the opening 227 may have several different shapes, which correspond to the shapes discussed above with respect to FIGS. 21A through 21L. In some embodiments, the opening 227 may extend all the way across the metallic feature 225 and into the dielectric layer 221, such as illustrated in the upper diagram of FIG. 28B. In other embodiments, the opening 227 may extend across the metallic feature 225 side-to-side, but not into the dielectric layer 221. In yet other embodiments, the opening 227 may extend partially across the metallic feature 225. In such embodiment, the opening 227 may be centered in the metallic feature 225, may be askew of the center of the metallic feature 225, or may extend from the dielectric layer 221 at one side. Although, the opening 227 is illustrated as being perpendicular to the direction of the metallic feature 225, it should be appreciated that it need not be perpendicular, and could angle ±45 degrees. Although the opening 227 is depicted as being formed in the middle of the metallic feature 225, it should be understood that the opening 227 may be formed toward one end or the other of the metallic feature 225.

Figure 28C:
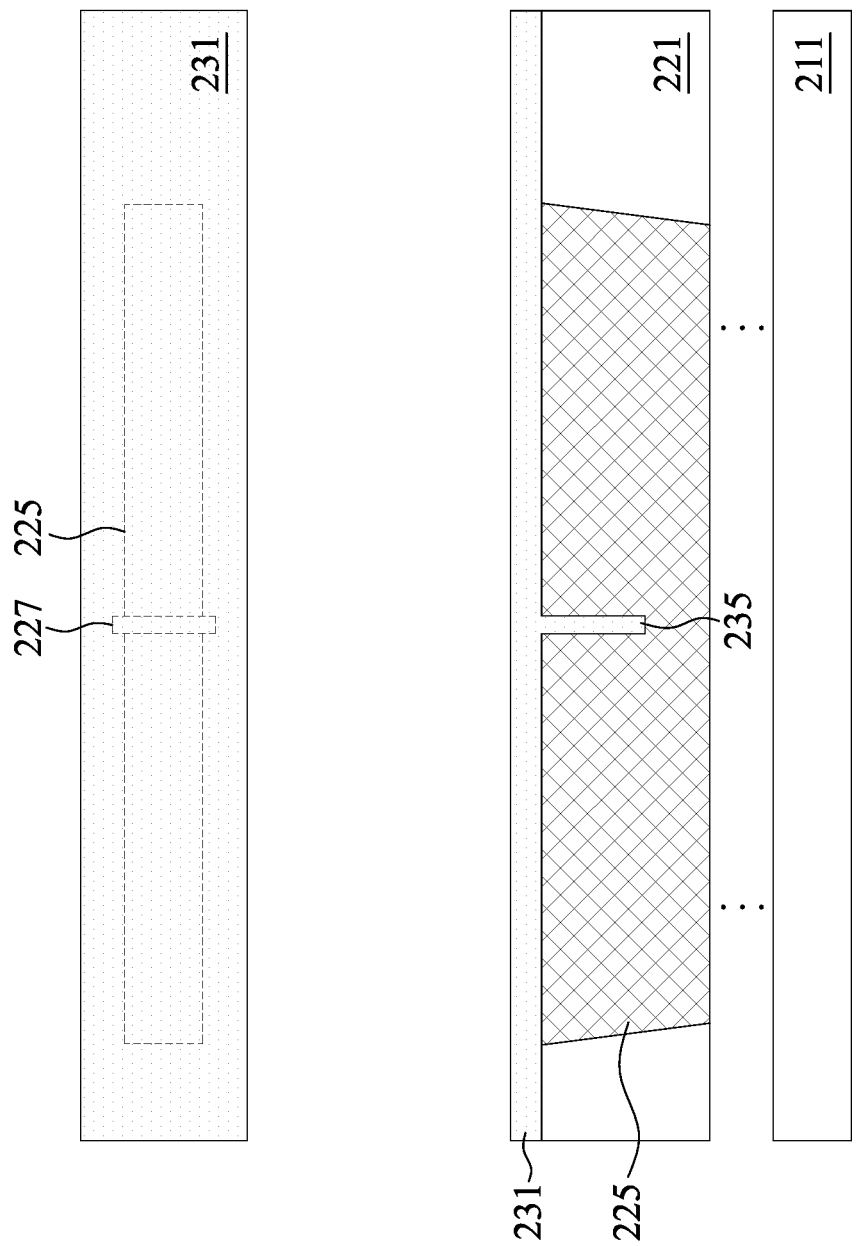

In FIG. 28C, a dielectric material 231 is deposited in the opening 227 and over the metallic feature 225 and dielectric layer 221. The respective process is also illustrated as process 274 in the process flow 270 shown in FIG. 31. The upper diagram is a top down view and the lower diagram is a cross-sectional view. The dielectric material 231 may be formed of any suitable material by any suitable process. In some embodiments, the dielectric material 231 may be silicon oxide, silicon nitride, silicon oxynitride, aluminum oxide, the like, or combinations thereof. The dielectric material 231 may be deposited in the opening 227 and over the metallic feature 225 and dielectric layer 221 by ALD, HDPCVD, CVD, FCVD, spin-on coating, or the like. In some embodiments, the dielectric material 231 may have the same material composition as the dielectric layer 221. The upper diagram illustrates the opening 227 and metallic feature 225 in phantom, as they would not be visible.

Figure 28D:
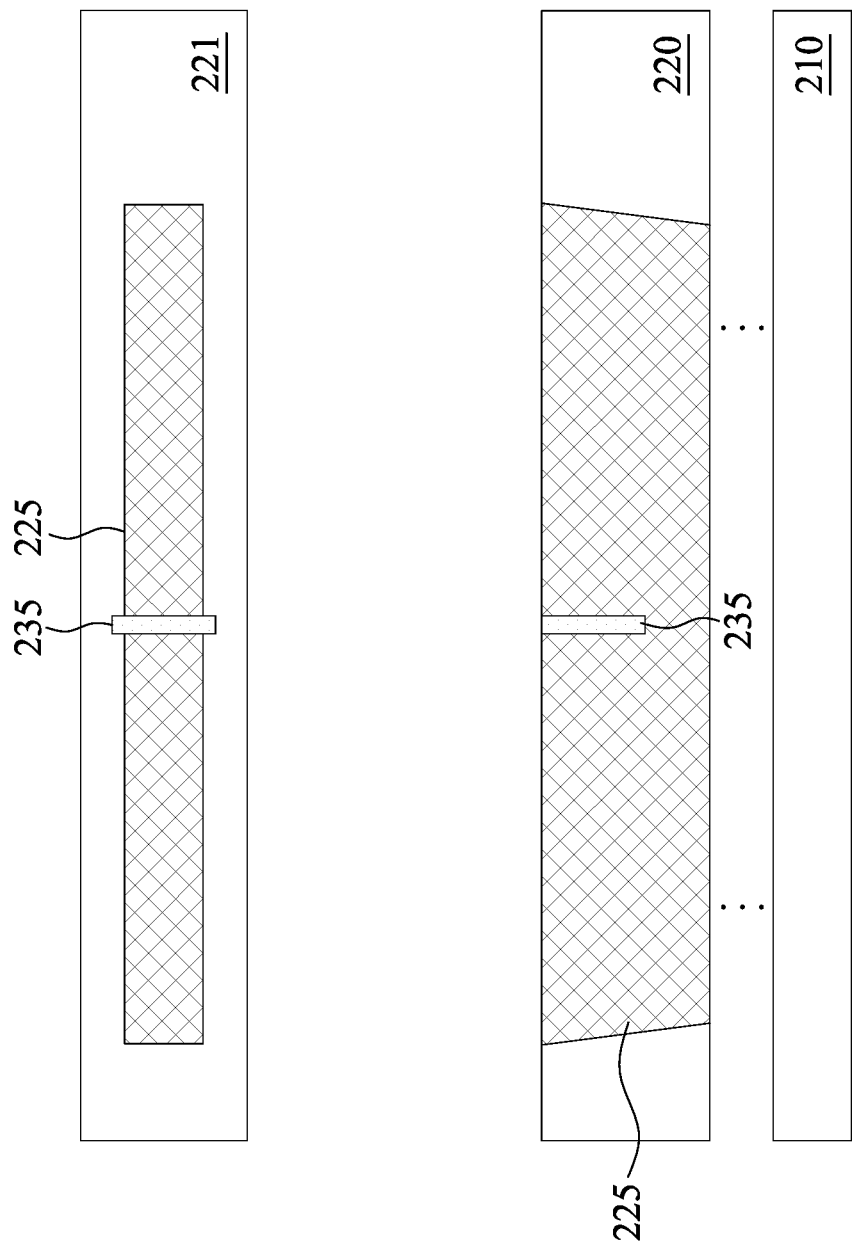

In FIG. 28D, a leveling process is used to remove portions of the dielectric material 231 over metallic feature 225 and dielectric layer 221, thereby forming the inter block 235. The respective process is also illustrated as process 274 in the process flow 270 shown in FIG. 31. The upper diagram is a top down view and the lower diagram is a cross-sectional view. The leveling process may be a planarization process, such as a CMP process or grinding process, an etching process, or combinations thereof. The resulting inter block 235 may correspond to the shapes of the inter block 73 depicted in FIGS. 21A through 21J.

Figure 28E:
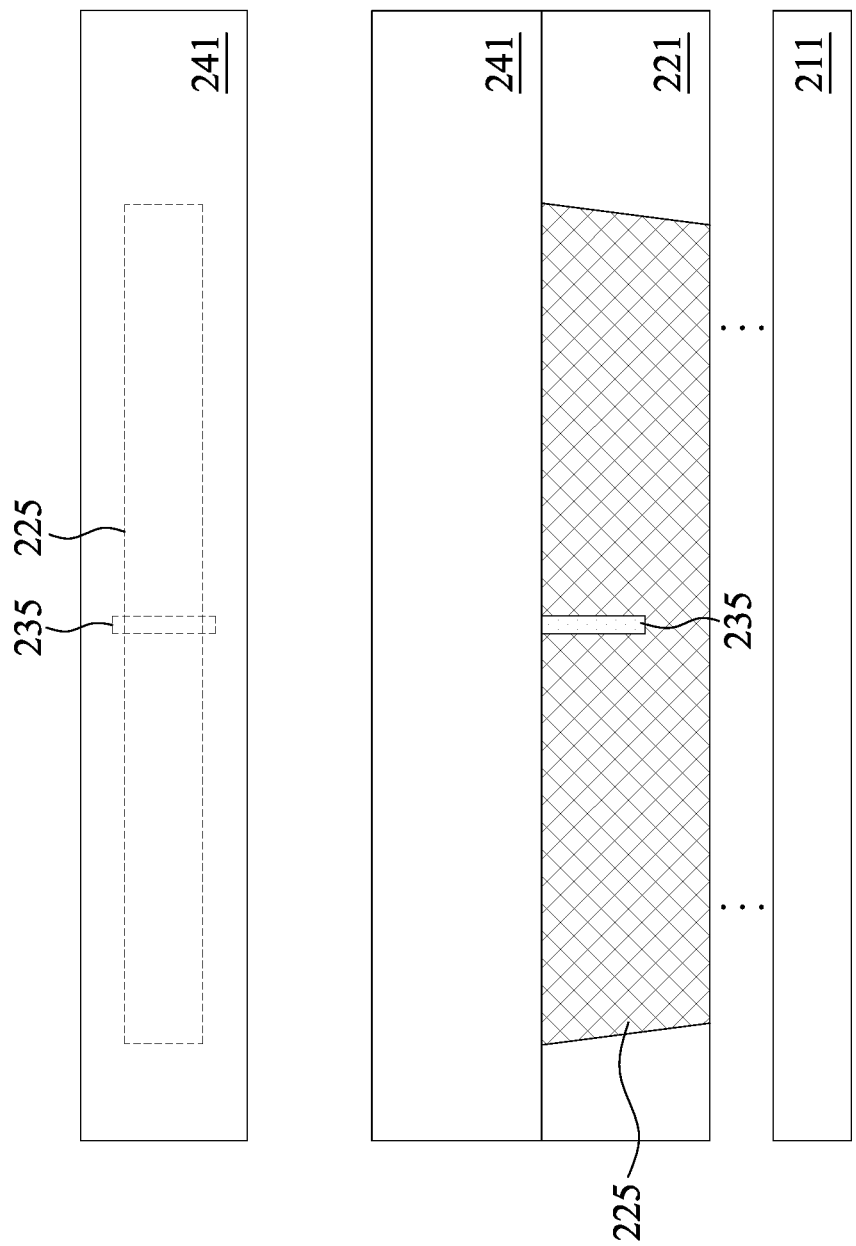

In FIG. 28E, another dielectric layer 241 is formed over the dielectric layer 221 and over the metallic feature 225. The respective process is illustrated as process 276 in the process flow 270 shown in FIG. 31. The upper diagram is a top down view and the lower diagram is a cross-sectional view. The upper diagram illustrates the inter block 235 and metallic feature 225 in phantom, as they would not be visible. The dielectric layer 241 may be formed of the same or different materials as the dielectric layer 221. In some embodiments, an etch stop layer (for example, similar to the ESL 74) may be formed between the dielectric layer 221 and the dielectric layer 241. The dielectric layer 241 may be formed using processes and materials similar to those discussed above with respect to the dielectric layer 221.

Figure 28F:
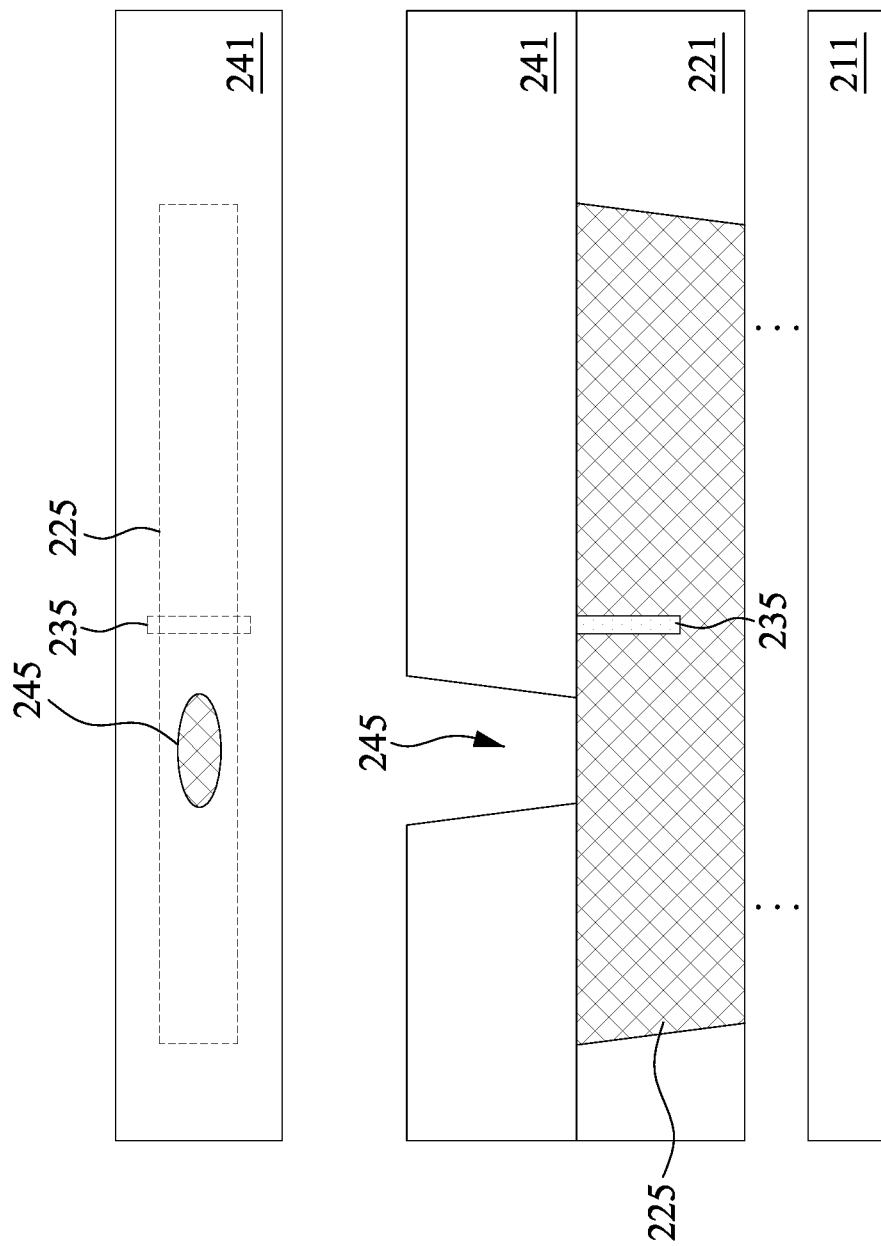

In FIG. 28F, the contact opening 245 is formed in the dielectric layer 241 over the metallic feature 225 to one side of the inter block 235. The respective process is illustrated as process 278 in the process flow 270 shown in FIG. 31. The upper diagram is a top down view and the lower diagram is a cross-sectional view. The upper diagram illustrates the inter block 235 and edges of the metallic feature 225 in phantom, as they would not be visible. The contact opening 245 may be used to form a first conductive structure to connect the metallic feature 225 to another metallic feature, for example, an overlying metallic element (not shown) which may then be electrically coupled to a device within the substrate 211 or to another device (not shown). The contact opening 245 may be formed proximate to the inter block 235. It should be understood that the contact opening 245 is only an example of the contact openings that may be formed in the dielectric layer 241.

The contact opening 245 may be formed by any suitable process, such as by an acceptable photolithography process to form a resist mask over the dielectric layer 241, pattern the resist mask through a light mask, develop the resist mask to form a pattern in the resist mask, and etch the dielectric layer 241 through the resist mask.

Figure 28G:
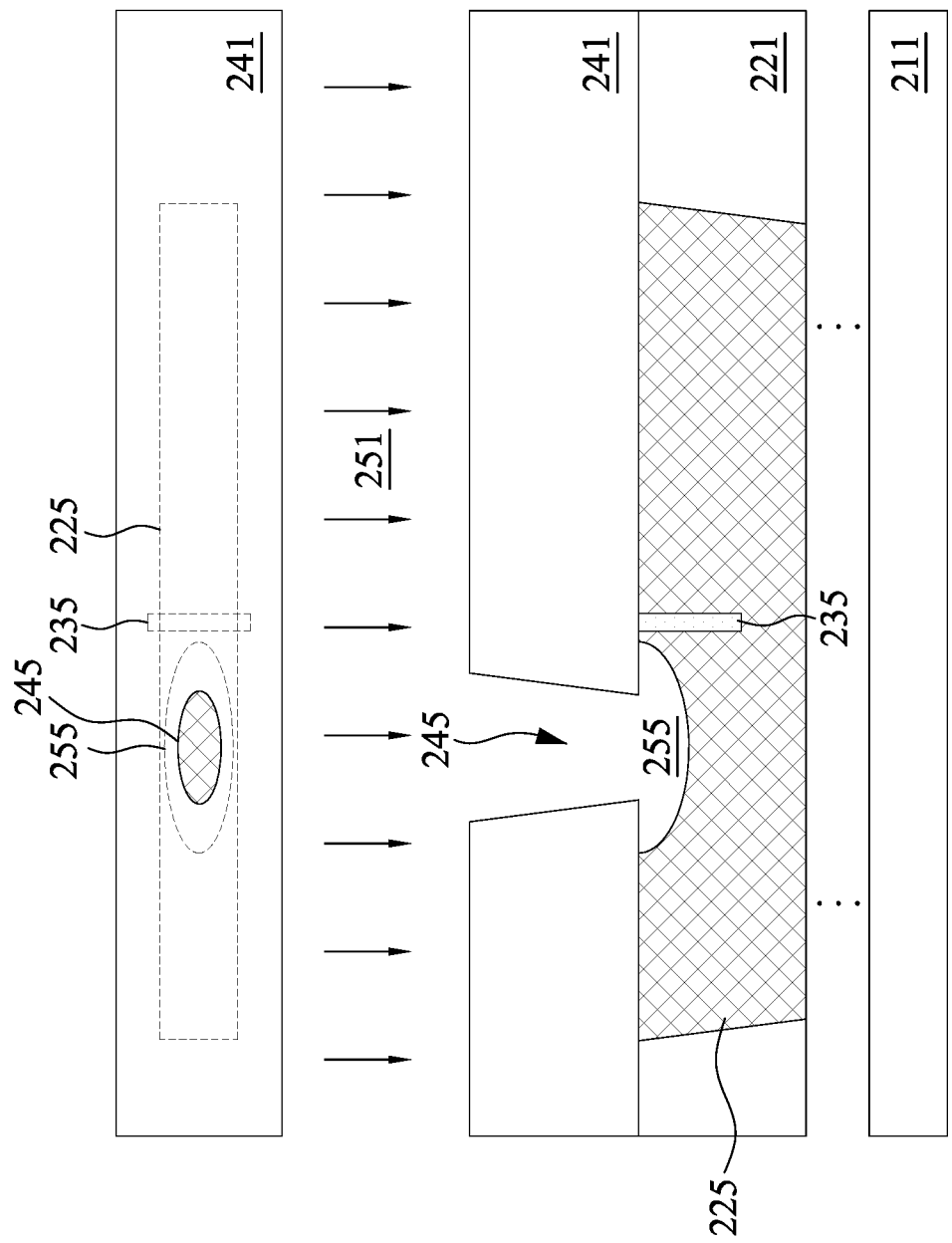

In FIG. 28G an etching process 251 is performed on the contact opening 245 to extend the contact opening 245 into the metallic feature 225, to form the enlarged opening 255 in the contact opening 245. The respective process is illustrated as process 280 in the process flow 270 shown in FIG. 31. The upper diagram is a top down view and the lower diagram is a cross-sectional view. The upper diagram illustrates the inter block 235, edges of the metallic feature 225, and enlarged openings 255 in phantom, as they would not be visible from above. The enlarged openings 255 may also be referred to as depressions, recesses, or an inverted mushroom cap. The etching process 251 may be performed using processes and materials similar to those discussed above with respect to the etching process 79 of FIGS. 16A, 16B, and 16C.

The enlarged openings 255 extending from the contact openings 245 have several advantages. The enlarged openings 255 are analogous to the enlarged openings 80 of FIGS. 16A, 16B, and 16C. The large volume and deep pocket formed by the enlarged openings 255 result in a better contact area with the subsequently formed conductive layer, help resist upward force, and provide better protection from seepage of a reactive element of a planarization process.

Figure 28H:
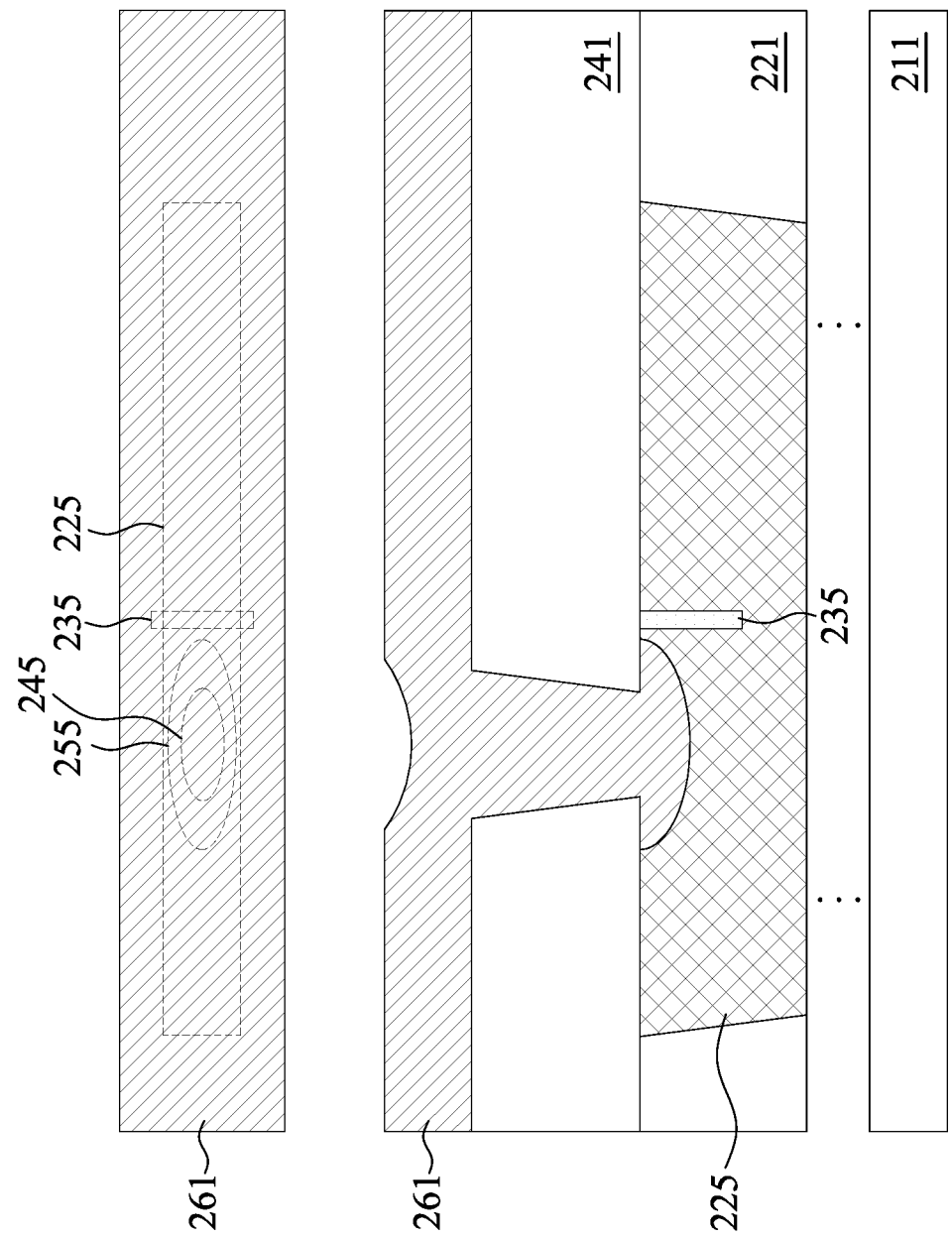

In FIG. 28H, a conductive layer 261 is deposited in the enlarged opening 255, in the contact opening 245, and over the top of the dielectric layer 241. The respective process is illustrated as process 282 in the process flow 270 shown in FIG. 31. The upper diagram is a top down view and the lower diagram is a cross-sectional view. The upper diagram illustrates the inter block 235, edges of the metallic feature 225, the bottom of the opening 245, and extent of the enlarged openings 255 in phantom, as they would not be visible from above. The conductive layer 261 may be formed using processes and materials similar to the metallic material, discussed above with respect to FIGS. 17A, 17B, and 17C.

Figure 28I:
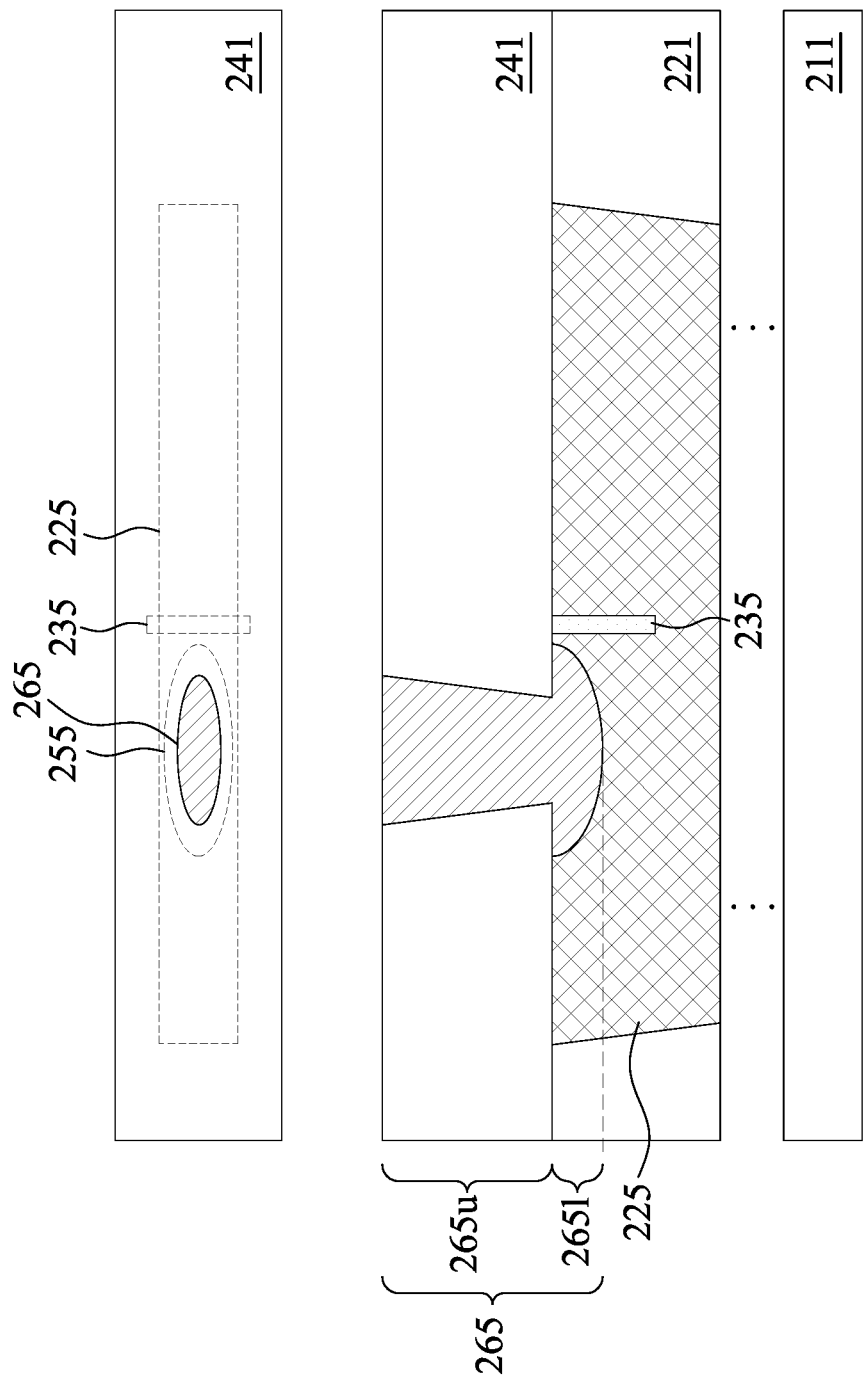

In FIG. 28I, a planarization process, such as a CMP process is performed on the conductive layer 261 to level the upper surface of the conductive layer 261 with the upper surface of the dielectric layer 241, thereby forming the first conductive structure 265. The respective process is illustrated as process 284 in the process flow 270 shown in FIG. 31. The upper diagram is a top down view and the lower diagram is a cross-sectional view. The upper diagram illustrates the inter block 235, edges of the metallic feature 225, and the extent of the enlarged openings 255 in phantom, as they would not be visible from above. The resulting first conductive structure 265 includes an upper portion 265*u* and a lower portion 265*l*. The lower portion 265*l* may be considered a contact extension, inverted mushroom cap, or a contact extension region of the first conductive structure 265.

As a result of the contact extensions (lower portion 265*l*) of the first conductive structure 265, the enlarged surface area contact between the material of the first conductive structure 265 and the metallic feature 225 has decreased electrical resistance and increased resistance for upward force, such as may be caused by warpage. The inverted mushroom cap shape of the lower portion 265*l* reduces or eliminates peeling and separation of the first conductive structures 265 from the metallic feature 225. Further, the lower portion 265*l* resists chemical intrusion that may seep between the upper portion 265*u* and the sidewall of the dielectric layer 241 which may occur, for example, during planarization of the conductive layer 261. For example, the chemical intrusion may reach the upper portion of the inverted mushroom cap of the lower portion 265*l* and be stopped from contacting the material of the metallic feature 225.

In some embodiments, the upper portions 265*u* are aligned to the lower portions 265*l* of the first conductive structures 265. In other words, the side-to-side centers of the upper portions 265*u* may be aligned with the side-to-side centers of the lower portions 265*l*. In other embodiments, when the enlarged opening 255 is formed in the metallic feature 225 the etch time may be increased and the enlarged opening 255 may expose a sidewall of the inter block 235. In such embodiments, the enlarged opening 255 may become lopsided and the resulting lower portion will not be aligned with the side-to-side center of the upper portion 265*u*. Such an embodiment can be observed, for example, with respect to the lower portion 84*l* of FIG. 20B.

Figure 28J:
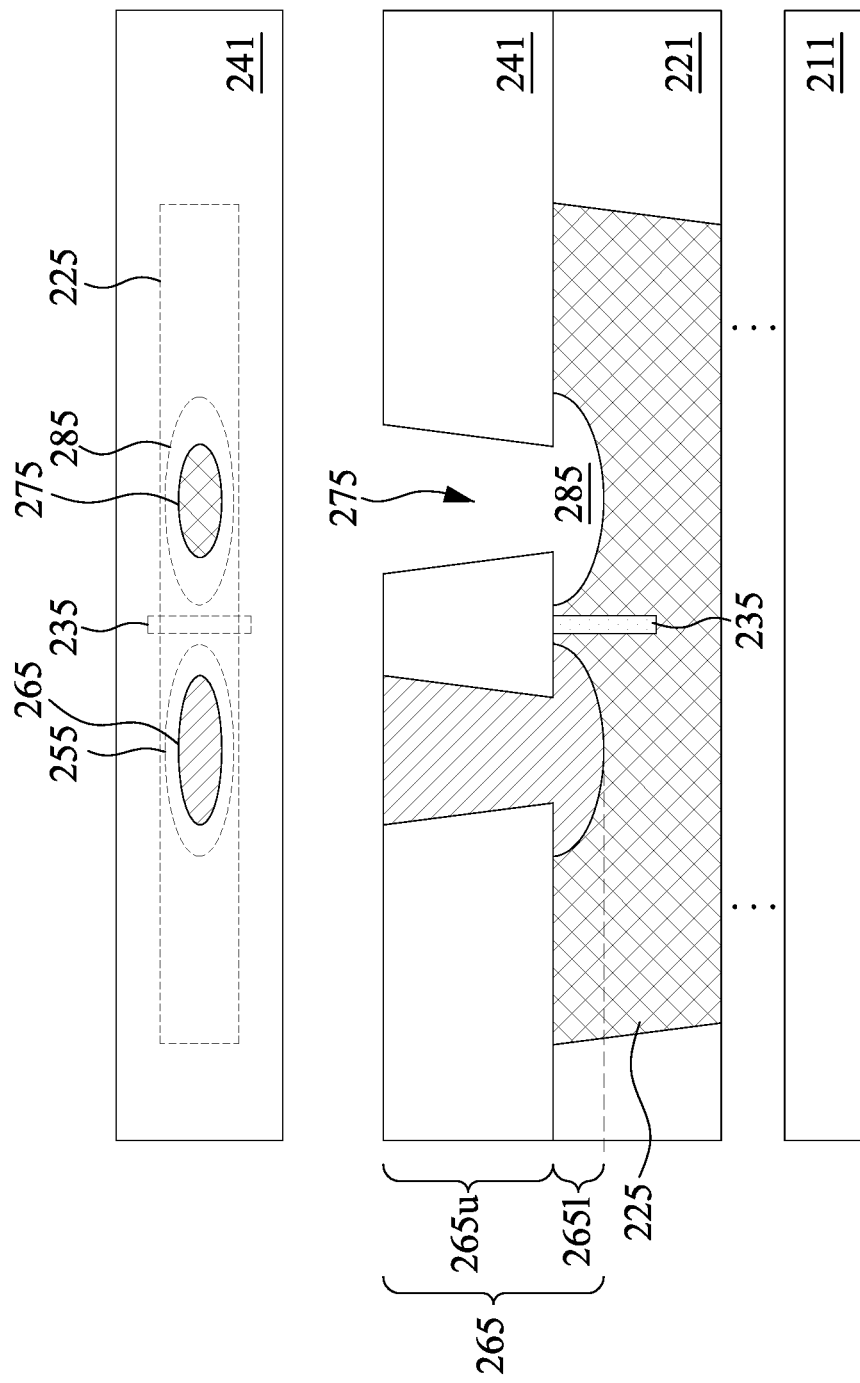

In FIG. 28J, the contact opening 275 is formed on a side of the inter block 235 opposite the first conductive structure 265. The respective process is illustrated as process 286 in the process flow 270 shown in FIG. 31. Then, an enlarged contact opening 285 is formed to extend from the contact opening 275 into the metallic feature 225. The respective process is illustrated as process 288 in the process flow 270 shown in FIG. 31. The upper diagram is a top down view and the lower diagram is a cross-sectional view. The upper diagram illustrates the inter block 235, edges of the metallic feature 225, the extent of the enlarged opening 255, and the extent of the enlarged opening 285 in phantom, as they would not be visible from above. The contact opening 275 and enlarged opening 285 may be used to form a second conductive structure to connect the metallic feature 225 to another metallic feature, for example, an overlying metallic element (not shown) which may then be electrically coupled to a device within the substrate 211 or to another device (not shown). The contact opening 275 may be using processes and materials similar to those used to form the contact opening 245. The enlarged opening 285 may be formed using an etching process, such as the etching process 251. The resulting enlarged openings 285 may also be referred to as depressions, recesses, or an inverted mushroom cap.

Similar to that explained above with respect to the first conductive structure 84, when forming the enlarged opening 285, because the inter block 235 is present, a galvanic reaction is avoided between the first conductive structures 265 and the metallic feature 225 when the etching process is used to form the enlarged opening 285.

The enlarged openings 285 extending from the contact openings 275 have several advantages. The enlarged openings 285 are analogous to the second enlarged openings 88 of FIGS. 18A and 18B. The large volume and deep pocket formed by the enlarged openings 285 result in a better contact area with the subsequently formed conductive layer, help resist upward force, and provide better protection from seepage of a reactive element of a planarization process.

In FIG. 28K, a conductive layer is deposited in the enlarged opening 285, in the contact opening 275, and over the top of the dielectric layer 241. The respective process is illustrated as process 290 in the process flow 270 shown in FIG. 31. Then, a planarization process, such as a CMP process, may be used to remove excess portions of the conductive layer and to level the upper surface of the conductive layer with the upper surface of the dielectric layer 241, thereby forming the second conductive structure 295. The respective process is illustrated as process 292 in the process flow 270 shown in FIG. 31. The upper diagram is a top down view and the lower diagram is a cross-sectional view. The upper diagram illustrates the inter block 235, edges of the metallic feature 225, and the extents of the lower portions 265*l* and 295 in phantom, as they would not be visible from above. The resulting second conductive structure 295 includes an upper portion 295*u* and a lower portion 295*l*. The lower portion 295*l* may be considered a contact extension, inverted mushroom cap, or a contact extension region of the second conductive structure 295.

The conductive layer may be formed using processes and materials similar to the metallic material, discussed above with respect to FIGS. 17A, 17B, and 17C. In some embodiments, the material of the first conductive structure 265 may be a different material than the material of the second conductive structure 295, however, because the inter block 235 prevents the first conductive structure 265 from contacting the second conductive structure 295, the likelihood of galvanic corrosion is reduced or eliminated.

As a result of the contact extensions (lower portion 295*l*) of the second conductive structure 295, the enlarged surface area contact between the material of the second conductive structure 295 and the metallic feature 225 has decreased electrical resistance and increased resistance for upward force, such as may be caused by warpage. The inverted mushroom cap shape of the lower portion 295*l* reduces or eliminates peeling and separation of the second conductive structures 295 from the metallic feature 225. Further, the lower portion 295*l* resists chemical intrusion that may seep between the upper portion 295*u* and the sidewall of the dielectric layer 241 which may occur, for example, during planarization of the conductive layer during formation of the second conductive structure 295. For example, the chemical intrusion may reach the upper portion of the inverted mushroom cap of the lower portion 295*l* and be stopped from contacting the material of the metallic feature 225.

In some embodiments, the upper portions 295*u* are aligned to the lower portions 295*l* of the second conductive structures 295. In other words, the side-to-side centers of the upper portions 295*u* may be aligned with the side-to-side centers of the lower portions 295*l*. In other embodiments, when the enlarged opening 285 is formed in the metallic feature 225 the etch time may be increased and the enlarged opening 285 may expose a sidewall of the inter block 235. In such embodiments, the enlarged opening 285 may become lopsided and the resulting lower portion 295*l* will not be aligned with the side-to-side center of the upper portion 295*u*. Such an embodiment can be observed, for example, with respect to the lower portion 94*l* of FIG. 20A.

It should be understood that the shapes of the lower portions 265*l* and 295*l* may correspond to the shapes of the lower portions 84*l* and 94*l* in FIGS. 20A, 20B, 20C, and 20D. In particular, in some embodiments one or both of the lower portions 265*l* or 295*l* may contact the inter block 235.

The embodiments of the present disclosure have some advantageous features. By utilizing an inter block dielectric material between two conductive structures, a galvanic reaction can be avoided between two dissimilar metals by blocking etchant or cleaning solution from contacting an interface between the two dissimilar metals. This allows two different metals to be used to form connections which can offer different electrical characteristics.

One embodiment is a method including forming a metallic region in a first insulating layer. The method also includes forming a recess in the metallic region. The method also includes filling the recess with an inter block dielectric. The method also includes depositing a second insulating layer over the metallic region and the first insulating layer. The method also includes forming a first conductive structure extending through the second insulating layer and extending into the metallic region. The method also includes and forming a second conductive structure extending through the second insulating layer and extending into the metallic region, the first conductive structure being on a first side of the inter block dielectric, the second conductive structure being on a second side of the inter block dielectric, the second side being opposite the first side. In an embodiment, forming the first conductive structure includes: performing a first etching process to etch the second insulating layer to form a first opening in the second insulating layer, the first opening exposing a portion of the metallic region; and performing a second etching process through the first opening to etch a first depression into an upper surface of the metallic region, the first depression having greater lateral extents than a bottom of the first opening. In an embodiment, performing the second etching process exposes a side wall of the inter block dielectric. In an embodiment, the first conductive structure or the second conductive structure contacts the inter block dielectric. In an embodiment, the first conductive structure includes a different material composition than the metallic region, where forming the second conductive structure includes: forming a third opening in the second insulating layer; and performing a third etching process through the third opening to etch a second depression into an upper surface of the metallic region, where the inter block prevents etchant from the third etching process from contacting an interface between the first conductive structure and the metallic region. In an embodiment, the inter block has tapered sidewalls. In an embodiment, the recess traverses an entire width of the metallic region. In an embodiment, an upper portion of the first conductive structure is offset a side-to-side center of a lower portion of the first conductive structure. In an embodiment, the metallic region includes cobalt, and where the first conductive structure includes tungsten.

Another embodiment is a structure including a first insulating layer. The structure also includes a first metallic line disposed in the first insulating layer, the first metallic line laterally surrounded by the first insulating layer, the first metallic line having an upper surface which is level with an upper surface of the first insulating layer. The structure also includes an inter block dielectric disposed in the first metallic line, the inter block dielectric having an upper surface level with the upper surface of the first metallic line, the inter block dielectric having a bottom surface disposed between a bottom surface of the first metallic line and the upper surface of the first metallic line. The structure also includes a second insulating layer disposed over the first insulating layer. The structure also includes a first metallic contact disposed in the second insulating layer and extending below the second insulating layer into the first metallic line. The structure also includes a second metallic contact disposed in the second insulating layer and extending below the second insulating layer into the first metallic line, the first metallic contact disposed on a first side of the inter block dielectric and the second metallic contact disposed on a second side of the inter block dielectric. In an embodiment, the first metallic contact or the second metallic contact has an interface with the inter block dielectric. In an embodiment, the inter block dielectric has tapered sidewalls. In an embodiment, the inter block dielectric has a bottom surface which is non-flat. In an embodiment, the first metallic contact includes a different material than the second metallic contact. In an embodiment, an upper portion of the first metallic contact is surrounded by the second insulating layer, where a lower portion of the first metallic contact is surrounded by the first metallic line, and where the upper portion has a side-to-side center which is offset from a side-to-side center of the lower portion. In an embodiment, One embodiment is a method including forming a metallic region in a first insulating layer. The method also includes forming a recess in the metallic region. The method also includes filling the recess with an inter block dielectric. The method also includes depositing a second insulating layer over the metallic region and the first insulating layer. The method also includes forming a first conductive structure extending through the second insulating layer and extending into the metallic region. The method also includes and forming a second conductive structure extending through the second insulating layer and extending into the metallic region, the first conductive structure being on a first side of the inter block dielectric, the second conductive structure being on a second side of the inter block dielectric, the second side being opposite the first side. In an embodiment, forming the first conductive structure includes: performing a first etching process to etch the second insulating layer to form a first opening in the second insulating layer, the first opening exposing a portion of the metallic region; and performing a second etching process through the first opening to etch a first depression into an upper surface of the metallic region, the first depression having greater lateral extents than a bottom of the first opening. In an embodiment, performing the second etching process exposes a side wall of the inter block dielectric. In an embodiment, the first conductive structure or the second conductive structure contacts the inter block dielectric. In an embodiment, the first conductive structure includes a different material composition than the metallic region, where forming the second conductive structure includes: forming a third opening in the second insulating layer; and performing a third etching process through the third opening to etch a second depression into an upper surface of the metallic region, where the inter block prevents etchant from the third etching process from contacting an interface between the first conductive structure and the metallic region. In an embodiment, the inter block has tapered sidewalls. In an embodiment, the recess traverses an entire width of the metallic region. In an embodiment, an upper portion of the first conductive structure is offset a side-to-side center of a lower portion of the first conductive structure. In an embodiment, the metallic region includes cobalt, and where the first conductive structure includes tungsten.

Another embodiment is a structure including a first insulating layer. The structure also includes a first metallic line disposed in the first insulating layer, the first metallic line laterally surrounded by the first insulating layer, the first metallic line having an upper surface which is level with an upper surface of the first insulating layer. The structure also includes an inter block dielectric disposed in the first metallic line, the inter block dielectric having an upper surface level with the upper surface of the first metallic line, the inter block dielectric having a bottom surface disposed between a bottom surface of the first metallic line and the upper surface of the first metallic line. The structure also includes a second insulating layer disposed over the first insulating layer. The structure also includes a first metallic contact disposed in the second insulating layer and extending below the second insulating layer into the first metallic line. The structure also includes a second metallic contact disposed in the second insulating layer and extending below the second insulating layer into the first metallic line, the first metallic contact disposed on a first side of the inter block dielectric and the second metallic contact disposed on a second side of the inter block dielectric. In an embodiment, the first metallic contact or the second metallic contact has an interface with the inter block dielectric. In an embodiment, the inter block dielectric has tapered sidewalls. In an embodiment, the inter block dielectric has a bottom surface which is non-flat. In an embodiment, the first metallic contact includes a different material than the second metallic contact. In an embodiment, an upper portion of the first metallic contact is surrounded by the second insulating layer, where a lower portion of the first metallic contact is surrounded by the first metallic line, and where the upper portion has a side-to-side center which is offset from a side-to-side center of the lower portion. In an embodiment, material composition of the first insulating layer is the same as a material composition of the inter block dielectric.

Another embodiment is a device, including a source/drain region of a transistor. The device also includes a first inter-layer dielectric over the source/drain region. The device also includes a source/drain contact plug over and electrically coupled to the source/drain region, where the source/drain contact plug includes a metal region. The device also includes an inter block dielectric disposed in the metal region, the inter block dielectric having an upper surface level with an upper surface of the metal region and a bottom surface disposed between the upper surface of the metal region and a lower surface of the metal region. The device also includes a second inter-layer dielectric over the first inter-layer dielectric. The device also includes a first conductive structure over and electrically coupled to the source/drain contact plug, the first conductive structure having a first upper portion surrounded by the second inter-layer dielectric, the first conductive structure having a first lower portion extending down below the second inter-layer dielectric into the source/drain contact plug. In an embodiment, the device further includes a second conductive structure having a second lower portion extending down below the second inter-layer dielectric into the source/drain contact plug, where the second lower portion contacts the inter block dielectric. In an embodiment, the first lower portion and the second lower portion include different material compositions. In an embodiment, material composition of the first insulating layer is the same as a material composition of the inter block dielectric.

Another embodiment is a device, including a source/drain region of a transistor. The device also includes a first inter-layer dielectric over the source/drain region. The device also includes a source/drain contact plug over and electrically coupled to the source/drain region, where the source/drain contact plug includes a metal region. The device also includes an inter block dielectric disposed in the metal region, the inter block dielectric having an upper surface level with an upper surface of the metal region and a bottom surface disposed between the upper surface of the metal region and a lower surface of the metal region. The device also includes a second inter-layer dielectric over the first inter-layer dielectric. The device also includes a first conductive structure over and electrically coupled to the source/drain contact plug, the first conductive structure having a first upper portion surrounded by the second inter-layer dielectric, the first conductive structure having a first lower portion extending down below the second inter-layer dielectric into the source/drain contact plug. In an embodiment, the device further includes a second conductive structure having a second lower portion extending down below the second inter-layer dielectric into the source/drain contact plug, where the second lower portion contacts the inter block dielectric. In an embodiment, the first lower portion and the second lower portion include different material compositions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first insulating layer;
a first metallic line disposed in the first insulating layer, the first metallic line laterally surrounded by the first insulating layer, the first metallic line having an upper surface which is level with an upper surface of the first insulating layer;
an inter block dielectric disposed in the first metallic line, the inter block dielectric having an upper surface level with the upper surface of the first metallic line, the inter block dielectric having a bottom surface disposed between a bottom surface of the first metallic line and the upper surface of the first metallic line;
a second insulating layer disposed over the first insulating layer;
a first metallic contact disposed in the second insulating layer and extending below the second insulating layer into the first metallic line; and
a second metallic contact disposed in the second insulating layer and extending below the second insulating layer into the first metallic line, the first metallic contact disposed on a first side of the inter block dielectric and the second metallic contact disposed on a second side of the inter block dielectric.

2. The structure of claim 1, wherein the first metallic contact or the second metallic contact has an interface with the inter block dielectric.

3. The structure of claim 1, wherein the inter block dielectric has tapered sidewalls.

4. The structure of claim 1, wherein the inter block dielectric has a bottom surface which is non-flat.

5. The structure of claim 1, wherein the first metallic contact comprises a different material than the second metallic contact.

6. The structure of claim 1, wherein an upper portion of the first metallic contact is surrounded by the second insulating layer, wherein a lower portion of the first metallic contact is laterally surrounded by the first metallic line, and wherein the upper portion has a side-to-side center which is offset from a side-to-side center of the lower portion.

7. The structure of claim 1, wherein a material composition of the first insulating layer is the same as a material composition of the inter block dielectric.

8. A device comprising:
a source/drain region of a transistor;
a first inter-layer dielectric over the source/drain region;
a source/drain contact plug over and electrically coupled to the source/drain region, wherein the source/drain contact plug comprises a metal region;
an inter block dielectric disposed in the metal region, the inter block dielectric having an upper surface level with an upper surface of the metal region and a bottom surface disposed between the upper surface of the metal region and a lower surface of the metal region;
a second inter-layer dielectric over the first inter-layer dielectric; and
a first conductive structure over and electrically coupled to the source/drain contact plug, the first conductive structure having a first upper portion surrounded by the second inter-layer dielectric, the first conductive structure having a first lower portion extending down below the second inter-layer dielectric into the source/drain contact plug.

9. The device of claim 8, further comprising a second conductive structure having a second lower portion extending down below the second inter-layer dielectric into the source/drain contact plug, wherein the second lower portion contacts the inter block dielectric.

10. The device of claim 9, wherein the first lower portion and the second lower portion comprise different material compositions.

11. The device of claim 8, wherein the inter block is wider than a width of the metal region.

12. The device of claim 8, wherein the first conductive structure contacts a sidewall of the inter block dielectric.

13. The device of claim 9, wherein the inter block dielectric extends into the metal region further than the first conductive structure.

14. A structure comprising:
a first conductive feature;
an inter block dielectric extending into the first conductive feature, a bottom surface of the inter block dielectric contacting the first conductive feature;
a first insulating layer disposed over the first conductive feature;
a first conductive contact extending through the first insulating layer and into the first conductive feature; and
a second conductive contact extending through the first insulating layer and into the first conductive feature, the first conductive contact disposed on a first side of the inter block dielectric and the second conductive contact disposed on a second side of the inter block dielectric.

15. The structure of claim 14, wherein an upper surface of the inter block dielectric is level with the upper surface of the first conductive feature.

16. The structure of claim 14, wherein the first conductive feature comprises a source/drain contact.

17. The structure of claim 14, wherein the first conductive feature comprises a gate electrode.

18. The structure of claim 14, wherein at least one of the first conductive contact and the second conductive contact physically contacts a sidewall of the inter block dielectric.

19. The structure of claim 14, wherein the first conductive contact extends under a lower surface of the first insulating layer.

20. The structure of claim 14, wherein the inter block dielectric extends through the first insulating layer.

* * * * *